United States Patent [19]
Furuyama et al.

[11] Patent Number: 5,434,426
[45] Date of Patent: Jul. 18, 1995

[54] OPTICAL INTERCONNECTION DEVICE

[75] Inventors: Hideto Furuyama, Yokohama; Hiroshi Hamasaki, Sagamihara; Mitsuhiro Kushibe, Kawasaki; Katsuji Kaminishi, Yokohama; Tamon Kobayashi, Tokyo; Keiji Takaoka, Urayasu, all of Japan

[73] Assignee: Kabushiki Kaisha Toshiba, Kawasaki, Japan

[21] Appl. No.: 118,811

[22] Filed: Sep. 10, 1993

[30] Foreign Application Priority Data

Sep. 10, 1992 [JP] Japan .................................. 4-242391
Sep. 14, 1992 [JP] Japan .................................. 4-271207
Jun. 22, 1993 [JP] Japan .................................. 5-150440

[51] Int. Cl.$^6$ .............................................. G02B 27/00
[52] U.S. Cl. .............................. 250/551; 250/214 LS
[58] Field of Search ............... 250/208.1, 208.2, 208.4, 250/216, 551, 214 LS; 359/152, 154, 164, 165, 166, 167; 257/618, 623, 624, 435, 437, 466

[56] References Cited

U.S. PATENT DOCUMENTS 5,202,567  4/1993  Hamanaka ........................ 250/551
5,266,794  11/1993  Olbright ....................... 250/214 LS

OTHER PUBLICATIONS

SPIE Proc. vol. 1850 Laser Diode Technology and Applications V, pp. 93–99 Jan. 18–20, 1993; J. Cheng, et al. Jan. 18, 1993 "Optoelectronic Technology For a Reconfigurable Optical Interconnection Architecture".
Applied Optics vol. 26 No. 17 pp. 3649–3654; Sep. 1, 1987 L. A. Hornak "Fresnel Phase Plate Lenses For Through-Wafer Optical Interconnections".
IEEE Photonics Technology Letters vol. 4, No. 9 pp. 960–963 Sep. 1992; C. M. Wu, et al. "Electrically Pumped Circular-Grating Distributed-Bragg-Reflector Lasers."

Primary Examiner—David C. Nelms
Attorney, Agent, or Firm—Oblon, Spivak, McClelland, Maier & Neustadt

[57] ABSTRACT

Disclosed herein is an optical interconnection device having a light source, a plurality of optical interconnecting elements, and a light-receiving element. The optical interconnecting elements are located on an output side of the light source. Each of the elements has first and second major surfaces and comprises an integral unit made of an optical semiconductor element and a grating lens having concentric annular grooves and concentric annular projections, and two electrodes formed on the first and second major surfaces, respectively. The optical semiconductor element and grating lens of each optical interconnecting element are formed on the first major surface, for emitting or receiving light. The light-receiving element is located on an output side of the optical interconnecting elements. The optical interconnecting elements are arranged at substantially regular intervals, each positioned such that the semiconductor element and the grating lens face to the same direction. The grating lens of each of the optical interconnecting elements has optical characteristic which compensates for light-transmitting characteristic corresponding to the interval between the optical connecting element and the next optical interconnecting element.

20 Claims, 27 Drawing Sheets

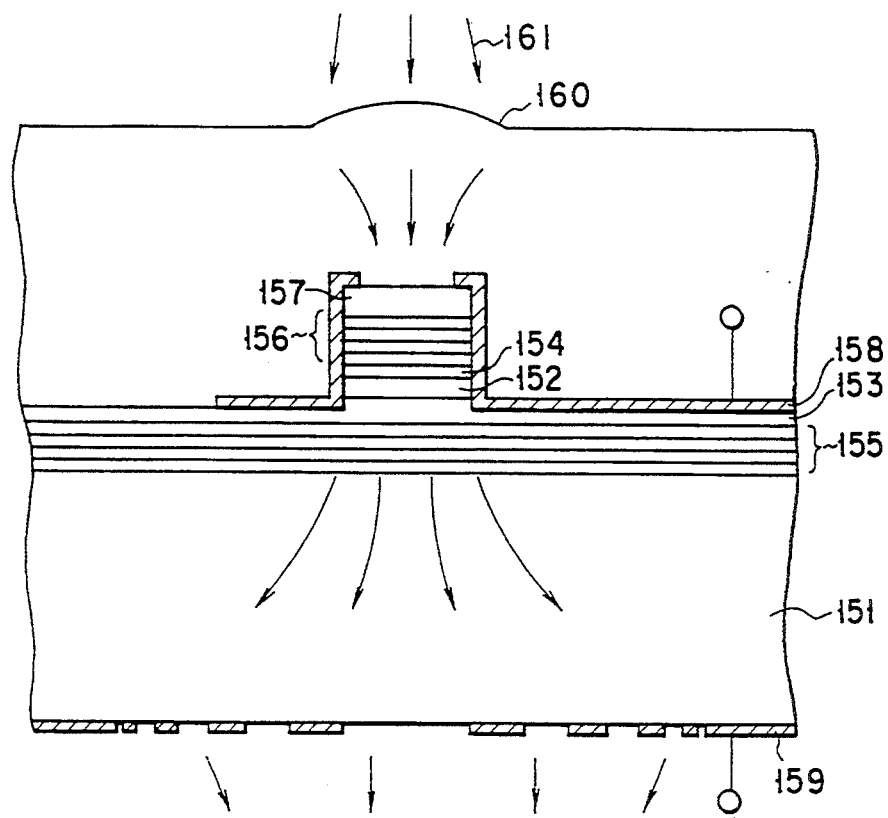
F I G. 7A
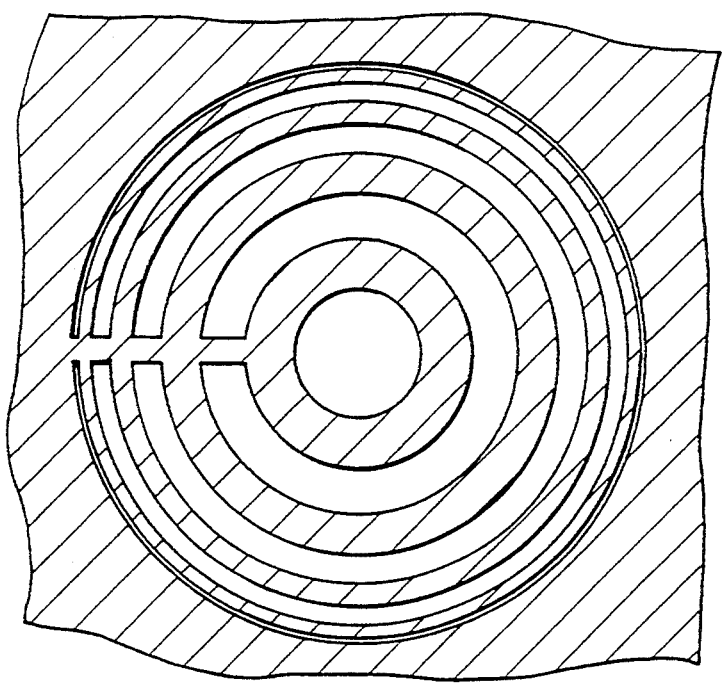
F I G. 7B

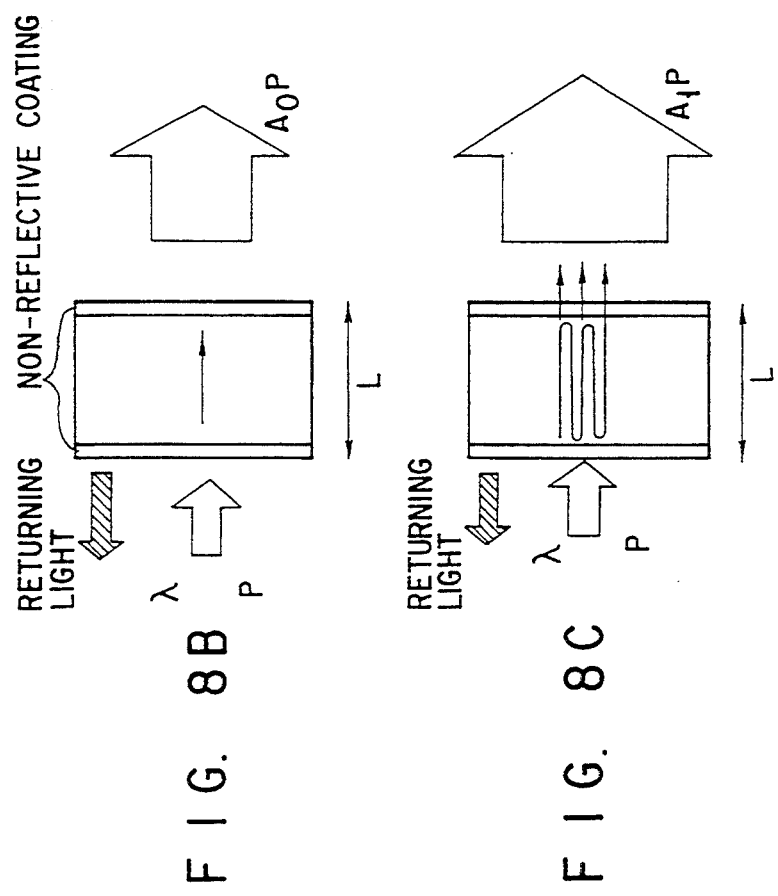

X: POSITION ALONG LINE PARALLEL TO RESONATOR

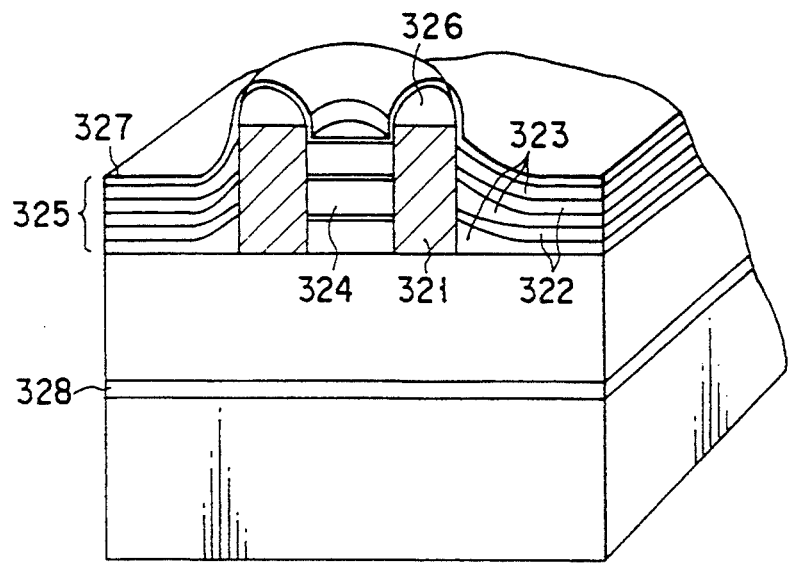
F I G. 23
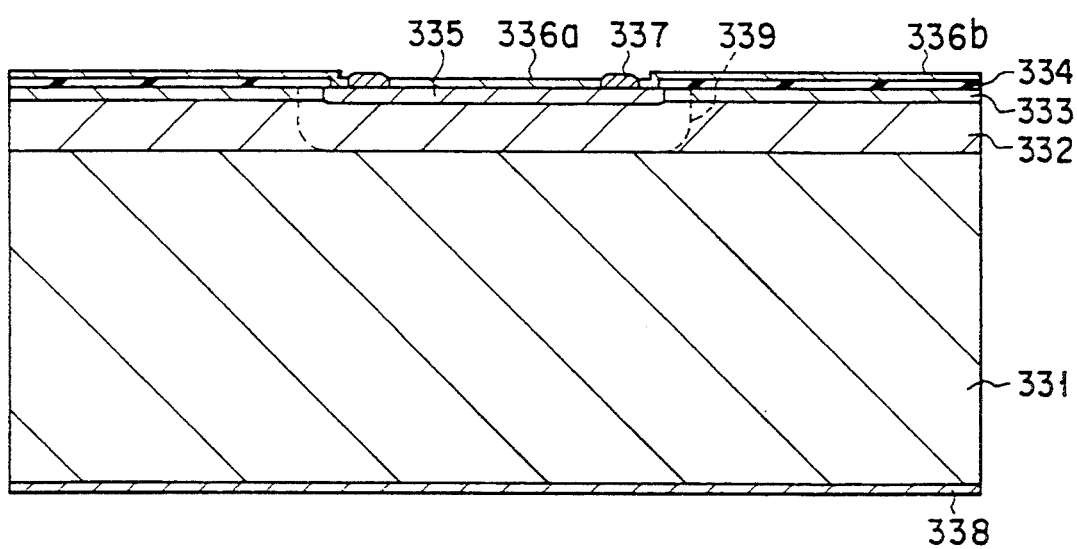
F I G. 24

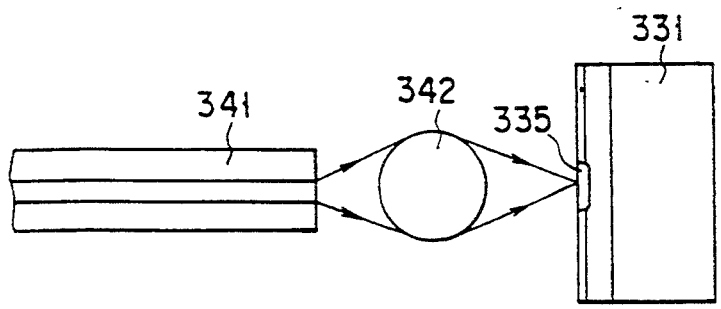
F I G. 25A
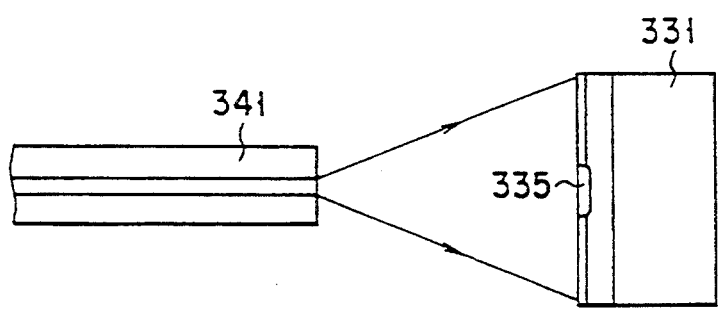
F I G. 25B
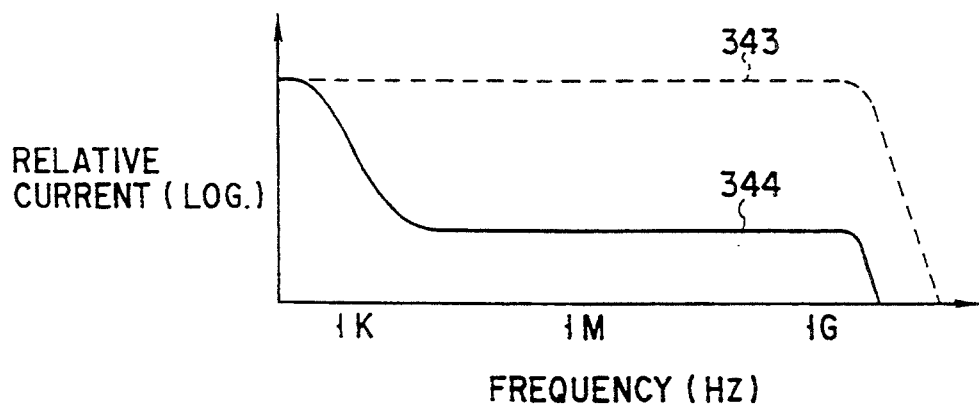
F I G. 25C

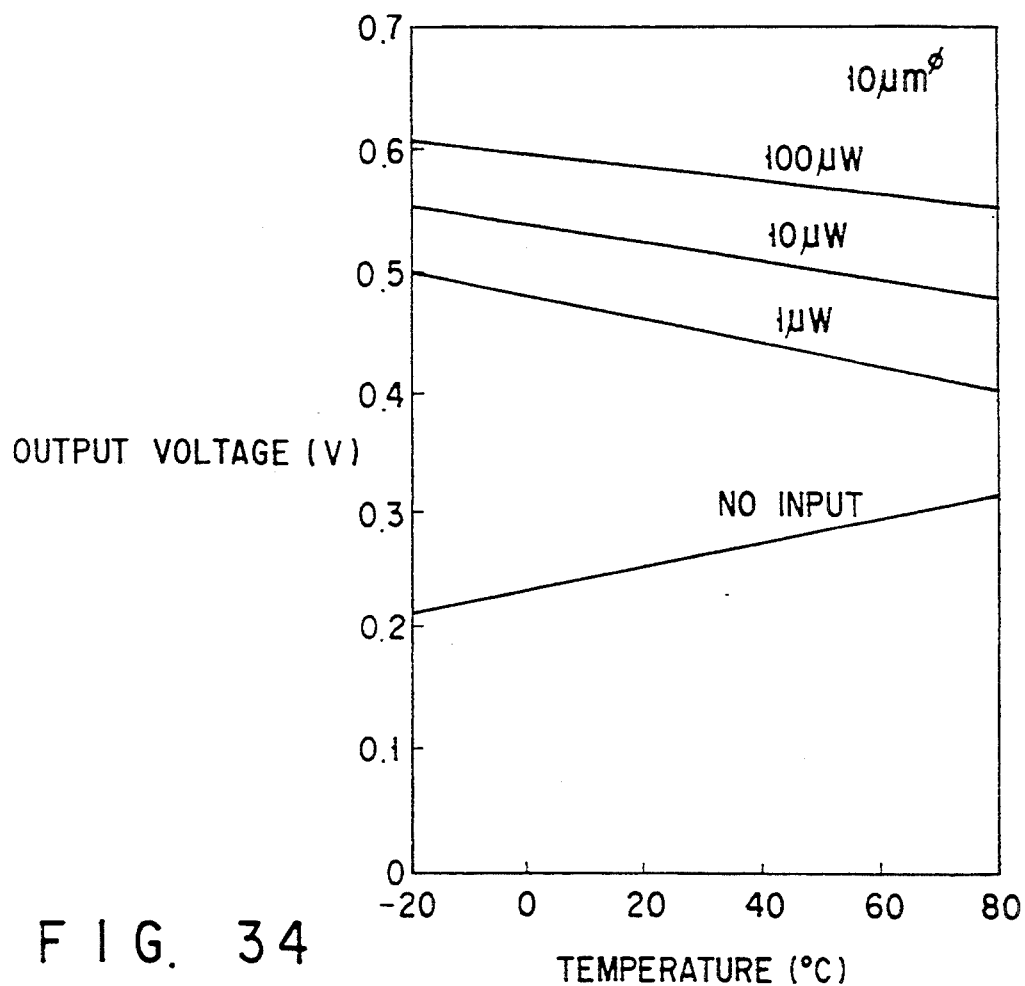
F I G. 34
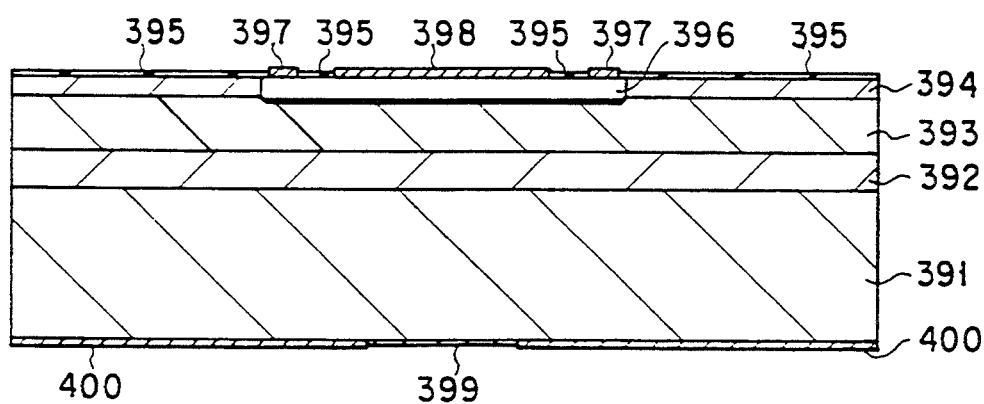
F I G. 35

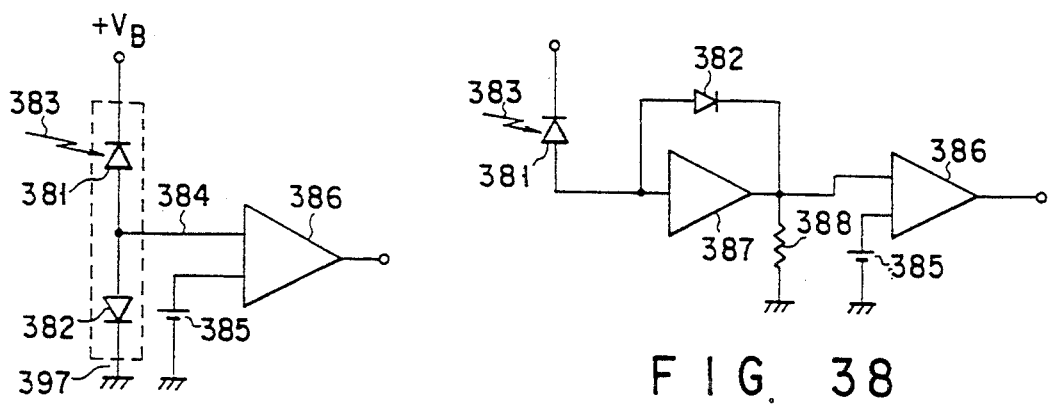
FIG. 36
FIG. 38
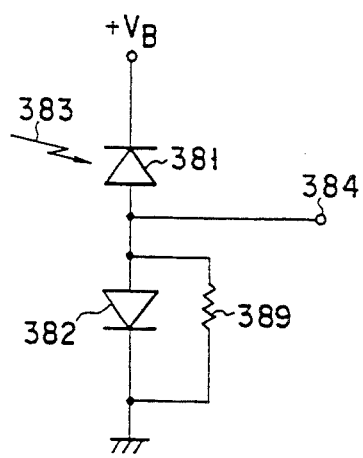
FIG. 39
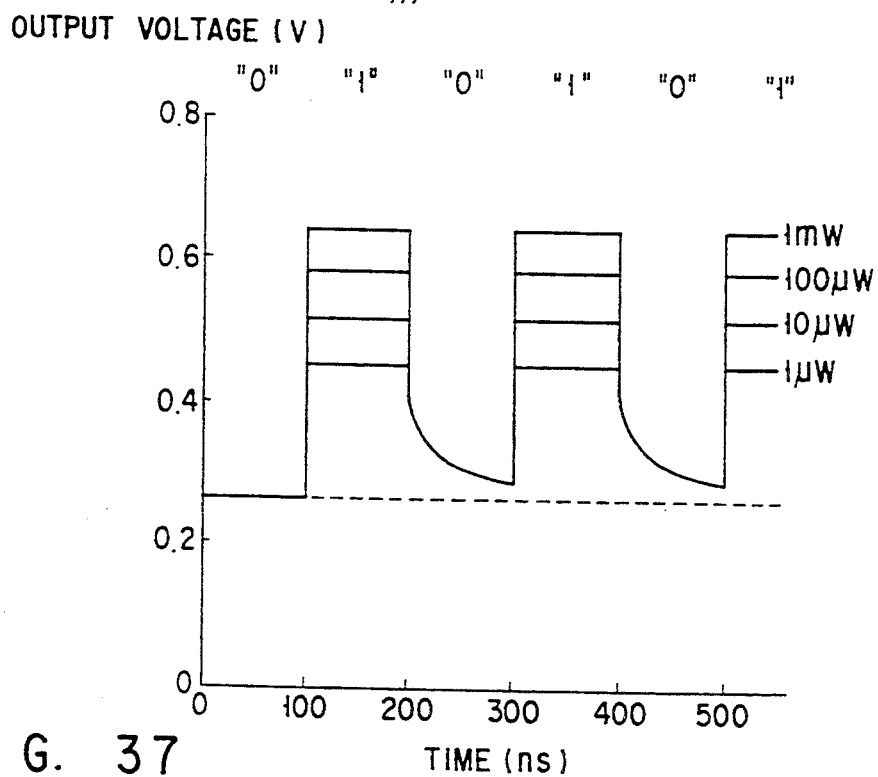
FIG. 37

OPTICAL INTERCONNECTION DEVICE

BACKGROUND OF THE INVENTION

1. Field of the Invention

The present invention relates to an optical interconnection devices for transmitting signals within a data-processing apparatus and the like, and more particularly to an optical interconnection devices for transmitting optical signals through space.

2. Description of the Related Art

The operating efficiency and speed of a dataprocessing apparatus and the like have increased. In other words, the speeds at which the signals are processed and transmitted in the apparatus have increased. The speed increases are mainly due to the high signal-processing speed and the high signal-transmitting speed are attributed to the improved performance of the semiconductor IC devices incorporated in the apparatus. Also, they are greatly attributed to the advanced integration technique applied to the semiconductor IC devices and the advanced technique of mounting the IC devices.

The performance and integration density of semiconductor IC devices can be increased by virtue of the foreseeable improvement in the structural design and manufacture process. It is therefore well expected that a data-processing apparatus or the like will have an even higher operating speed. However, the operating speed of the apparatus may be limited despite the increased performance and integration density of semiconductor IC devices, unless the semiconductor IC devices are connected by optical interconnection devices.

Electrical connection among the elements of each semiconductor device can be easily achieved without affecting the operating speed of the data-processing apparatus or the like, whereas electrical connection among the semiconductor IC devices can hardly be accomplished without detriment to the operating speed of the apparatus. The reason will be described in the following.

In each semiconductor IC device, the lines interconnecting the semiconductor elements are tens of micrometers long at most. The free-space equivalent connection length is only a few times as long as the actual interconnection length. The electrical connection length is far shorter than the wavelengths of signals (e.g., about 30 cm for 1 GHz signals). Reflection of signals, if any, caused by impedance mismatching due to wave propagation effect is almost negligible. Also, since the substrate of the semiconductor IC device, in which elements are integrally formed, has a relatively great dielectric constant, usually 10 or more, the electric and magnetic fields are likely to concentrate near the substrate. The electromagnetic coupling (i.e., crosstalk) between any adjacent interconnection line is weaker than that in free space. Hence, the semiconductor IC device can operate at a relatively high speed.

The electrical connection among the semiconductor IC devices involves a delay in transmitting signals and frequency-dependence of transmission loss, which can be attributed to the parasitic resistances and parasitic capacitances of the interconnection lines, and causes a crosstalk due to the electromagnetic coupling among the interconnection lines connecting the ICs. The ability of each IC device is reduced in effect by the external factors, i.e., the delay in transmitting signals, the frequency-dependency of transmission loss, and the cross talk.

The crosstalk caused by the electrical connection among the semiconductor IC devices is much greater than one occurring in each IC device. This is mainly because the interconnection lines of the IC devices are far longer than the interconnection used in each IC device. Even in a multi-chip module which is a hybrid module comprising several IC chips connected together, the electric connection length is as much as about 1 cm. In some multi-chip module, the electric connection length is as much as tens of centimeters. In either case, the impedance mismatching due to wave propagation effect is too prominent to neglect. In order to minimize the impedance mismatching it is necessary to set each interconnection line at a specific impedance such as transmission line, making it difficult to set the width of the line at any desired value. Consequently, each interconnection line cannot be narrowed to reduce its parasitic capacitance. Ultimately, the transmission of signals will be delayed greatly.

As a consequence, even if the systems comprises electrically connected semiconductor constituent IC devices which operate at a clock frequency of hundreds of megahertz or more, the systems can operate but at such a low speed as if it comprised IC devices which operate a clock frequency of tens of megahertz. To state in other words, the operation speed of the systems cannot increase in proportion to the speed of its constituent IC devices electrically connected together.

In order to solve this problem, various methods of interconnecting semiconductor IC devices by optical interconnection devices have been proposed. In an apparatus comprising IC devices connected by optical interconnections, there occurs neither a signal transmission delay nor a crosstalk. This is because no electrical lines are used to connect the high speed signal IC devices, and there are no problems resulting from the parasitic resistances or parasitic capacitances of such electrical lines, or from the electromagnetic coupling among such electrical lines interconnecting the IC devices.

Optical interconnections will provide a advantage when used in a data-processing systems or the like, optically interconnecting the boards which hold semiconductor IC devices and which are spaced from one another by a relatively long distance. If the distance is as long as several meters, the transmission band width and the transmission loss are as wide and small as those occurring in the case where the boards are spaced apart by a distance of about 1 cm and electrically connected. Furthermore, a signal transmission delay, if any, is far smaller than the delay which inevitably takes place in the case where the boards are electrically connected.

A method of interconnecting IC devices is proposed, in which electrical lines are used to connect the IC devices mounted on each board and optical interconnections device are used to optically connect adjacent boards. The optical interconnection devices will be described, with reference to FIGS. 1A and 1B, FIGS. 2A and 2B and FIGS. 3A and 3B.

FIG. 1 is a schematic representation of the input/output section 9 of a conventional optical interconnection device. As shown in FIG. 1, the section 9 comprises a light-receiving element 1, an output terminal 2 connected to the element 1, a light-emitting element 4, an input terminal 5 connected to the element 4, a collimating lens 7 located in front of the light-receiving surface of the element 1, and a collimating lens 8 located in front of the light-emitting surface of the element 4. The light-receiving element 1 has a light-receiving region 3 formed in the light-receiving surface. The light-emitting element 4 has a light-emitting region 6 formed in the light-emitting surface.

As shown in FIG. 1B, the input/output sections 9a to 9e of the optical interconnection system of the type shown in FIG. 1A, which are mounted on IC-boards, respectively, are positioned such that the optical axes of the sections 9a to 9e are aligned with one another. The boards are thereby optically connected. In FIG. 1B, the arrows indicate the directions in which signals are transmitted. The input/output section 9a of the leftmost optical interconnection device may be connected by an optical fiber to the input/output section 9e of the rightmost optical interconnection device, to thereby form a loop bus.

The optical interconnection system shown in FIG. 1A is one of the simplest. Nonetheless, it can transmit signals between two adjacent boards, just in the same way as if the substrates were electrically connected. Connected by the optical interconnection device, the boards can be separated by a relatively long distance. In addition, the transmission band width for each optical path can be as wide as 10 Gb/s. A data-processing apparatus or the like will, therefore, have its operating speed much increased if its constituent IC devices are optically connected by the interconnections of the type shown in FIG. 1A.

The optical interconnection device of FIG. 1 serves to broaden the transmission band width, but not to increase the transmission speed to a value much greater than is achieved by the electrical interconnecting lines. The reason is that, although signals are transmitted fast between the input/output sections 9 of any adjacent optical interconnection devices, it takes some time to process the signals supplied to the board and to transfer the signals among the IC devices via the lines interconnecting these IC devices. Consequently, in the apparatus as a whole, the signal transmission is delayed by the time required to process the signals in all IC devices incorporated in the apparatus. This delay time is as long as a period of several clock pulses even in the case where a data buffer and a bypass are mounted on each mounting board, or as long as several nanoseconds even in so-called simple bypass method in which the signals are analog-processed.

Hence, there will be no advantage in using the optical interconnection devices of the type shown in FIG. 1A unless the signals supplied from each substrate are processed by the IC devices mounted on the immediately next substrate. For example, if the signals from the input/output section 9a are transmitted to the input/output section 9e via the intervening sections 9b to 9d and subsequently processed by the IC devices optically connected to the section 9e, they will be delayed. Similarly, the signals will be delayed if they are transferred back to their source IC device after they have been processed by another IC device. Furthermore, the signals are delayed by a period while processed on one board and by a different period while processed on a different substrate, resulting in non-uniform signal transmission among the IC-boards.

FIG. 2A shows an optical interconnection system disclosed in Published Unexamined Japanese Patent Application No. 5-119275, which is an improvement of the optical interconnection device illustrated in FIG. 1A. This system is a little more complicated than the interconnection device of FIG. 1A, but solves the problems inherent in the optical interconnection system of FIG. 1A.

As shown in FIG. 2A, the optical interconnection system comprises a surface emitting semiconductor laser 11 (i.e., a light-emitting element), an input terminal 12 connected to the laser 11, semitransparent light-receiving elements 14a, 14b..., output terminals 16a and 16b connected to the elements 14a and 14b, respectively, a non-transparent light-receiving element 17, and an output terminal 18 connected to the element 17. The semiconductor laser 11 has an active region 13 from which to emit a laser beam. The light-receiving elements 14a and 14b have light-receiving regions 15a and 15b, respectively. The light-receiving element 17 has a light-receiving region 19 and functions as the last component of the optical path it defines jointly with the other components 11, 14a, and 14b.

The optical interconnection system further comprises collimating lens 20 and 21 and beam-correcting lenses 22a, 22b, ... The collimating lens 20 is located between the surface emitting semiconductor laser 11 and the light-receiving element 14a. The first beam-correcting lens 22a is located between the light-receiving elements 14a and 14b, the second beam-correcting lens 22b is located between the second light-receiving element 14b and the third light-receiving element (not shown), and so forth. The last beam-correcting lens (not shown) is located between the penultimate light-receiving element (not shown) and the last light-receiving element (not shown). The collimating lens 21 is located between the last light-receiving element and the non-transparent light-receiving element 17. The lenses 22a, 22b, ... converge the laser beams which have been diverged by diffraction and applied to them, so that laser beams of the same diameter may be applied onto the light-receiving elements 14a, 14b, ...

Generally, the diameter $\omega$ of a beam can be represented as follows:

$$\omega^2 = \omega_0^2 \{1 + (\lambda Z/\pi\omega_0^2)^2\} \tag{1}$$

where
 $\omega_0$: the minimum diameter of the beam
 $\lambda$: the wavelength of the light beam
 $Z$: the distance from the waist of the beam The minimum beam diameter $\omega_0$ and the beam diameter have the relationship illustrated in FIG. 2B in the case where the wavelength $\lambda$ is 1 $\mu$m and the distance $Z$ is about 25 mm (about 1 inch), i.e., a general value for the distance between the aboards which the interconnection device connect optically.

Assume that the laser beam being emitted from the active region 13 of the surface semiconductor laser 11 has a diameter of 4 $\mu$m. The moment the beam transmitted the distance Z of 25 mm, its diameter has increased to about 2000 $\mu$m, or about 500 times greater than the initial value (4 $\mu$m). In order to prevent this excessive diversion of the laser beam, the collimating lens 20 converts the input laser beam to substantially parallel beam having a diameter of, for example, 100 $\mu$m. The moment the beam transmitted another distance Z of 25 mm from the lens 20, its diameter has increased to about 128 $\mu$m. Hence, if the beam further transmitted a distance ten times longer (250 mm), its diameter will increase to about 800 $\mu$m. To avoid this increase in the beam diameter, the beam-correcting lens 22a, 22b, ...

are arranged on the output sides of the light-receiving elements 14a, 14b, . . . , respectively. These lenses 22a, 22b, . . . converge the input beam, to thereby maintain the diameter of the laser beam at a constant value.

The optical interconnection system shown in FIG. 2A is characterized in that a signal supplied to the input terminal 12 can be transmitted from one board to another, virtually at the same time, without involving in any electrical processing and, hence, without being excessively delayed. In other words, this interconnection system can reduce the transmission delay to a minimum and can transmit a signal to all boards simultaneously. To transmit signals in the opposite direction, another similar optical interconnection system defining an optical path is used, which has the same advantages as the interconnection device shown in FIG. 2A.

To transmit optical signals backwards, a plurality of identical optical interconnecting paths of the type shown in FIG. 2A are juxtaposed in the same number as the boards, with their semiconductor lasers 11 arranged in staggered fashion. The optical interconnecting paths may be arranged in a circle, thus forming a loop path. Alternatively, they may be optically connected by reflectors, thereby forming a loop path. In either case, each optical interconnecting path for one board has one transmitting element and light-receiving elements the number of which is one less than that of all boards. Optical signals can be transmitted at high speed among the boards even if the substrates are at relatively long distance from from one another.

The optical interconnection system shown in FIG. 2A is disadvantageous in two respects, because of its complex optical system. First, the components must be positioned accurately in assembling the interconnection device. Second, its reliability may be affected by changes in the temperature.

To be more specific, the lenses 20, 21, 22a, and 22b must be set in axial alignment with high precision and, in addition, the light-receiving elements 14a, 14b, . . . must be located exactly at the beam waists. It is comparatively easy to place the lenses in axial alignment, but it is difficult to detect the beam waists and locate the light-receiving elements at these beam waists. To make matters worse, each light-receiving element must be adjusted for its degree of parallelism. When the element is adjusted for its degree of parallelism, its optical axis may come out of alignment with those of the adjacent elements. Even if the optical axis is deviated only a little from that of the next element, the optical signals may not be transmitted to the next element. Further, the optical axis of each element and that of the associated lens may deviate from each other when the temperature changes. This is because the elements are made of one material, and the lenses are made of another material.

As has been described, the conventional optical interconnection devices are disadvantageous in that signals are delayed while electrically processed within the interconnection devices, or in that their optical systems are complex and difficult to assemble and that may fail to operate reliably when the temperature changes.

SUMMARY OF THE INVENTION

Accordingly, the object of the present invention is to provide an optical interconnection device which is free of signal-transmission delay since signals are not processed internally, thereby fully achieving the advantageous of optical connection, and which has an optical system easy to assemble, despite its relatively complexity, and reliable regardless of changes in the temperature.

The optical interconnection device according to the invention is one designed to optically connect IC-boards incorporated in a data-processing apparatus or the like. It has an optical systems whose light-emitting and light-receiving elements are formed in the form of an integral unit such that the optical axes of the elements are aligned and remain aligned despite changes in the temperature.

The optical interconnection device of this invention is characterized in two respects. First, light-emitting elements, light-receiving elements, and surface lenses are arranged, constituting integral optical interconnecting units spaced apart at substantially regular intervals. Second, the surface lens of each optical connecting unit has such optical property that it transmits optical signals to the next optical interconnecting unit without causing energy loss.

The following are preferred embodiments of the present invention:

(1) An optical interconnection device wherein each surface lens is a wave-front converting element such as a grating lens or a Fresnel lens, either having concentric annular grooves.

(2) An optical interconnection device wherein the back electrode has a specific pattern and can diffract input light, thus functioning as a surface lens.

(3) An optical interconnection device wherein each optical semiconductor element amplifies that component of the input light which has a selected wavelength and emits the amplified light from its low-reflected light-emitting surface. Each semiconductor element has an optical resonator interposed between the light-receiving surface and light-emitting surface, and the resonator has an optical thickness which is an integral multiple of half the selected wavelength.

(4) An optical interconnection device wherein each optical semiconductor element receives light at its light-receiving surface and emits the light from its light-emitting surface. Each semiconductor element has an optical resonator which is interposed between the light-receiving surface and the light-emitting surface and which has an effective length continuously changing in a plane.

(5) An optical interconnection device wherein each optical semiconductor element is a surface emitting semiconductor laser amplifier which receives light at a surface parallel to the active layer, and the input light is made to pass several times through the active layer.

(6) An optical interconnection device wherein each optical semiconductor element has an optical film comprising regions having different reflectances, each region consisting of a different number of layers.

(7) An optical interconnection device wherein each optical semiconductor element has a pn junction formed of a p-type semiconductor layer and an n-type semiconductor layer. Each semiconductor element has a mesa structure including a light-emitting active region and a non-active region surround the active region, and a mask for shielding the light incident on the non-active region.

(8) An optical interconnection device which has a circuit comprising a photodiode for converting optical signals to electric signals, a forward-biased diode connected to the output of the photodiode and working as a load element, and a comparator for comparing the voltage at the node between the photodiode and the diode with a reference voltage, to thereby generate a digital signal.

The optical interconnection device according to the present invention has integral interconnecting elements, each comprising an optical semiconductor element and a surface lens. Therefore, the interconnection device can be easily manufactured and, hence, at low cost, and operates reliably despite changes in the temperature. For its low price and its reliability, the optical interconnection device can be incorporated into general-purpose data-processing apparatus in order to improve the performance of the apparatus.

Further, each optical interconnecting element can be easily made and can have excellent heat-radiating property since its back electrode is specifically patterned, forming a surface lens. Since the resonator interposed between the light-receiving surface and light-emitting surface of each optical semiconductor element has an optical thickness which is an integral multiple of half the wavelength to be selected, the returning light is suppressed. As a result, the optical semiconductor element has a high operating efficiency and a low power consumption. Moreover, provided with an optical resonator which is interposed between the light-receiving surface and the light-emitting surface and which has an effective length continuously changing in a plane, each optical semiconductor element has a continuously varying resonance wavelength.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 7A is a sectional view schematically showing a light-transmitting surface semiconductor element for use in a second embodiment of the present invention;

FIG. 7B is a diagram showing the pattern of the back electrode of the surface semiconductor element shown in FIG. 7A;

FIGS. 8B to 8F are diagram for explaining the problems with shows the conventional wavelength-selecting filter;

FIG. 23 is a sectional perspective view of a light-emitting diode laser according to the sixth embodiment of the present invention;

FIG. 24 is a sectional view showing a conventional surface light-receiving element;

FIGS. 25A and 25B are diagrams for explaining how the light-receiving element shown in FIG. 24 is optically connected to an optical element;

FIG. 25C is a diagram representing the frequency characteristic of the light-receiving element shown in FIG. 24;

FIG. 34 is a diagram representing the relationship between the output voltage of the interconnection device of FIG. 32 and the temperature;

FIG. 35 is a sectional view showing the light-receiving section of the optical interconnection device shown in FIG. 32;

FIG. 36 is a circuit diagram showing the light-receiving section shown in FIG. 35;

FIG. 37 is a graph showing how the output voltage of the interconnection device shown in FIG. 32 changes with time;

FIG. 38 is a circuit diagram showing a modification of the light-receiving section shown in FIG. 36;

FIG. 39 is a circuit diagram illustrating another modification of the light-receiving section shown in FIG. 32;

DETAILED DESCRIPTION OF THE PREFERRED EMBODIMENTS

Embodiments of the present invention will now be described in detail, with reference to the accompanying drawings.

First Embodiment

Figure 3A:
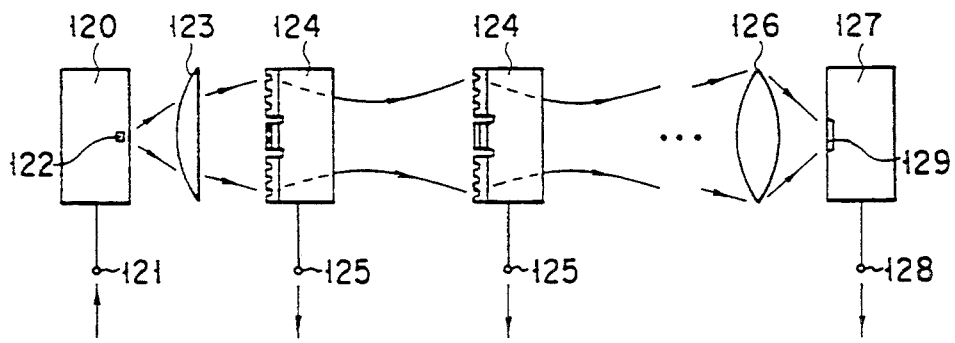
FIG. 3A is a schematic representation of an optical interconnection device according to a first embodiment of the present invention.
Figure 3B:
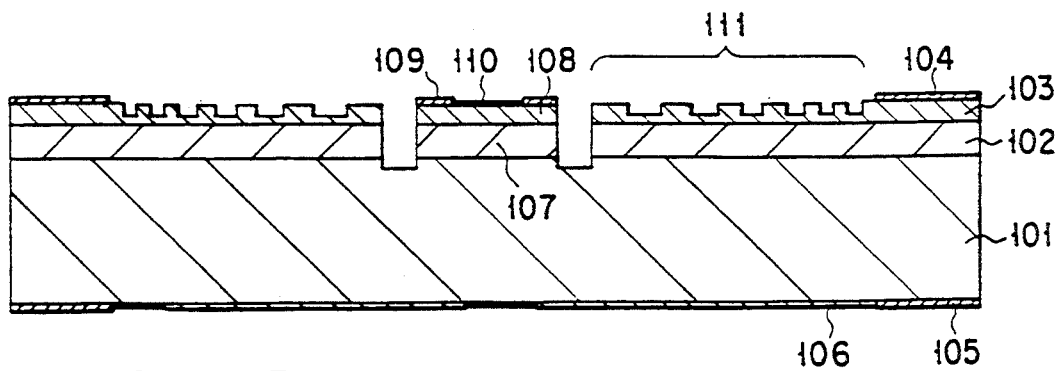
FIG. 3B is a sectional view showing one of the optical interconnecting elements incorporated in the optical interconnection device illustrated in FIG. 3A.

FIG. 3A schematically illustrates an optical interconnection device according to a first embodiment of the present invention, and FIG. 3B is a sectional view showing one of the identical optical interconnecting elements 124 in corporated in the optical interconnection device.

As shown in FIG. 3B, the optical interconnecting element 124 is a GainAsP element having an n-type InP substrate 101. The element 124 comprises a light-amplifying GainAs layer 102 formed on the upper surface of the substrate 101, a p-type InP layer 103 formed on the GaInAs layer 102, an p-side electrode 104 made of AuZn or a similar metal and formed on the InP layer 103, and an n-side electrode 105 made of AuGe or the like and formed on the lower surface of the substrate 101. The element 124 further comprises a light-receiving GainAs layer 107 formed on the substrate 101, a p-type InP layer 108 formed on the light-absorbing layer 107, and an electrode 109 made of Au/Pt/Ti or a similar metal and formed on the layer 108. The element 124 further has two low-reflectance coatings 106 and 110 and an grating lens 111. Both coatings 106 and 110 are made of $Si_3N_4$ or the like ($\frac{1}{4}$ wavelength) and used to prevent the incident light from being reflected. The coating 106 covers the lower surface of the substrate 101, except that portion thereof on which the n-side electrode 105 is formed. The coating 110 covers the p-type InP layer 108, except that portion thereof which is covered by the electrode. Both coatings 106 and 110 are made of $Si_3N_4$ or the like ($\frac{1}{4}$ wavelength) and used to prevent the incident light from being reflected. The grating lens 111 is defined concentric annular grooves formed in the surface of the p-type InP layer 103 by means of etching. The lens 111 is designed to focus an input beam at a point at half the distance between the two boards to be connected by the optical interconnection device.

The light-amplifying GainAs layer 102 and the light-receiving GainAs layer 107 have been formed simultaneously, first by forming a GainAs layer on the n-type InP substrate 101 and then by forming an isolating groove in the GainAs layer and in the surface of the InP substrate 101. The grating lens 111 has a diameter of about 300 $\mu$m. Therefore, the laser beam applied to the optical interconnecting element 124 is focused diameter of about 300 $\mu$m. The light-absorbing GainAs layer 107 has a diameter of about 20 $\mu$m. If the layer 107 had a diameter greater than 20 $\mu$m, it would jeopardize the function of the the grating lens 111 should fail to perform its function. In addition, since its diameter is relatively small, the light-amplifying GainAs layer 102 can compensate for the optical energy loss of the laser beam.

As shown in FIG. 3A, the optical interconnection device comprises a surface emitting semiconductor laser 120, an input terminal 121, a beam-diverging lens 122, output terminals 125, a beam-focusing lens 126, and a light-receiving element 127, and an output terminal 128—in addition to the optical interconnecting elements 124. The laser 120 has an active region 122. The input terminal 121 is connected to the laser 120. The beam-diverging lens 122 is located between the laser 120 and the first interconnecting element 124, for diverging the laser beam emitted from the active region 122 of the laser 120. The output terminals 125 are connected, each to one optical interconnecting element 124. The beam-focusing lens 126 is located between the last optical interconnecting element 124 and the light-receiving element 127, for focusing the laser beam onto the light-receiving region 129 formed in the surface of the element 127. The output terminal 128 is connected to the light-receiving element 127.

Figure 1A:
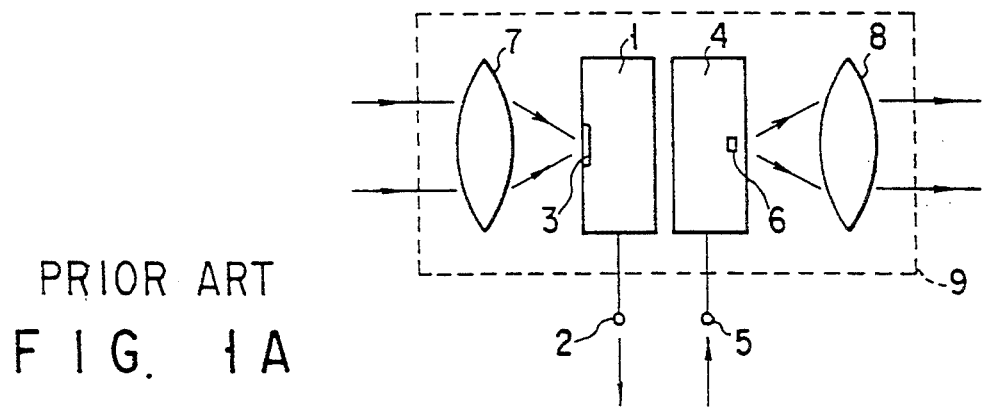
FIG. 1A is a schematic representation of a conventional optical interconnection systems.
Figure 1B:
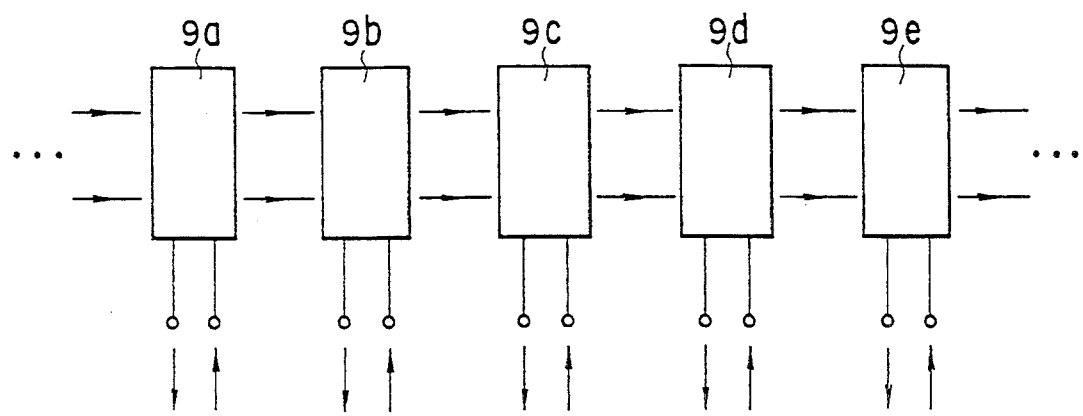
FIG. 1B is a diagram explaining how optical interconnection systems are positioned to have their optical axes aligned with one another.
Figure 2A:
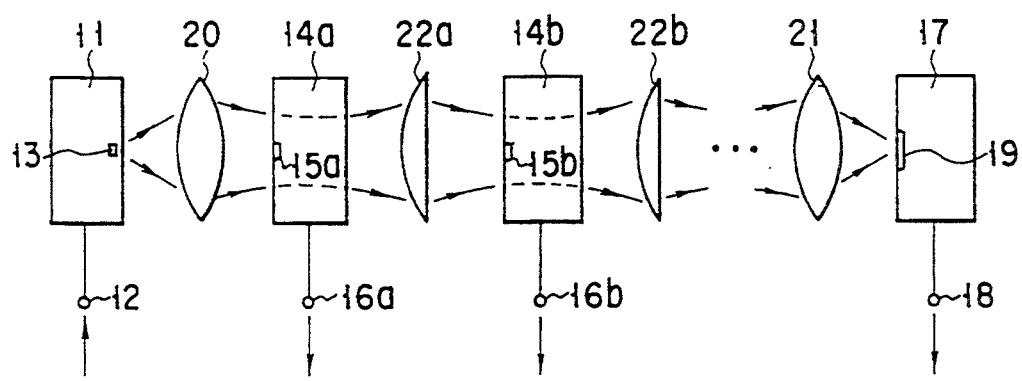
FIG. 2A is a schematic representation of another conventional optical interconnection system.
Figure 2B:
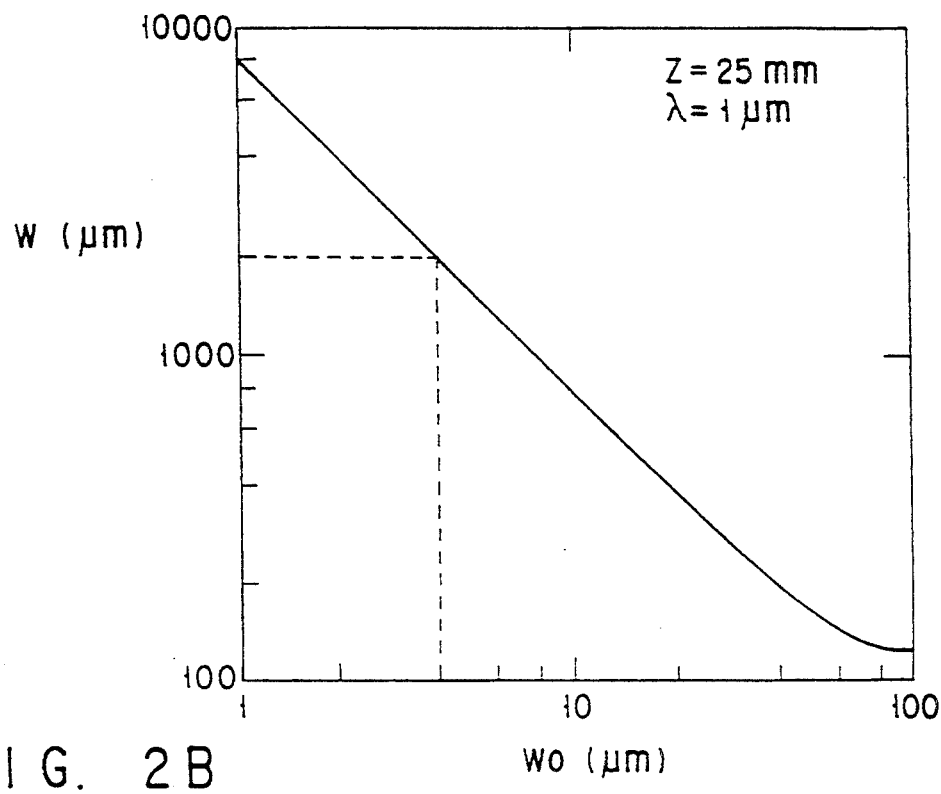
FIG. 2B is a graph representing the relationship which the minimum beam diameter and the beam diameter have in the optical interconnection system illustrated in FIG. 2A.

The optical interconnection device is similar to the conventional interconnection device of FIG. 2A in basic structure and basic function. It differs in that no optical elements are interposed between any adjacent optical interconnecting elements 124 which correspond to the light-receiving elements 14a, 14b ... (FIG. 2A). In assembling the optical interconnection device, it therefore suffices to place less components, i.e., the components 120, 123, 124, 126 and 127, in alignment in terms of optical axis and focal distance. Since each optical interconnecting element 124 comprises a p-type InP layer 108 (corresponding to the light-receiving region 15 of the element 14) and a grating lens 111 (corresponding to the beam-correcting lens 22), which are formed integrally of the same material, the layer 108 and the lens 111 expand or contract to the same degree as the temperature changes. Hence, their optical axes remain in alignment, no matter how the temperature changes. The optical interconnection device therefore operates with high reliability. For the purpose of increasing the operating reliability of the interconnection device, the laser 120 and the lens 123 may be combined into an integrated optical unit, and the lens 126 and the light-receiving element 127 may be combined into an integrated optical unit.

Figure 4:
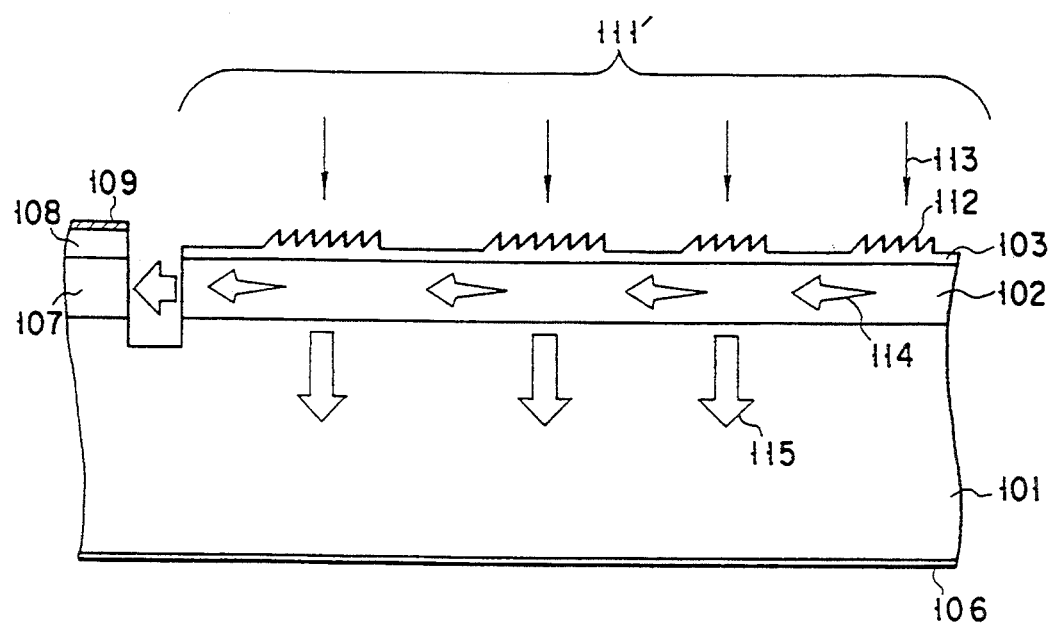
FIG. 4 is an enlarged view showing that part of the element which includes a grating lens.

An light-amplifying structure which may be incorporated in the optical interconnecting element 124 (FIG. 3B) will be described, with reference to FIG. 4. FIG. 4 is an enlarged view showing the grating lens 111' of the element 124. As is evident from FIG. 4, the grating lens 111' has secondary blazed gratings 112, each formed on the surface of one annular projection.

Generally, a grating lens has a so-called zone-plate pattern having a synchronous structure greater than that of the secondary gratings 112. The longer the focal distance of the lens, the longer the period. On the other hand, the function of a secondary grating is to diffract the incident light, to thereby guide the light along a line extending at the right angles to the optical axis of the lens. In the present embodiment, each secondary grating 112 is a blazed one whose elements has an asymmetrical cross section. The secondary gratings 112 shown in FIG. 4, therefore, diffract incident light 113 in the direction of arrows 114 extending to the left, at right angles to the optical axis of the grating lens 111'. The lights, thus diffracted, travels through the light-amplifying GaInAs layer 102 and is amplified. Each of the amplified light beams is diffracted downwards as indicated by an arrow 115 by a secondary grating (not shown) formed within the layer 102 and contacting the secondary grating 112 next to that secondary grating 112 which has diffracted the beam.

That part of the light which has been diffracted by the innermost secondary grating 112 is amplified while traveling through the light-amplifying layer 102 and is then applied to the light-absorbing layer 107. This par to the light serves to enhance the sensitivity of the layer 107. As a result, the input side and output side of the grating lens 111' are displaced with each other by one pitch, and the beam output from the optical interconnecting element 124 are out of phase with respect to the beam applied to the element 124. This phenomenon may change the focal distance from the design value. In order to prevent such a change in focal distance, the grating lens 111' is designed such that the distance the light travels through the light-amplifying layer 102 increases by the one-pitch of the grating lens pattern. Thus, the light is amplified more than in the case it passes downwards through the light-amplifying layer 102.

A modification of the optical interconnection device shown in FIG. 3A will be described, with reference to FIGS. 5A, 5B, 6A, and 6B. The modified optical interconnection device is designed to optically connect one signal-receiving board and a plurality of signal-transmitting boards. In this regard, it should be noted that the optical interconnection device of FIG. 3A is designed to optically connect one signal-transmitting board and a plurality of signal-receiving boards.

Figure 5A:
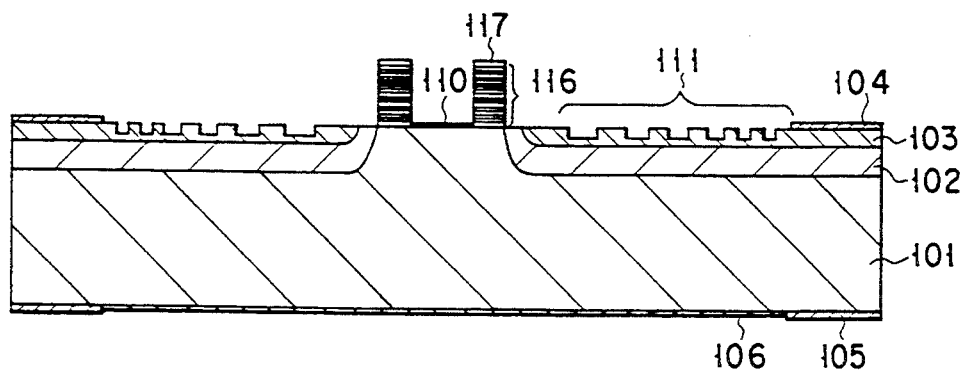
FIG. 5A is a sectional view showing an optical interconnecting device element designed to receive a signal and optically transmit the signal.

FIG. 5A shows one of the identical interconnecting elements 141a, 141b, 141c, ... which are used in the modified optical interconnection device. The components identical or similar to those shown in FIG. 3B are denoted at the same numerals in FIG. 5A and will not be described in detail.

As can be understood from FIG. 5A, the optical interconnecting element is characterized in that a hollow cylindrical surface emitting semiconductor laser 116 is used in place of the light-absorbing GaInAs layer 107 (FIG. 3B) which is a solid cylinder. A annular p-side electrode 117 made of AuZn or a similar metal is formed on the semiconductor laser 116. The hollow cylindrical laser 116 will be described in greater detail, with reference to FIG. 5B.

Figure 5B:
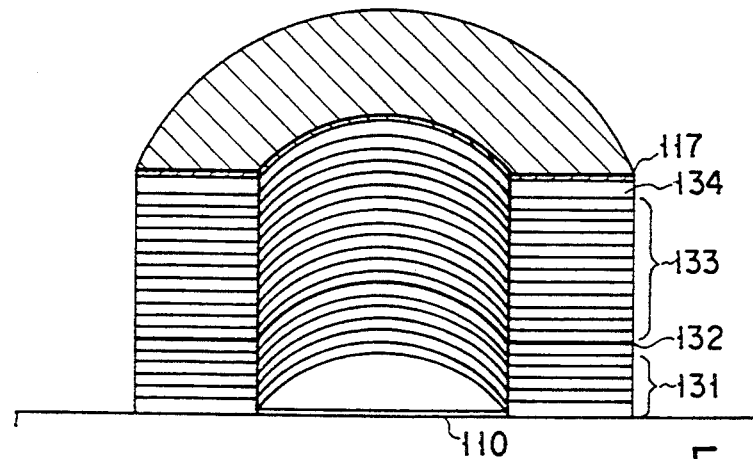
FIG. 5B is an enlarged perspective view showing the hollow cylindrical surface semiconductor laser incorporated in the optical interconnecting element shown in FIG. 5A.

As shown in FIG. 5B, the semiconductor layer 116 comprises an n-type distributive reflector 131, an active layer 132, a p-type distributive reflector 133, and a p-type contact layer 134. These components 131 to 134 are ring-shaped and identical in both the outer diameter and the inner diameter, and are coaxially mounted one upon another. The laser 116 is a so-called DBR (Distributed Bragg Reflector) type. The reflectors 131 and 133 have the second order period (i.e., full wavelength), not the primary period (i.e., ½ wavelength). The laser 116 guides light in the vertical direction, thus functioning as a DBR laser, guides light in the circumferential direction, thus working as a so-called ring laser. In other words, the laser 116 operates in both a DBR-laser mode (i.e., the vertical resonance mode of the distributed reflectors 131 and 133) and a ring-laser mode (i.e., the circumferential resonance mode of the entire laser 116) by virtue of the diffraction characteristic of the secondary gratings 112 shown in FIG. 4.

A ring laser has two operating modes, i.e., the clockwise mode and the counterclockwise mode. The hollow cylindrical laser 116 operates by coupling of three basic modes (i.e., the clockwise mode, the counterclockwise mode, and the DBR-laser mode)—at the same time. Hence, the hollow cylindrical semiconductor laser 116 can have a higher efficiency and a lower threshold value than an ordinary DBR laser or a ring laser. The laser 116 outputs light downwards in the DBR mode.

Figure 6A:
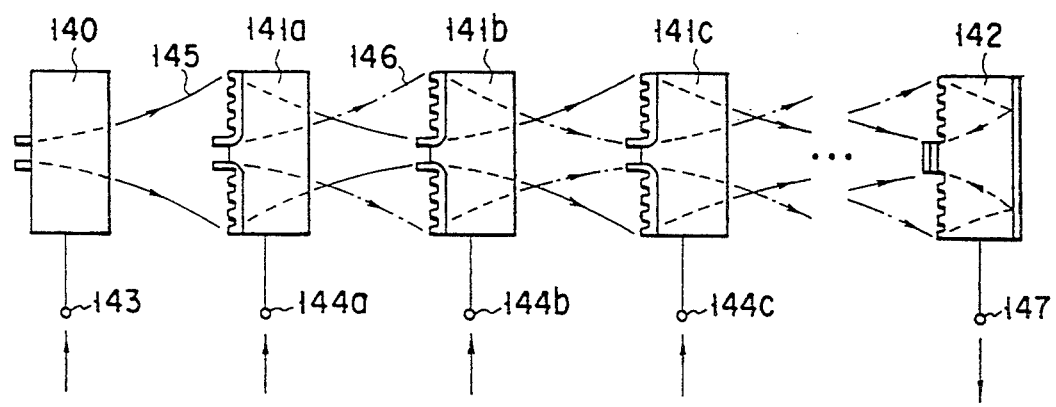
FIG. 6A is a schematic representation of a modification of the optical interconnection device shown in FIG. 3A, which comprises a plurality of interconnecting elements identical to the one illustrated in FIG. 5A.

FIG. 6A shows the modified optical interconnection device comprising the identical interconnecting elements 141a, 141b, 141c . . . As clearly seen from FIG. 6A, the interconnection device further comprises a surface semiconductor laser device 140, a light-receiving element 142, an input terminal 143, input terminals 144a, 144b, 144c . . . , and an output terminal 147. The laser device 140 has a hollow cylindrical laser. The input terminal 143 is connected to the laser device 140. The input terminals 144a, 144b, 144c, . . . are connected to the optical interconnecting elements 141a, 141b, 141c, respectively. The output terminal 147 is connected to the light-receiving element 142.

In the optical interconnection device of FIG. 3B, the beam emitted from the active region 122 of the laser 120 is focused by every optical interconnecting element. In the modified optical interconnection device, the beam 145 emitted from the laser device 140 is focused by the first interconnecting element 141a, then passes through the hollow cylindrical laser 116 of the second interconnecting element 141b, is focused by the third interconnecting element 141c, further passes through the laser 116 of the fourth interconnecting element (not shown), and so forth. Meanwhile, the beam 146 emitted from the hollow cylindrical laser 116 of the first interconnecting element 141a is focused by the second interconnecting element 141b, then passes through the laser 116 of the third interconnecting element 141c, is focused by the fourth interconnecting element, further passes through the laser of the fifth interconnecting element (not shown), and so forth. In other words, the laser beams, both emitted from a narrow region, are focused by every other optical interconnecting element, so they may be superposed on each other.

Were each laser beam focused by every optical interconnecting element as in the interconnection device illustrated in FIG. 3A, the beam emitted from the interconnecting element preceding the immediately preceding one could not be focused, though the beam emitted from the immediately preceding interconnecting element could be focused effectively. It would also be difficult to superpose the laser beam emitted from the laser 116 of any interconnecting element on the light beam focused by this interconnecting element. Since the beams 145 and 146 are focused by every other optical interconnecting element in the modified optical interconnection device (FIG. 6A), the beam focused by any interconnecting element has the same diameter as the hollow cylindrical laser 116 of the immediately following interconnecting element. Therefore, the laser beams 145 and 146 are effectively superposed on each other.

Figure 6B:
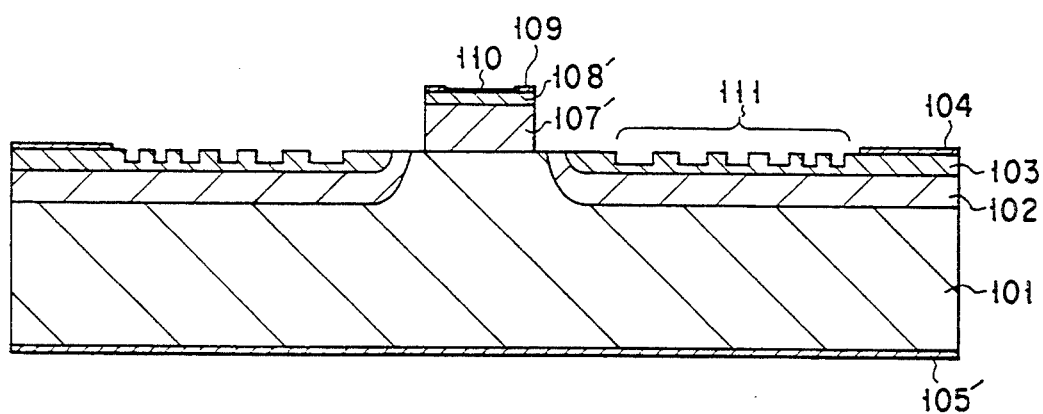
FIG. 6B is a sectional view showing the light-receiving element incorporated in the optical interconnection device shown in FIG. 6A.

FIG. 6B shows the light-receiving element 142 incorporated in the modified interconnection device shown in FIG. 6A. Like the light-receiving element 127 used in the interconnection device of FIG. 3A, the element 142 is the last-stage component. The element 142 is identical in structure to the optical interconnecting element shown in FIG. 5A, except that a solid cylindrical light-receiving section is used in place of the hollow cylindrical laser 116. The light-receiving section comprises a light-absorbing GaInAs layer 107′, a p-type InP layer 108′ formed on the layer 107′, an electrode 109′ formed on the layer 108′, and a coating 110′ covering the layer 108′, except that portion thereof which is covered by the electrode 109′. The light-receiving section receives the laser beam emitted from the last optical interconnecting element, while the grating lens 111 focuses the laser beam emitted from the penultimate interconnecting element. The beam focused by the lens 111 is reflected by the n-side electrode 105′ formed on the lower surface of the InP substrate 101. The light-absorbing GaInAs layer 107′ receives the beam reflected from the electrode 105′. Thus, the light-receiving element 142 collects two laser beams, one focused by the last optical interconnecting element and the other emitted from the penultimate optical interconnecting element.

As has been described, the optical interconnection device according to the first embodiment of the present invention can transmit signals among IC-boards much faster than in the case where the IC-boards are electric lines, and can be manufactured at lower cost than the conventional optical interconnection devices. The optical interconnection device is, therefore, suitable for use in data-processing apparatus and the like, and can help to increase the operating speed and performance of these apparatus.

In the following, other examples of the present invention will be described, which differ from the first embodiment only in the types of optical interconnecting elements used.

Second Embodiment

The second embodiment relates to a surface emitting semiconductor element which is used as an optical interconnecting element, and more particularly to a light-transmitting surface semiconductor element characterized in that the electrode formed on the lower surface of the substrate is so shaped as to diffract a light beam efficiently.

A number of elements capable of amplifying, deflecting, branching and switching the incident light should be manufactured in the form of an integrated semiconductor unit since semiconductor elements of various functions can be formed on the same substrate in similar processes. These semiconductor elements should be surface ones, which are relative small and need not be physically separated and which can therefore be arranged in a high integration density. In addition, the surface semiconductor elements should be those which transmit light from the front of the substrate to the back thereof.

Various types of light-transmitting surface emitting semiconductor elements have been developed hitherto. The active layer of each light-transmitting surface emitting element has but an insufficient action length. To provide a sufficient effective action length, two mirrors are located above and below the active layer, respectively, whereby the active layer and these mirrors constitute a resonator. The density of the current carriers which interact with light must be adequately increased, to thereby amplify the light. To this end, the active layer needs to have a diameter as small as 10 $\mu$m. Hence, the incident beam should be focused to have a diameter equal to that small diameter of the active layer. Otherwise the incident light could not be amplified adequately. The beam, thus focused, will inevitably diffracted as it emerges from the back of the substrate and will eventually diverge and scatter.

For the purpose of preventing the light beam from scattering, a resist or the like may be deposited on the substrate back, to thereby form a lens, or a tiny lens may be formed in the surface of another substrate by means of ion diffusion. In the latter case, the position of this lens must be adjusted such that its optical axis is aligned with that of the light-transmitting surface element. The position adjustment is an additional step of manufacturing the integrated semiconductor unit comprising light-transmitting surface elements, and inevitably increases the manufacturing cost of the semiconductor unit. In the case where a resist is deposited on the substrate back, to thereby form a lens, it covers the electrode of the surface element, unavoidably narrowing the exposed portion of the electrode. Consequently, the heat radiation from the element is impaired, ultimately deteriorating the operating characteristic of the light-transmitting surface emitting semiconductor element.

Like the optical interconnecting elements of the first embodiment, each light-transmitting surface emitting semiconductor element may have a grating lens in the opening of the electrode formed on the front surface or back of the substrate. The grating lens formed on the substrate back can collect the transmitting light by virtue of the phase difference between any etched portion and the adjacent unetched portion. However, since an electrode is formed on the substrate back after this grating lens has been formed by etching the substrate back, the method of manufacturing the interconnection device is complicated. The second embodiment of the present invention can provide a light-transmitting surface emitting semiconductor element which solves the problems inherent in the conventional element of the same type. To state in another word, the element of this invention has a simple structure, can radiate heat well, and can be arranged in a high integration density.

FIG. 7A schematically shows a light-transmitting surface emitting semiconductor element according to the second embodiment, which is a surface light amplifier. As is illustrated in FIG. 7A, the light amplifier comprises a a semiconductor substrate 151, an active layer 152, cladding layers 153 an 154, DBR mirrors 155 and 156, a cap layer 157, a surface electrode 158, and a back electrode 159. The surface electrode 158 is formed on the upper surface of the substrate 151, and the back electrode 159 on the back of the substrate 151. The surface light amplifier further comprises a lens layer 160 covering the surface electrode 158 and the exposed upper surface of the semiconductor substrate 151.

In operation, the lens layer 160 collects the incident light 161 applied to it. The light, thus collected, passes through the cap layer 157, reaching the resonator constituted by the cladding layer 153 and the DBR mirror 154. While repeatedly reflected by the resonator, the light interacts with the current carriers in the active layer 152 and is thereby amplified. The light, thus amplified, travels to the semiconductor substrate 151 and passes therethrough. While passing through the substrate 151, the light beam is diffracted at an angle $\theta$, which is represented as follows:

$$\theta \sim \lambda/\pi n \omega_0 \qquad (2)$$

where
n: the refractive index of the substrate 151
$\omega_0$: the diameter the beam has at the interface between the DBR mirror 155 and the substrate 151, being similar to that of the active layer 152.

The light beam is further diffracted by the back electrode 159 formed on the back of the semiconductor substrate 151. The back electrode 159 has arcuate openings which allows the passage of light having specific wavelengths and having acquired a gain in the active layer 152. As is shown in FIG. 7B, the back electrode 159 comprises a plurality concentric rings and a bridge interconnecting these rings. Each of the electrode rings has the following inner and outer diameters:

$$\text{Inner diameter } R_m = m\lambda f \ (m=1, 3, 5, 7 \ldots) \qquad (3)$$

$$\text{Outer diameter } R_m = m\lambda f \ (m=2, 4, 6, 8 \ldots) \qquad (4)$$

where:
$\lambda$: wavelength of the incident light
f: focal distance of the output light The concentric rings of the back electrode 159 functions as a lens which has a focal distance of f. The bridge interconnecting the rings may cause turbulence of light. The turbulence of light does not matter in practice, provided that the bridge has a width of several micrometers or less.

Generally, a light-transmitting surface emitting semiconductor element must have a lens-like structure formed on both surfaces of the substrate. In the second embodiment of the present invention, a lens is formed on both surfaces of the substrate in monolithic fashion. More specifically, a lens is formed on the upper surface of the substrate in the following way. First, a photoresist is coated on the upper surface of the substrate and appropriately heat-treated, thereby applying a surface tension on a portion of the resist. By virtue of the surface tension, that portion of the resist bulges, forming a lens. A lens is formed on the lower surface of the substrate, merely by vapor-depositing a metal film on the lower surface and then by patterning the metal film before components and a lens are formed in the upper surface of the substrate. No grating needs to be formed at all, and the upper surface of the substrate remains flat so that components can be easily formed in the upper surface of the substrate. Furthermore, since the back electrode can have a large area, it can be mounted with a low thermal resistance by using another heat sink.

The back electrode may be replaced by a lattice-shaped one which has a pitch similar to the wavelength of the incident light. In this case, the electrode functions as a diffraction lattice, which can bend the optical axis of the interconnection device comprising a plurality of light-transmitting surface emitting semiconductor elements. The diffraction lattice can therefore serve to facilitate the designing of the optical interconnection device. The pitch of the diffraction lattice can be reduced so that the lattice may function as a polarizer.

In addition, the active elements of the optical interconnection device are not limited to light-amplifying ones. They may be, for example, light-transmitting light modulators. A light modulator comprises an electrode, a light-amplifying element and a light-absorbing element. The electrode is biased to make current carriers move or stop, thereby activating the light-amplifying element to emit light, or activating the light-absorbing element not to emit light. The light modulator needs to have two lenses formed the two major surfaces, respectively. The lenses can be formed by a relatively easy method, and the light modulator can radiate heat efficiently. Used as an optical interconnecting element, the light modulator must include a light-emitting element and a light-receiving element. These elements may be formed in either the active-element region or any other region.

As described above, the light-emitting surface emitting semiconductor element according to the second embodiment of the invention can be easily manufactured and have good heat-radiating characteristic. Hence, the element can be inexpensive and arranged in a high integration density. Despite its simple structure, the element provide a specific diffraction effect and can radiate heat efficiently. The light-emitting surface emitting semiconductor element serves to constitute a high-density, large-scale optical unit which can be useful as a circuit component of a high-density integrated circuit or an optical transmitting/receiving circuit.

Third Embodiment

The third embodiment of the present invention relates to a surface light-amplifying semiconductor element (an optical interconnecting element) for use in an optical interconnection device, and more particularly to one designed to suppress the returning of reflected light.

As the optical communication technology and the optical computing technology are advancing, it is increasingly demanded that optical devices be improved in terms of operating efficiency and power saving. To the optical communication technology, surface emitting optical devices are of vital importance since they help to achieve parallel data processing and multi-dimensional data processing. It is also demanded that surface devices such as wavelength-selecting filters be developed which can not only able to select light beams of desired wavelengths but also amplify and switch light beams and which can be arranged in a high integration density.

Figure 8A:
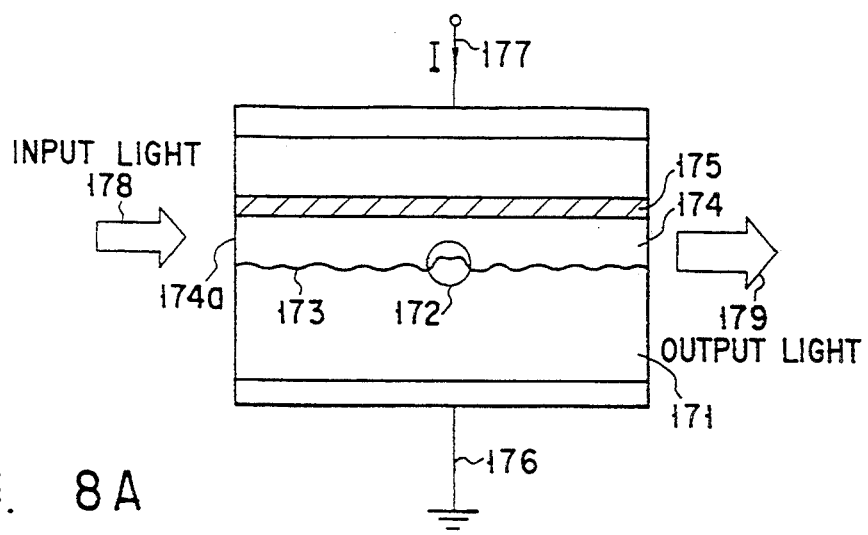
FIG. 8A is a sectional view showing a conventional wavelength-selecting filter.

FIG. 8A is a sectional view of a conventional wavelength-selecting filter. As shown in this figure, the filter comprises a semiconductor substrate 171, a diffraction lattice 173 formed on the substrate 171, an optical wave path 174 formed on the diffraction lattice 171, an active layer 175 formed on the wave path 174, and two electrodes 176 and 177. The diffraction lattice 173 has a λ/4 shifting section 172 at the middle portion. The electrode 176 is connected to the ground, and the electrode 177 is use to inject an electric current I into the filter. The current I is set at a value equal to or less than the threshold oscillating current of a laser diode.

In operation, multiplied input light 178 consisting of components of various wavelengths is applied to one side 174a of the filter. Of these components, only those having the Bragg wavelength determined by the inter-lattice interval and refractive index of the diffraction lattice 172 are selected and output as output light 179 from the other side 174b of the wavelength-selecting filter.

Wavelength-selecting filters are roughly classified into to types. The first type is called "travelling wave filter" in which which the input light is amplified only once as is illustrated in FIGS. 8B and 8D. The second type is called "multiple reflecting filter" in which the input light is repeatedly reflected and amplified by a resonator, as is shown in FIGS. 8C, 8E and 8F. Either type has a non-reflective coatings on both the input and output sides. The light returning from the input side of the filter, due to the non-reflective coatings, results in not only a optical energy loss but also a noise to the preceding wavelength-selecting filter.

In the travelling wave filter (FIG. 8B), the input light passes through the gain medium only once. The optical path is therefore short, and the gain of optical energy is small. To increase the gain, carriers are injected into the gain medium in a density not so high as to cause laser oscillation. Hence, the propagating wave filter is inferior to the multiple reflecting filter (FIG. 8C) in view of power efficiency. Furthermore, with the propagating wave filter it is difficult to such complex coat non-reflective films as to reflect no light, for the purpose of suppressing the returning light.

In the multiple reflecting filter, the input light is made to pass through the gain medium back and forth many times. The optical path is therefore sufficiently short, and the amplification factor is sufficiently large even if the layer of the gain medium layer is thin. Thus, the filter can be made small and can have a high power efficiency. Since its input side has a comparatively high reflectance, however, the returning light is so intense that the multiple reflecting filter cannot be put to practical use.

The third embodiment of the present invention provides a surface light-amplifying semiconductor element which is free of the above-mentioned problems with the conventional semiconductor elements, which emits no returning light even if it is of multiple reflecting type and which has a high operating efficiency and a low power consumption. To be more specific, the surface emitting light-amplifying semiconductor element has high reflection coefficient at its input side and a low reflectance coefficient at its output side and comprises a resonator having a optical thickness which is an integral multiple of half the input light wavelength, and can therefore suppress the returning light.

Figure 9A:
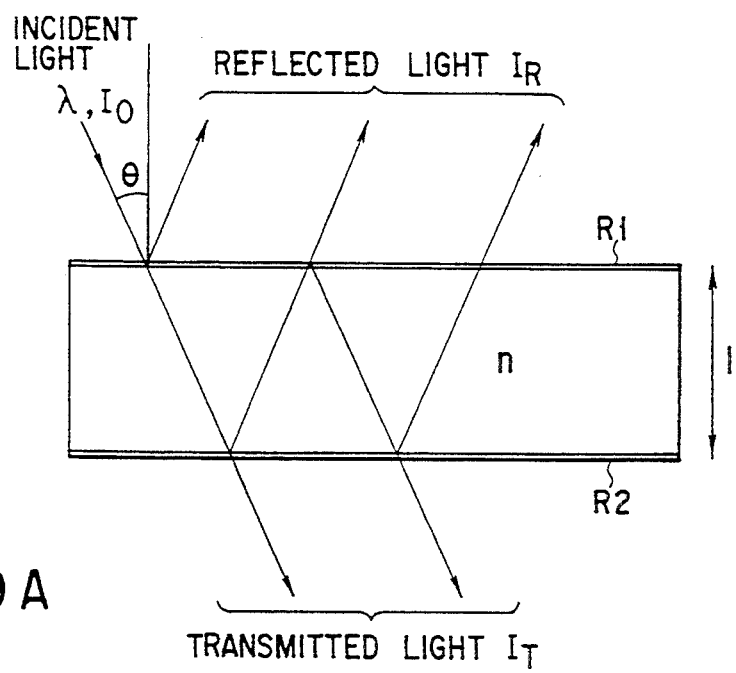
FIG. 9A to 9C are diagrams for explaining the operating principles of a third embodiment of the present invention.
Figure 9B:
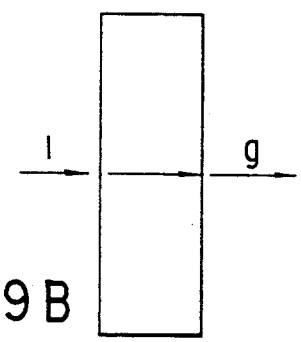

When light having a wavelength λ and an intensity $I_0$ is applied at an incidence angle $\theta$ to a resonator having a length 1, an average refractive index n, and reflectances $R_1$ and $R_2$ ($R_1 > R_2$) at its input side and output side, respectively, the light transmitted from the resonator has an intensity $I_T$ which is represented as follows:

$$I_T = \frac{(1-R_1)(1-R_2)g^2}{1 + R_1 R_2 g^4 - 2\sqrt{R_1 R_2}\ g^2 \cos\phi} I_0 \quad (5)$$

where $\phi = (2\ln/\lambda\cos\theta)\,2\pi$ g: gain the light gets while passing through the resonator only once as shown in FIG. 9B When the optical thickness of the resonator is an integral multiple of λ/2, $\cos\phi = 1$. It follows that the intensity $I_T$ of the transmitted light reaches its maximum value. At the time $I_T$ becomes maximal, the light reflected from the input side of the resonator has an intensity $I_R$ which is represented as follows:

$$I_R = R_1 \left(1 - \frac{(1-R_1)\sqrt{\frac{R_2}{R_1}}\,g^2}{1 - \sqrt{R_1 R_2}\,g^2}\right)^2 I_0 \quad (6)$$

Figure 9C:
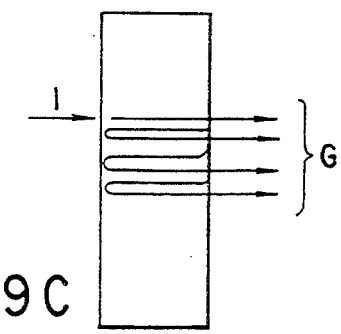

Thus, despite the high-reflecting coating formed on the input side of the resonator, the returning light can be reduced to nil while maintaining the transmitted light intensity $I_T$ at the maximum value, by injecting carriers into the resonator, thereby changing g such that $g^2 = (R_1/R_2)^{\frac{1}{2}}$. When the returning light is reduced to nil, the gain G the incident light acquires due to multiple reflection (FIG. 9C) in the resonator is:

$$G = \frac{(1-R_2)(1-R_1)g^2}{(1 - \sqrt{R_1 R_2}\,g^2)^2} = \frac{1-R_2}{1-R_1}\sqrt{\frac{R_1}{R_2}} \quad (7)$$

Obviously, $G>1$ when $R_1 > R_2$. Namely, the resonator amplifies the incident light.

Figure 10A:
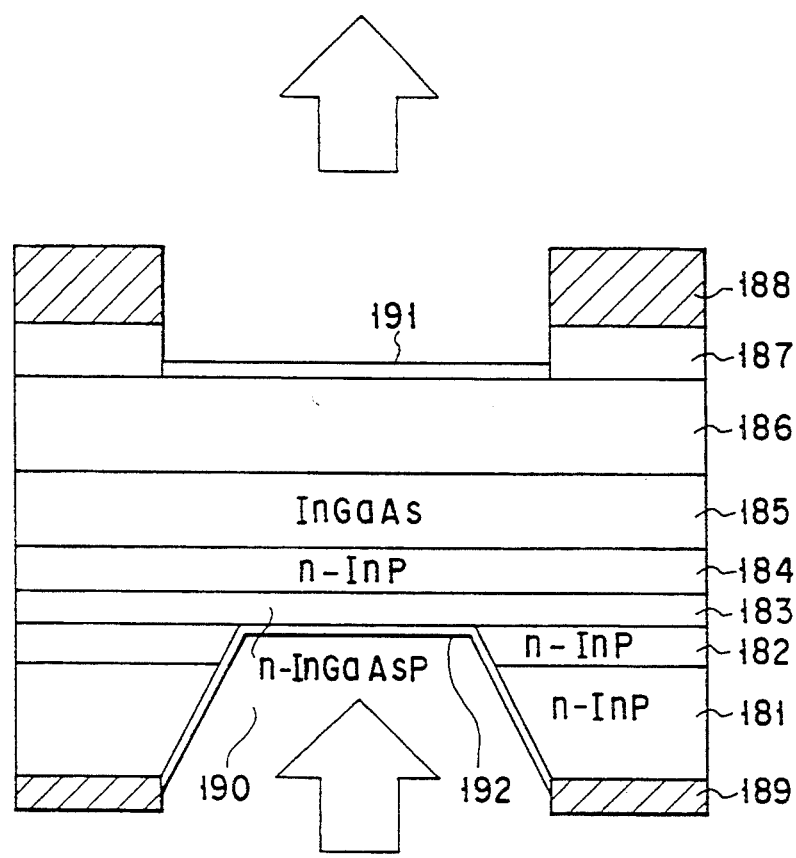
FIG. 10A is a sectional view of a surface light-amplifying semiconductor element which is the third embodiment of the invention.

FIG. 10A shows a surface light-amplifying semiconductor element according to the third embodiment of the present invention. As clearly seen from FIG. 10A, this element comprises an n type InP substrate 181, an n-type InP buffer layer 182 formed on the substrate 181, an n-type InGaAsP etching-stop layer 183 formed on the buffer layer 182, an n-type InP cladding layer 184 formed on the etching-stop layer 183, an InGaAs active layer 185 formed on the cladding layer 184, and a p-type InP cladding layer 186 formed on the active layer 185. The light-amplifying element further comprises a p-type InGaAsP contact layer 187 formed on the p-type InP cladding layer 186, an electrode 188 formed on the p-type contact layer 187, and an electrode 189 formed on the n-type substrate 181. A window 190 is formed in the substrate 181 and the buffer layer 182, exposing a portion of the etching-stop layer 183. The window 190 is so provided to receive input light. The contact layer 187 has a window for outputting light. A semitransparent reflective coating 191 having a reflectance $R_1$ is formed on that portion of the cladding layer 186 which is exposed through the window of the contact layer 187. Also, a semi-transparent reflective coating 192 having a reflectance $R_2$ is formed on the inner surface of the window 190 and the exposed portion of the etching-stop layer 183. Here, $R_1 > R_2$.

Figure 10B:
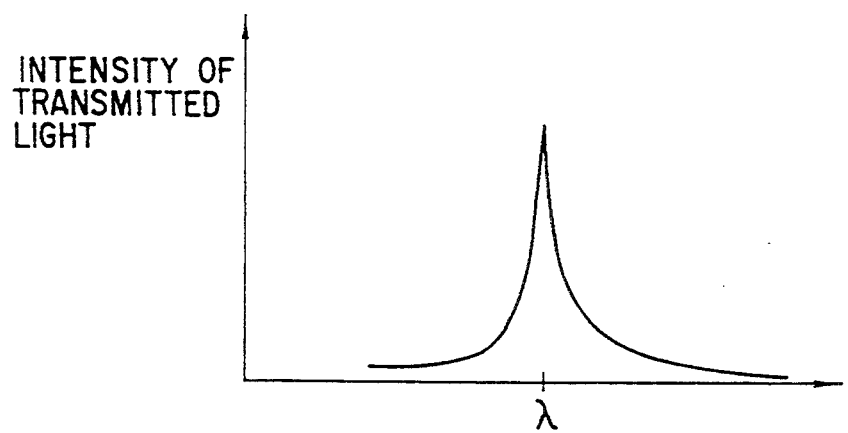
FIG. 10B is a graph representing the light-transmitting characteristic of the element shown in FIG. 10A.

FIG. 10B represents the light-transmitting characteristic of the surface light-amplifying semiconductor element shown in FIG. 10A. The element is a multiple reflecting filter and, therefore, has a sharp light-transmitting characteristic curve. Since it is a surface device, its resonator length can be several micrometers. If the resonator length is on this order, the intervals of resonant waves can be relatively long, whereby the light-amplifying element can select waves having a specified wavelength, with high accuracy. Further, as has been indicated, the returning light can be reduced to nil by injecting carriers from the electrodes 188 an 189, thereby to change the gain g (i.e., the gain light acquires while passing only once through the resonator) such that $g = (R_1/R_2)^{\frac{1}{2}}$.

Assuming $R_1 = 0.9$ and $R_2 = 0.3$, then the gain g is 1.31 $(=(1/R_2)^{\frac{1}{2}})$, whereby the filter gain G will be as great as 12.

Figure 11A:
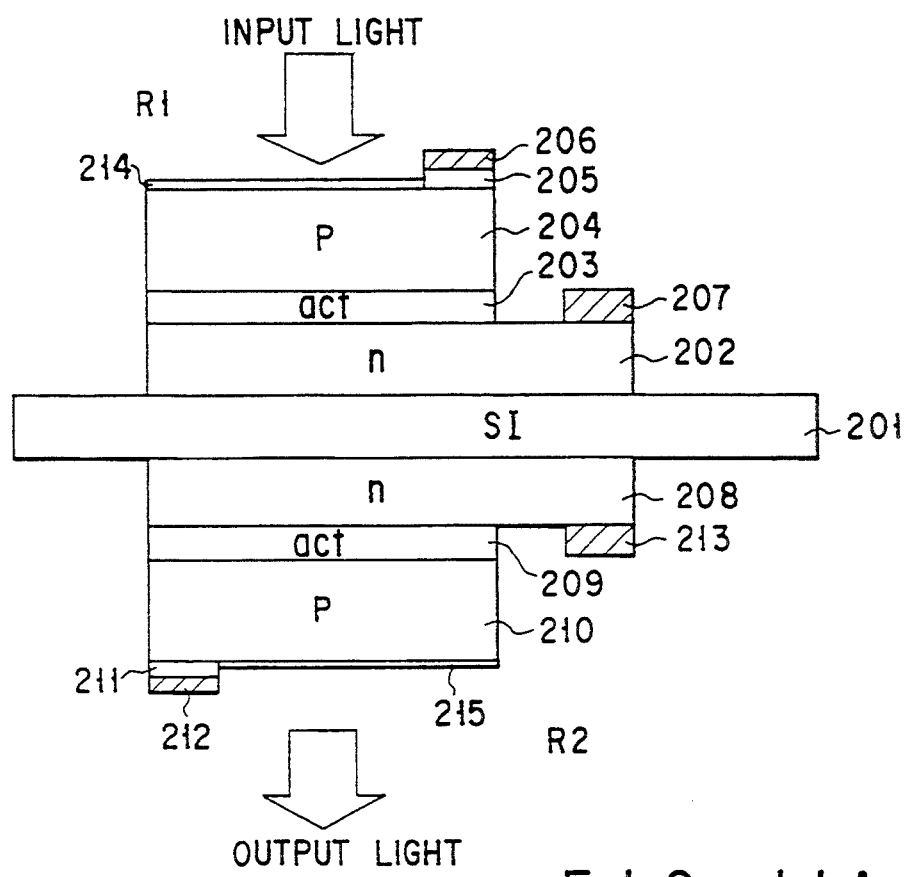
FIGS. 11A and 11B are diagrams schematically illustrating two modifications of the element shown in FIG. 10A, either having a mechanism for adjusting the resonator length.

FIG. 11A is a modification of the surface light-amplifying semiconductor element shown in FIG. 10A, which differs therefrom in that it has a mechanism for adjusting the resonator length. As shown in FIG. 11A, the modified light-amplifying element comprises a semi-insulating substrate 201, a n-type InP cladding layer 202 formed on the upper surface of the substrate 201, an InGaAs active layer 203 formed on the cladding layer 202 and having a thickness of 1.3 μm, a p-type InP cladding layer 204 formed on the active layer 203, a p-type InGaAsP contact layer 205 formed on the cladding layer 204, a p-side electrode 206 formed on the contact layer 205, and an n-side electrode 107 formed on the cladding layer 202.

The modified light-amplifying element further comprises an n-type InP cladding layer 208 formed on the lower surface of the substrate 201, an InGaAs active layer 209 formed on the cladding layer 208 and having a thickness of 1.1 μm, a p-type InP cladding layer 210 formed on the active layer 209, a p-type InGaAsP contact layer 211 formed on the cladding layer 210, a p-side electrode 212 formed on the contact layer 211, and an n-side electrode 113 formed on the cladding layer 208. Further, two semi-transparent reflective coatings 214 and 215 are formed on the cladding layers 204 and 210, respectively. The coatings 214 and 215 have reflectances $R_1$ and $R_2$ ($R_1 > R_2$).

The surface light-amplifying semiconductor element shown in FIG. 11A is characterized in that it has two active layers 203 and 209, and that carrier injection into these active layers can be controlled independently. Assuming that the incident light has a wavelength of about 1.3 μm, the active layer 203 can amplify the light, but the active layer 209 cannot. Thus, when the ratio of the number of carriers injected into the layer 203 to that of carriers injected into the layer 209, and the ratio of the rate of injecting carriers into the layer 203 and that of injecting carriers into the layer 209 are changed, the active layer 203 controls the gain of the light-amplifying element by virtue of plasma effect, whereas both active layers 203 and 209 simultaneously control the optical path length of the element. In other words, when the input light varies in its wavelength, it suffices to change the carrier-number ratio and said carrier-injecting ratio between the active layers 203 and 209, in order to suppress the returning light and ultimately to maintain the gain of the resonator at a great value.

As described above, the filter gain G can be maximal. When the injection current is varied to change the optical length 1 n to an integral multiple of λ/2, from Equation (3) we can obtain the following:

$$G = \frac{(1 - R_1)(1 - R_2)}{(1 + R_1)^2} \sqrt{\frac{R_1}{R_2}} < 1 \quad (8)$$

Hence, the element shown in FIG. 11A can be used as a filter having a switching function.

Figure 11B:
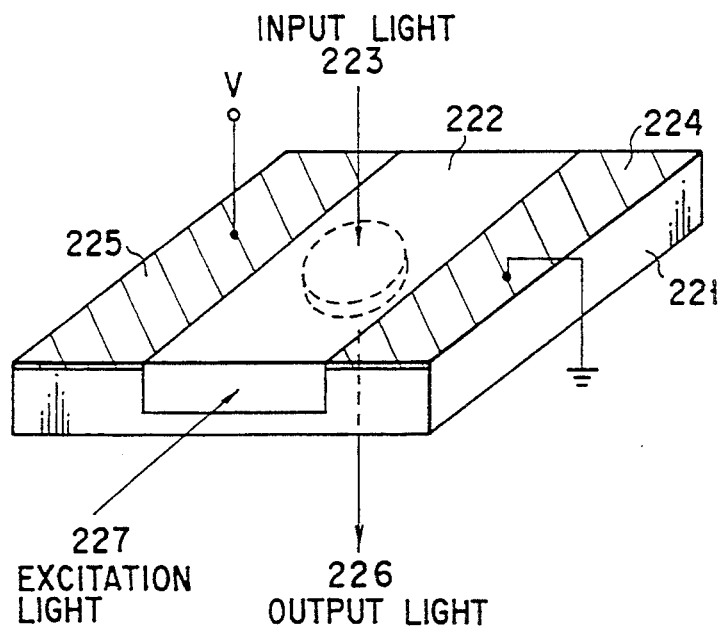

FIG. 11B illustrates another modification of the light-amplifying semiconductor element shown in FIG. 10A, which differs therefrom in that it has a mechanism for adjusting the resonator length. As shown in FIG. 11B, this modified surface light-amplifying semiconductor element comprises a substrate 221 having photoelectric effect, an active layer 222 formed on the upper surface of the substrate 221, and two electrodes 223 and 224 formed on the upper surface of the active layer 222. The thickness of the active layer 222 is an integral multiple of half the wavelength of input light 223. The electrode 224 is connected to the ground. A voltage V is applied to the electrode 225. A window is made in the lower surface of the substrate 221, exposing the lower surface of the active layer 222. It is through this window that output light 226 is emitted. The active layer 222 is excited with excitation light 227 applied to it.

When the input light 223 varies in its wavelength, the voltage V applied to the electrode 225 is changed, thereby adjusting the reflectance of the active layer 222 by virtue of the photoelectric effect of the substrate 221. The resonator length of the element can thereby be changed appropriately. As a result, the semiconductor element can continues to suppress the returning light effectively and have a large resonator gain even after the input light has varied in terms of wavelength. To use this semiconductor element as an optical interconnecting element, it suffices to amount a light-emitting element or a light-receiving element on a portion of the substrate 221.

As has been described, the third embodiment of the present invention can provide optical semiconductor elements which performs multiple reflection on the input light and which can therefore select light having a specified wavelength and amplify the light, without reflecting light.

Fourth Embodiment

The fourth embodiment of the present invention relates to a surface light-amplifying semiconductor element (an optical interconnecting element) for use in an optical interconnection device, and more particularly to an element whose light-amplification factor little changes with the wavelength of the input light.

As has been indicated, there are two modes of amplification by stimulated emission which takes place in a light-amplifying element, i.e., travelling wave amplification and multiple amplification. In the travelling wave amplification, the input light is amplified only once as is illustrated in FIGS. 8B and 8D. In the multiple amplification, the input light is repeatedly reflected and amplified by a resonator, as is shown in FIGS. 8C, 8E and 8F.

Assuming that the resonator length remains unchanged, there should be no phase difference between the light waves before multiple amplification and the light waves after multiple amplification, or the difference, if any, should be an integral multiple of the wavelength of the light, so that the light waves may have a maximum amplitude by means of multiple amplification. This is represented as follows:

$$2L \cdot n_{eff} = i \cdot \lambda i \quad (9)$$

where
- $\lambda$: the wavelength of the incident light
- $n_{eff}$: the average refractive index of the medium
- $i$: an integer The resonance wavelength $\lambda m$ takes one of such discrete values as shown in FIG. 8E. The ratio of the amplification factor $A_1$ for the resonance wave length to that $A_0$ for the neighboring non-resonance wavelength is given as follows, provided $A_0 < A_1$:

$$A_1/A_0 = 1/\{1-\exp(2L' \cdot g) \cdot R_1 R_2\} \quad (10)$$

where
- $R_1$: reflectance of the input side
- $R_2$: reflectance of the output side
- $g$: actual gain of the medium
- $L'$: thickness of the active layer In a conventional propagating wave amplifying element, the light passes through the gain medium only once, the optical path cannot be long, and the gain is inevitably small. Since the gain medium used has a large refractive index in most cases, the reflectance is great at both the input side and the output side. The gain for the resonance wavelength and the gain for the non-resonance wavelength are, therefore, likely to have a prominent difference. Consequently, the amplification factor will greatly change with the wavelength of the input light. The reflectance $R_1$ or the reflectance $R_2$, or both are decreased, thereby making $A_1/A_0$ approach 1. Since carriers are injected into the gain medium in a density not so high as to cause laser oscillation, thereby increasing the gain, the propagating wave amplifying element is inferior to the multiple reflecting filter (FIG. 8C) in view of power efficiency. Furthermore, with the propagating wave filter it is difficult to such complex coat non-reflective films as to reflect no light, for the purpose of suppressing the reflected light.

The conventional multiple light-amplifying element has a long optical path even if the layer of the gain medium layer is thin, since the input light passes through the gain medium back and forth many times. Thus, the filter can be made small and can have a high power efficiency. However, its gain sharply decreases for non-resonance wavelengths, the amplified light (i.e., the output light) greatly varies in intensity with a slight deviation of the input wavelength from the resonance wavelength. It is therefore necessary to control the input wavelength with high accuracy. For this reason and some others, most conventional light-amplifying semiconductor elements are of travelling wave amplification type.

The fourth embodiment of the invention provide a surface light-amplifying semiconductor element which is free of the problems with the conventional semiconductor elements, which needs not control the input wavelength with high accuracy if provided in the form of a multiple light-amplifying element, which has a high operating efficiency and a low power consumption. More specifically, this semiconductor element has a light-amplifying layer which defines an effective resonator length spatially continuous in a plane, and has a continuous resonance wavelength.

Figure 12:
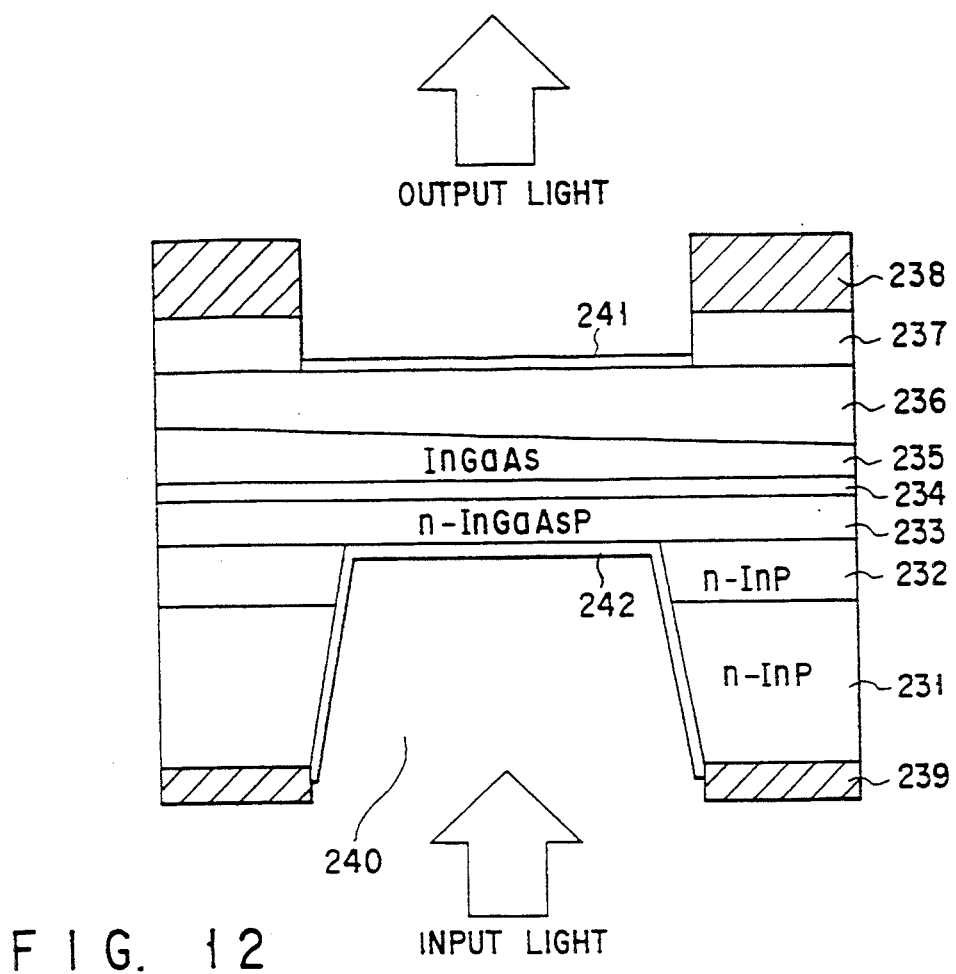
FIG. 12 is a sectional side view of a surface light-amplifying element according to the fourth embodiment of the invention.

FIG. 12 shows a surface light-amplifying element according to the fourth embodiment of the invention. As shown in FIG. 12, the element comprises an n-type InP substrate 231, an n-type InP buffer layer 232 formed on the upper surface of the substrate 231, an n-type In-GaAsP etching stop layer 233 formed on the buffer layer 232, an n-type InP cladding layer 234 formed on the layer 233, an InGaAs active layer 235 formed on the cladding layer 234, and a p-type InP cladding layer 236 formed on the active layer 235. The active layer 235 has an inclined upper surface and a thickness of 1.3 to 1.35 μm. A p-type InGaAsP contact layer 236 is formed on the p-type InP cladding layer 236. A p-side electrode 238 is formed on the contact layer 236, and an n-side electrode 239 is formed on the lower surface of the substrate 231. A window 240 is made in the substrate 231 and the buffer layer 232, opening at the lower surface of the substrate 231 and exposing a part of the etching stop layer 233 at the lower surface. It is through this window 349 that input light is applied to the element. The contact layer 237 has an opening, through which output light is emitted and the cladding layer 236 is partly exposed. A semi-transparent, non-reflective coating 241 is formed on the exposed part of the cladding layer 236. Also, a semi-transparent, non-reflective coating 242 is formed on on the inner surface of the window 240

When light having a wavelength k is applied at right angles to the active layer 235, it will be reflected an indefinite number of times, provided that the element has a constant resonator length were the element not a surface light-amplifying element, its width W would be only a few micrometers, far less than the resonator length L, and the angle 8 (hereinafter called "reflection angle") at which the reflector is inclined to allow neighboring resonance wavelengths to exist together spatially over the width W would be as large as a several radians. In this case, the light would be output at a large angle would propagate along a path after multiple-reflected, much deviated from the path along which the light travels before multiple reflection. Hence, the light could not multiple-reflected unless its wavelength is of the resonance wavelength.

The light-amplifying element shown in FIG. 12 is a surface one having a width W of hundreds of micrometers or more. Thus, even if the resonator length varies about 0.2 μm, the reflection angle ν is about $10^{-3}$ radians. Hence, any light that has a wavelength shorter than the resonator length can be multiple-reflected. To state in another word, as long as the resonator length falls within the range from L to L+ΔL (ΔL: difference of a resonator length corresponding to the neighbor resonance mode), any light having a wave length within this range can acquire a resonance gain $A_1$, not non-resonance gain $A_0$.

Figure 13A:
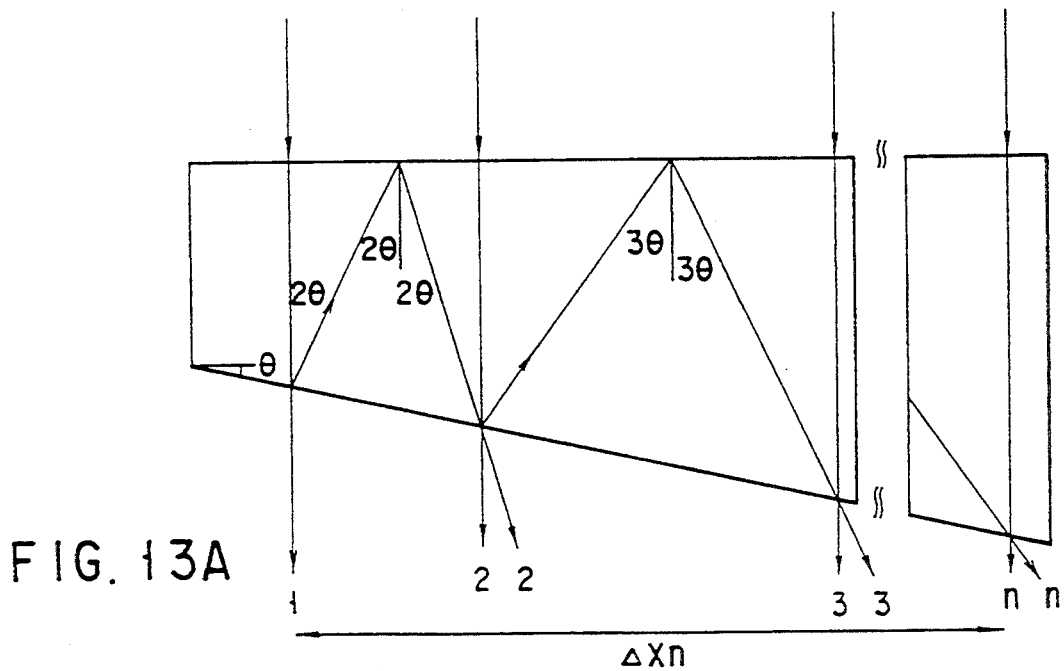
FIGS. 13A to 13C and FIGS. 14A to 14G are diagrams for explaining the operating principles of the light-amplifying element shown in FIG. 12.
Figure 13B:
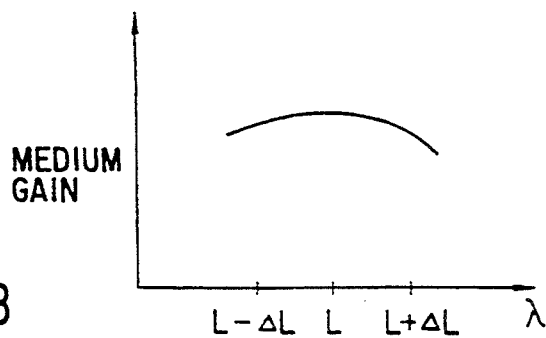
Figure 13C:
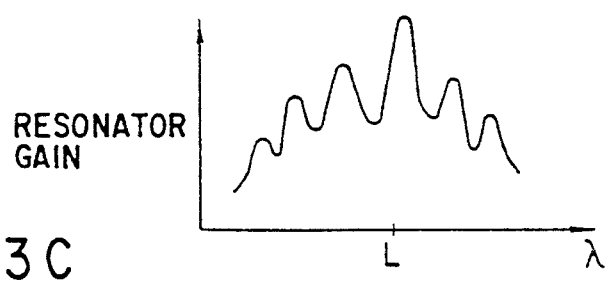

Assuming L=1.30 μm, ΔL=0.2 μm, the width W of the light-receiving surface=200 μm, then the reflection angle θ (see FIG. 13A) is $10^{-3}$ radian. The angle at which the path of light n reflected n times inclines to the path of light (n) directly applied to the element is $n^2\theta^2 n_{eff}L$ or less. This angle is equivalent to a wavelength deviation of only $10^{-1}$ even if the light n has been reflected 100 times. Since the positional shift $\Delta x_n$ of the light n is almost nil, multiple reflection is quite possible. In this multiple reflection mechanism, input light having a wavelength λ(L<λ<L+ΔL) will have resonance wavelength and be amplified with resonance amplification factor $A_1$ at any one position in the plane, and will be amplified with a non-resonance amplification factor $A_0$ at any other position.

Figure 14A:
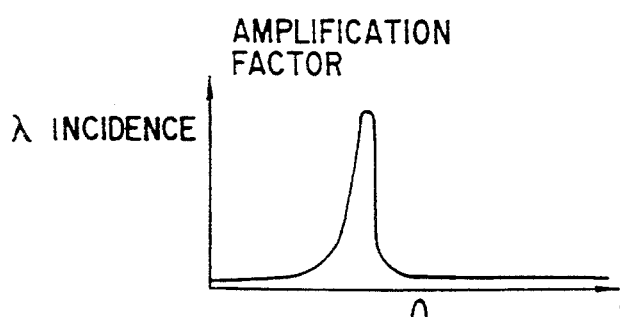

Namely, as shown in FIG. 14A, the position x where the light is greatly amplified shifts only a little after its wavelength changes. The light output from the entire light-emitting surface of the element does not change virtually at all, unlike in the structure having a fixed resonator length. Since the input light is amplified with resonance amplification factor $A_1$ at any one position in the plane, the output light is more intense than in a light-amplifying element wherein the input light is amplified with a non-resonance amplification factor $A_0$ at any position in the plane.

Figure 14B:
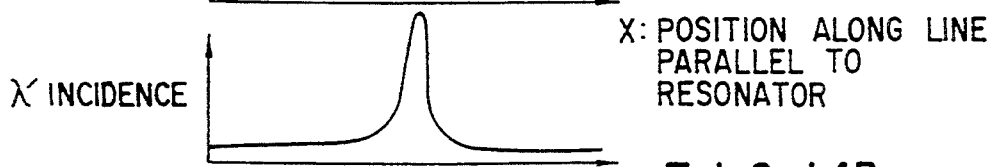
Figure 14C:
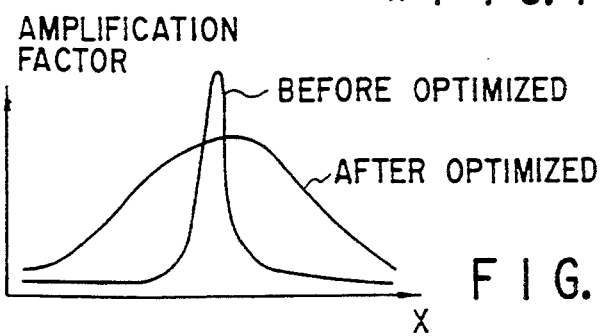
Figure 14D:
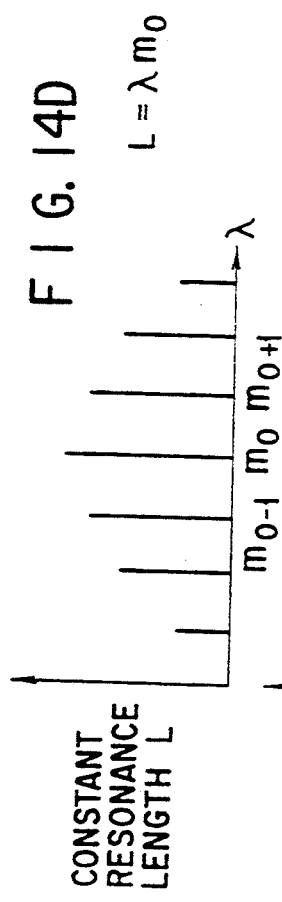
Figure 14E:
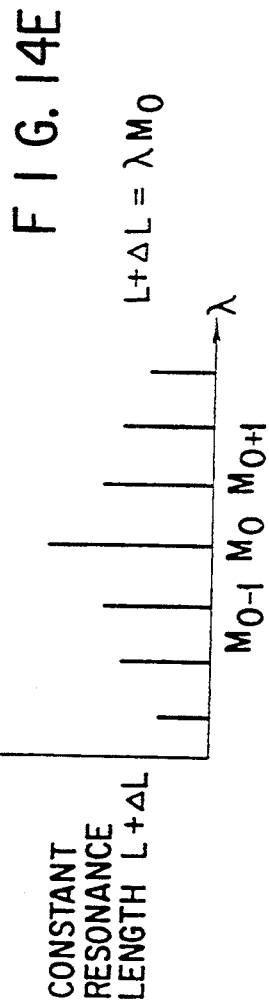
Figure 14F:
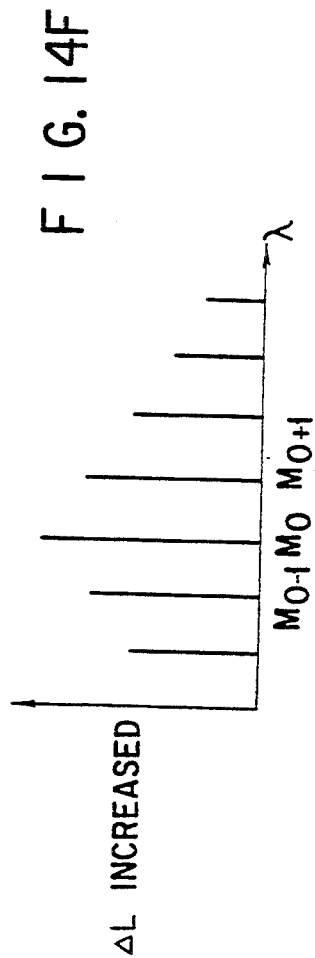
Figure 14G:
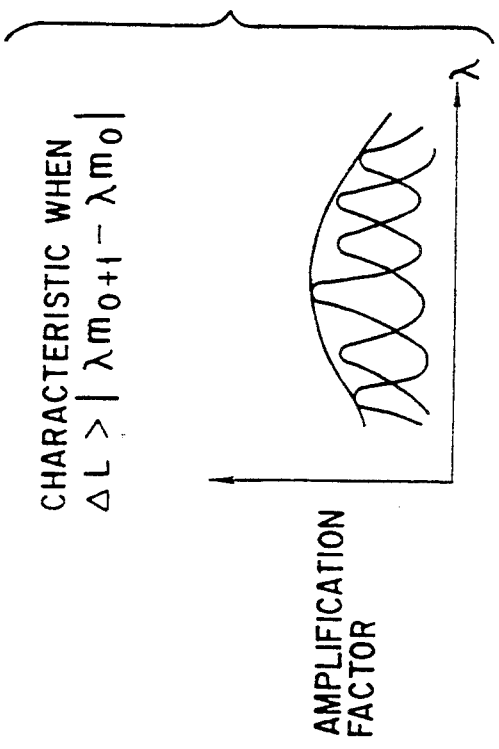

The reflection angle θ can be changed by changing values are changed for L, ΔL, and W. When the angle θ is changed to about 1 radian, n (i.e., the number of times the input light can be re reflected) decreases, and the positional shift $\Delta x_n$ which occurs after multiplex reflection increases. As a result, as shown in FIG. 14B, the value Q ($A_1/A_0$) of the resonator decreases, and the amplification factor at any non-resonance position increases. The diameter of the beam of light increases as the light is resonated. The amplification factor at the entire surface of the element may be optimized in order to increase the diameter of the light beam. A resonator having a length L and a resonance wavelength λm (m=0, 1, 2, 3) amplifies input light having the wavelength λm more than light of any other wavelength. Similarly, a resonator having a length L+ΔL and a resonance wavelength λM' (M'=0, 1, 2, 3) amplifies input light having the wavelength λM more than light of any other wavelength. L=λm0 for m0, and L+ΔL=λM0 for M0. When ΔL is much less than L, m0=M0. As ΔL is gradually increased from 0 as shown in FIG. 14C, L+ΔL will be:

L+ΔL=λM0=λm+1

In other words, ΔL=0, which is the initial state. Thus, the element can have an amplification factor which gently change over a broad range of input wavelengths as illustrated in FIG. 14C, provided that ΔL is greater than the difference between Δm0+1 and Δm0, i.e., Δm0+1−Δm0.

In the light-amplifying element shown in FIG. 12, the thickness of the active layer 235 and that of the p-type InP cladding layer 236 are adjusted, thereby accomplishing continuous variation of the resonator length. Alternatively, the thickness of only one of the layers 235 and 236 may be changed for this purpose. The resonator length may be distributed in the plane in a different manner. For instance, the resonator length may be changed in the radial direction of the plane so that the plane may function as a focusing lens or a diverging lens.

Figure 15A:
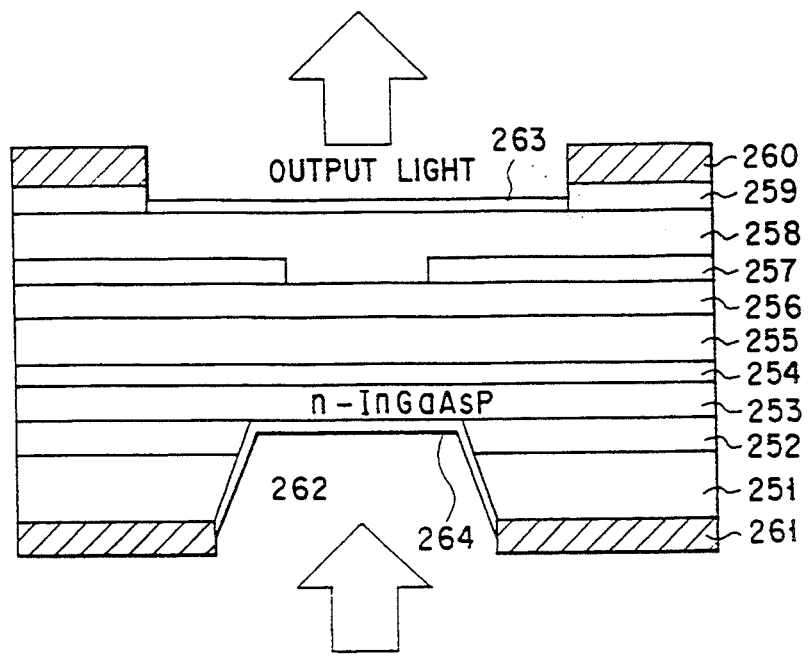
FIG. 15A is a sectional view of a modification of the element shown in FIG. 12.

FIG. 15A shows a modification of the surface light-amplifying semiconductor element illustrated in FIG. 12. The modified element is characterized in that the effective resonator length is varied in a plane by means of carrier injection.

As can be understood from FIG. 15A, this light-amplifying element comprises an n-type InP substrate 251, an n-type InP buffer layer 252 formed on the upper surface of the substrate 251, an n-type InGaAsP etching stop layer 253 formed on the buffer layer 252, an n-type InP cladding layer 254 formed on the etching stop layer 253, an InGaAs active layer 255 formed on the cladding layer 254, a p-type InP current-blocking layer 256 formed on the active layer 255, and an n-type InP current-blocking layer 257 formed on the layer 256. The layer 257 has an opening formed by etching and reaching a part of the layer 256. A p-type InP cladding layer 258 is formed on the current-blocking layer 257, filling the opening thereof. A p-type InGaAsP contact layer 259 having an opening is formed on the cladding layer 258, exposing a part of the cladding layer 256. A p-side electrode 260 is formed on the contact layer 259, and an n-side electrode 261 is formed on the lower surface of the substrate 251. A window 262 is made in the substrate 251 and the buffer layer 252, opening at the lower surface of the substrate 251 and exposing a part of the etching stop layer 253 at the lower surface. It is through this window 262 that input light is applied to the element. The output light is emitted through the opening of the contact layer 259. A semi-transparent, non-reflective coating 263 is formed on the exposed part of the cladding layer 256. Also, a semi-transparent, non-reflective coating 264 is formed on on the inner surface of the window 262.

Figure 15B:
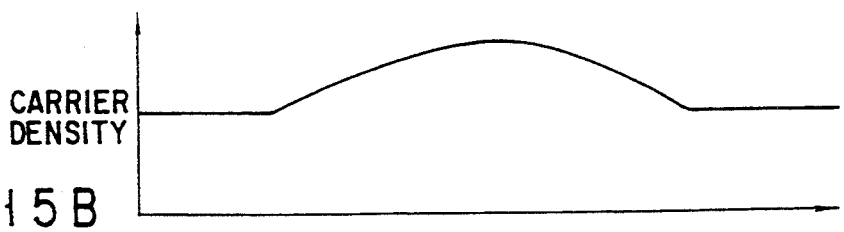
FIG. 15B tO 15D are diagrams illustrating the characteristics of the modified light-amplifying element shown in FIG. 15A.
Figure 15C:
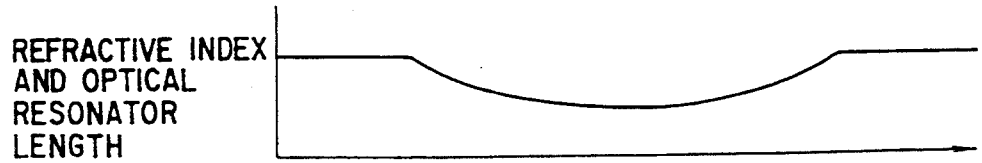
Figure 15D:
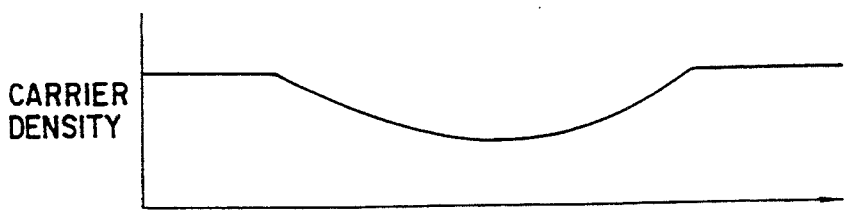

When carriers are injected from one electrode, the active layer 255 has a convex carrier-density profile at its center portion, as is illustrated in FIG. 15B. By virtue of plasma effect, the refractive index is maximum at the center of the surface, gradually decreasing toward the edge, as is shown in FIG. 15C. Also, the effective resonator length gradually decreases from the center toward the edge of the surface. That is, the distribution of the resonance wavelength is continuous in a plane. As a result, even if the wavelength of the input light changes, the light is multiple-reflected, whereby the changes in the amplification factor are small. Furthermore, the carriers may be injected in a different manner such that the active layer 255 has a concave carrier-density profile at its center portion, as is shown in FIG. 15D. In this case, as well, the resonance wavelength is distributed continuously in the plane.

The light-amplifying elements shown in FIGS. 12 and 15A, both according the fourth embodiment of the present invention, have a resonator which can multiple-reflect the input light having a wavelength falling within a specific range. Hence, they have a large light-amplification factor and can operate reliably despite changes in the the wavelength of the input light.

The element according to the fourth embodiment is resonant to input light having a certain wavelength at one position in the plane. At this position the light is amplified with the resonance amplification factor $A_1$, and at any other position in the plane it is amplified with the non-resonance amplification factor $A_0$. When the wavelength of the input light changes, the element is resonant to the new wavelength at a different position in the plane, and at this position the light is amplified with the resonance amplification factor $A_1$, and at any other position in the plane it is amplified with the non-resonance amplification factor $A_0$. Thus, the element amplifies the input light with the resonance amplification factor $A_1$, regardless of the wavelength of the light. The light output from the entire light emitting surface does not change almost at all, unlike with a light-amplifying element which has a fixed resonator length. The light-amplifying semiconductor element according to the fourth embodiment whose light-amplification factor little changes with the the wavelength of the input light, and which has a high operating efficiency, which excels in integration density.

Fifth Embodiment

The fifth embodiment of the invention relates to a semiconductor laser amplifier (an optical interconnecting element) for use in an optical interconnection device.

Research and development of semiconductor laser amplifiers began with the structure of the Fabry-Perot resonator. Soon propagating-wave semiconductor laser amplifiers were improved in various properties such as signal gain, gain band-width, gain saturation and noise reduction. Only one type of a laser amplifier has been put to practical use, which is about 100 μm long and emits light from one end. Surface semiconductor laser amplifiers, which receive light propagating at right angles to their substrate, have not yet been used in practice. The most prominent reason is that a surface semiconductor laser amplifier has but a short active region and fails to obtain a sufficient gain. To operate in propagating-wave mode, a surface semiconductor laser amplifier must have an active layer having a thickness of at least tens of micrometers. The existing epitaxial grow techniques cannot form such a thick active layer. At present it is difficult to form a practical light waveguide.

The fifth embodiment of the invention is a surface emitting semiconductor laser amplifier which has a thin active layer but can can obtain a sufficient gain and which can operate in propagating-wave mode. This laser amplifier is characterized in that the input light is applied to the substrate in a direction inclined thereto and repeatedly passed through the active layer while reflected several times by reflectors, thereby to obtain a sufficient gain.

Figure 16A:
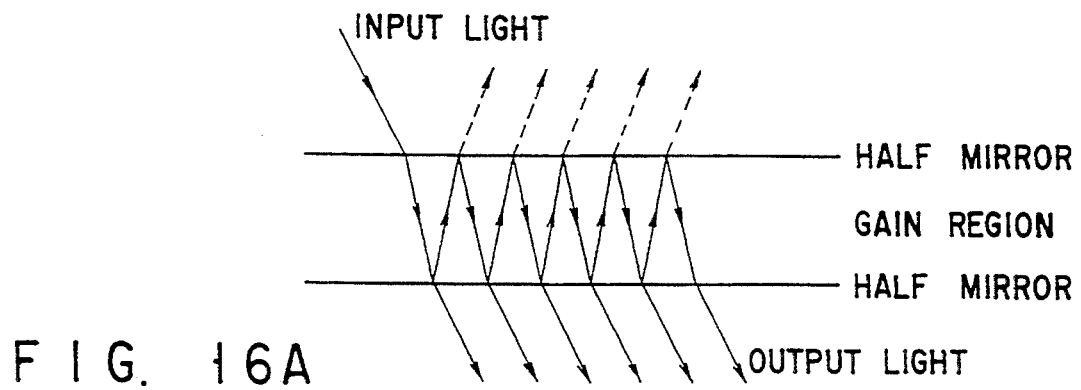
FIGS. 16A and 16B are diagrams for illustrating the operating principles of a surface semiconductor laser amplifier which is a fifth embodiment of the present invention.
Figure 16B:
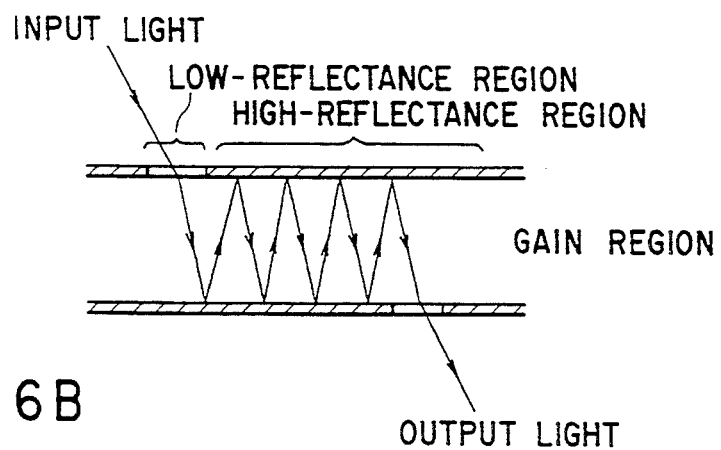

The operating principles of the surface emitting semiconductor laser amplifier will be explained, with reference to FIGS. 16A and 16B. As shown in FIG. 16A, the input light applied to the upper surface of the active layer is amplified while reflected in the active layer several times between the half mirrors sandwiching the active layer. The light, thus amplified, is output from the lower surface of the active layer. Alternatively, as shown in FIG. 16B, the input light is applied to the active layer through a low-reflectance region on the upper surface of the active layer, amplified while reflected in the active layer several times between the high-reflectance regions sandwiching the active layer, and output from the low-reflectance region on the lower surface of the active layer. The light-amplifying structure of FIGS. 16A and 16B may be combined. The structure of FIG. 16A, the structure of FIG. 16B, or the combination of these can be utilized. Each alternative structure can operate in propagating-wave mode since the input light is made to pass several times through the active layer.

Figure 17:
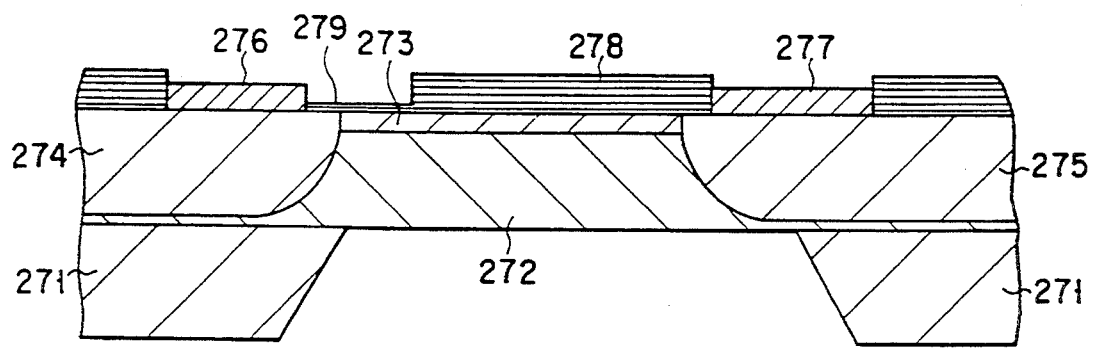
FIG. 17 is a sectional view of the laser amplifier according to the fifth embodiment of the invention.

FIG. 17 schematically shows a surface semiconductor laser amplifier according to the fifth embodiment of the invention. This is an InGaAsP-type laser amplifier having an InP substrate. It should be noted that the fifth embodiment can be applied to other types of surface semiconductor laser amplifiers.

As shown in FIG. 17, the surface semiconductor laser amplifier comprises a semi-insulating InP substrate 271, an undoped InGaAsP active layer 272 formed on the substrate 271 and having an emission wavelength of 1.3 μm, an undoped InP window layer 273 formed on the active layer 272, a p-type InP layer 274 formed in the surface of the active layer 272, and an n-type Inp layer 275 formed in the surface of the active layer 272. A p-side electrode 276 and an n-side electrode 277 are formed on the p-type InP layer 274 and the n-type InP layer 275, respectively, for injecting carriers into the layers 274 and 275. A multi-layered high-reflectance film 278 made of $SiO_2/Si$ is formed partly on the n-type InP layer 275 and partly on a portion of the undoped InP window layer 273. A low-reflectance film 279 made of $SiO_2$ is formed partly on the n-type InP layer 275 and partly on a portion of the undoped InP window layer 273.

Figure 18A:
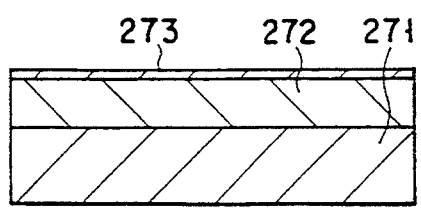
FIGS. 18A to 18G are sectional views, explaining how to manufacture the laser amplifier of FIG. 17.
Figure 18B:
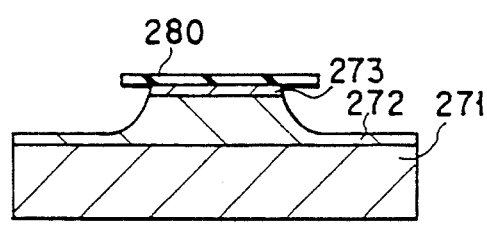

A method of manufacturing the semiconductor laser amplifier (FIG. 17) will be described, with reference to FIGS. 18A to 18G. First, as shown in FIG. 18A, the undoped InGaAsP active layer 272 having an emission wavelength of 1.3 μm and a thickness of 5 μm is formed on the semi-insulating InP substrate 271 by means of metal organic chemical vapor-deposition (MOCVD). Next, the undoped InP window layer 273 having a thickness of 0.1 μm is formed on the active layer 272 by crystal growth. Then, as shown in FIG. 18B, a mesa having a depth of 4 μm and extending in <001> direction is formed, by using an $SiO_2$ film 280 as a selective etching mask.

Figure 18C:
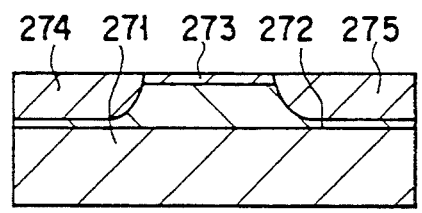
Figure 18D:
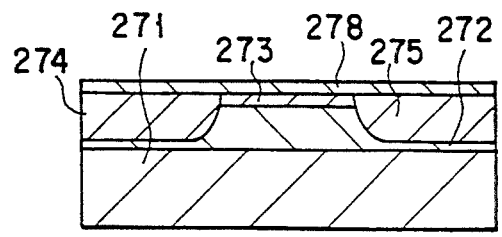

Next, as shown in FIG. 18C, the n-type InP layer 275 ($n = 5 \times 10^{17}$ cm$^{-3}$, thickness: 4 μm) is formed on the the active layer 272 by means of the MOCVD method. Zinc is diffused into a portion of the layer 275 by selective diffusion, thereby forming the p-type InP layer 274 ($p = 5 \times 10^{18}$ cm$^{-3}$, thickness: 4 μm). Then, as is shown in FIG. 18D, the high-reflectance $SiO_2/Si$ film 278 is formed partly on the window layer 273 and the layers 274 and 275.

Figure 18E:
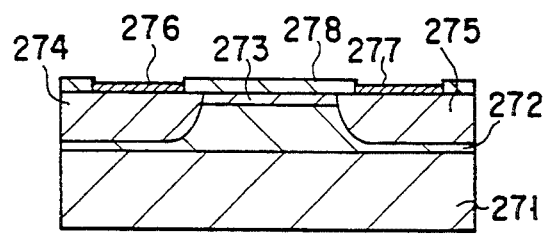
Figure 18F:
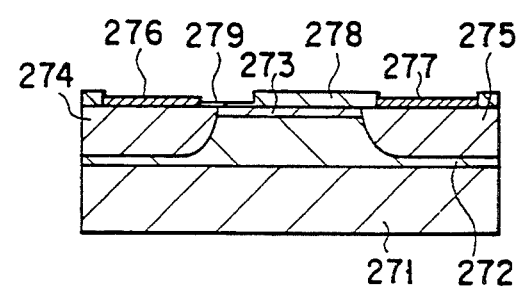
Figure 18G:
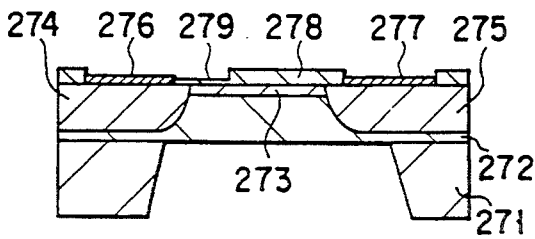

Thereafter, as shown in FIG. 18E, two openings are formed in the high-reflectance $SiO_2/Si$ film 278, exposing parts of the layers 274 and 275. The p-side electrode 276 and the n-side electrode 277 are formed on the exposed parts of the layers 274 and 275, respectively, by means of lift-off process. Next, as shown in FIG. 18F, the light-receiving portion of the multi-layered high-reflectance film 278 is removed, except for the first layer which is made of $SiO_2$. As shown in FIG. 18G, an opening is made in the substrate 271 from the lower surface thereof by means of etching, thereby obtaining the structure shown in FIG. 17. Needless to say, the high-reflectance film 278 can be made of materials other than $SiO_2/Si$.

The light applied obliquely to the surface emitting semiconductor laser amplifier thus manufactured is repeatedly reflected in the active layer 272, until it is sufficiently amplified and emitted through the window formed in the substrate 271. Hence, the laser amplifier has a long effective optical path and can have a large gain.

It can, therefore, operate in the travelling-wave mode.

Two modifications of the laser amplifier shown in FIG. 17, which can amplify light applied at right angles to their substrates, will be described with reference to FIGS. 19A and 19B.

Figure 19A:
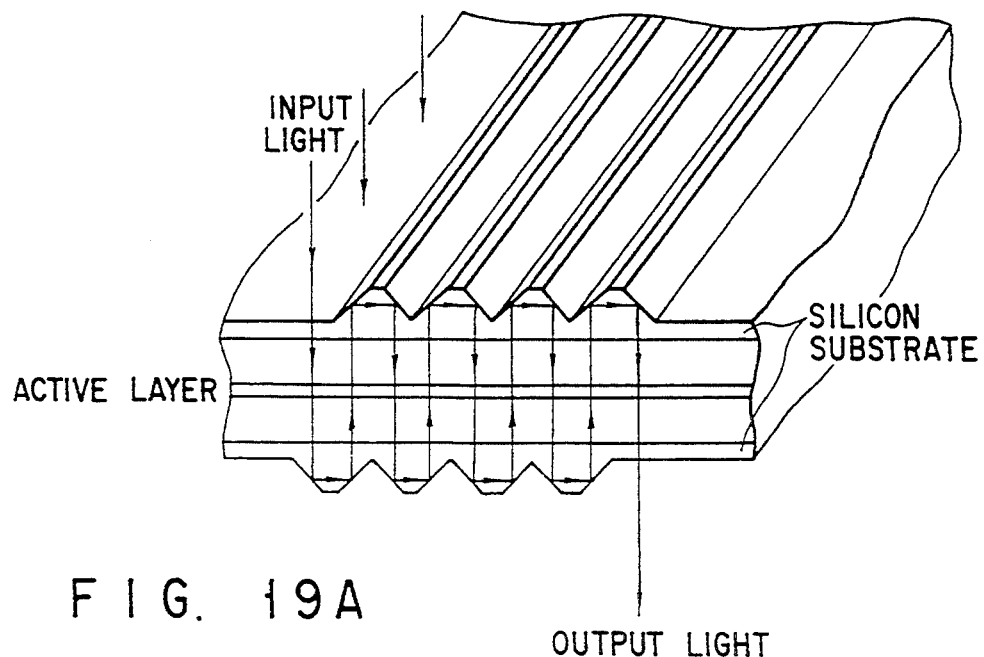
FIGS. 19A and 19B are diagrams showing two modifications of the surface semiconductor laser amplifier shown in FIG. 17.

The modified laser amplifier of FIG. 19A is characterized in that two silicon layers are adhered to the upper and lower surfaces of the semiconductor substrate (including an active layer), respectively, and that a number of parallel v-grooves are formed in each silicon layer by anisotropic etching, thus forming prisms. Since silicon has a refractive index greater than 2, each prism need not have an apex angle of 90°, but its both sides must be inclined at the same angle. The prisms formed of the upper silicon layer are staggered with respect to those formed of the lower silicon layer, by half the pitch of the prisms. This positional requirement can be attained with high precision by the existing lithography technique.

The light applied perpendicular to the substrate of the laser amplifier of FIG. 19A is reflected several times in the active layer and therefore amplified sufficiently. In other words, this laser amplifier can have a sufficient gain, as well, and can operate in the travelling-wave mode. It can effectively amplify a one-dimensional array of beams applied perpendicular to its substrate.

The prisms may be formed by processing both surfaces of a semiconductor substrate, instead of etching silicon layers adhered directly to the major surfaces of a silicon substrate. Still alternatively, prisms made of quartz or the like may be bonded to the surfaces of the substrate.

Figure 19B:
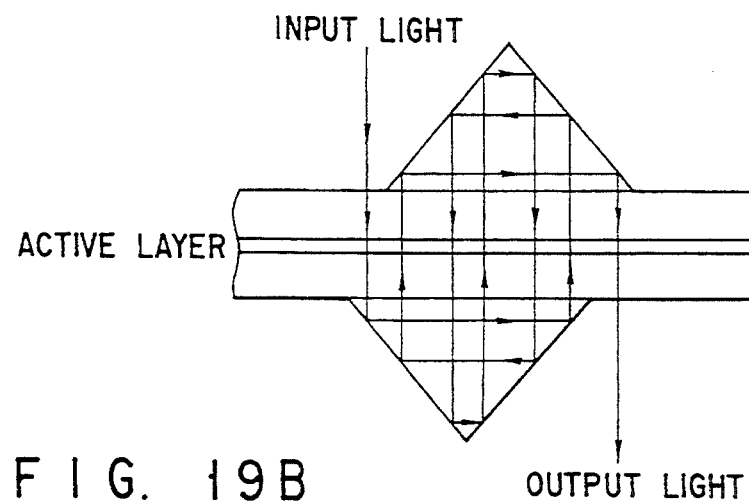

The modified laser amplifier of FIG. 19B is characterized in that two large prisms are mounted on the upper and lower surfaces of the substrate, respectively. These prisms are staggered with respect to each other, such that the light applied perpendicular to the substrate is repeatedly reflected between the prisms. Hence, this laser amplifier can have a large gain, like the laser amplifier shown in FIG. 19A.

In the surface emitting semiconductor laser amplifiers according to the fifth embodiment of the present invention, the incident light is reflected several times in the active layer, thus passing along a bending path within the active layer, and is therefore amplified sufficiently. That is, the laser amplifiers have a large gain and can operate in the propagating-wave mode.

Sixth Embodiment

The sixth embodiment of the invention relates to an optical film comprising a portion having high reflectance and a portion having low reflectance, which is suitable for use in an optical device, such as an optical interconnection device, which needs films having different reflectances.

Optical devices such as lasers has various types of optical films having different reflectances. Generally, the optical films having different reflectances and incorporated in an optical device are formed independently —that is, in separate steps. The method of manufacturing the optical device is therefore complicated. In manufacturing, for example, a surface emitting semiconductor light-emitting device, not only it is necessary to form regions having different reflectances in separate steps, but also is it difficult to position these regions with high precision.

The gist of the sixth embodiment is to form an optical film consisting of portions which have different reflectances and which can be precisely positioned with respect to one another, and to set these portions at desirable predetermined reflectances.

The optical film according to the sixth embodiment is one of the following two types:

(1) A film consisting of portions which differ in the number of layers forming each
(2) A film consisting of portions made of different materials or having different thicknesses The optical film of the first type can be formed in two methods. The first method is to form a multilayered film is formed and then to remove some of the layers constituting any selected portion of the optical film. The second method is to form a layer and then to form a desired number of additional layers on any selected portion of the first layer.

The optical film of the second type can be formed in two methods. The first method is to prepare a substrate having an undulating surface, whereby the surface portions are inclined at different angles to the direction in which the fill-forming material is applied. The second method is to form an optical film on a substrate and expose those portions of the film which have been formed at a reaction speed different from the reaction speed at which the remaining portions have been formed. Thus, each convex portion and each concave portion of the optical film differs from any other portions either in forming speed or in material. Influenced by the forming speed or material of the convex and concave portions, the neighboring portions also differ in forming speed or material from the portions remote from the convex and concave portions.

Alternatively, to form an optical film of the second type, a substrate which has portions different in forming speed from the other portions may be utilized. When the film-forming material is applied to the substrate, no optical film will be formed on said portions of the substrate, or those portions of the resultant film which lie on said portions of the substrate will differ in material from those formed on the other portions of the substrate. In this case, too, the portions of the optical film near the portions different in forming speed or material differ in material from the remote portions, influenced by the forming speed or material of the portions different in forming speed or material.

In the sixth embodiment, an optical film can be formed whose regions having different reflectances have a desired positional relationship. Since these regions are formed in one and the same step, it is easy to manufacture the optical film.

Particularly, the optical film of the first type can have regions whose reflectances are precisely controlled to the design values, since the film is formed on a flat substrate. Further, the film of the first type can have regions each having a specific reflectance determined by the number of layers it is formed of, provided that two kinds of layers are used, having such a refractive index and such a thickness that (refractive index)×(thickness)=λ/4, where λ is the wave length of the input light.

Any region of the optical film can have its reflectance increased to become a low-reflectance region, only if it is made of material having a refractive index approximately equal to the square of the product of the refractive index of the substrate and that of the light-transmitting medium used and if it is formed to such a thickness as would satisfy the relation of (refractive index)×(thickness)=λ/4. More precisely, the film having low-reflectance regions is formed by preparing a multi-layered film consisting of layers having different refractive indices and then by removing selected portions of all layers, but the lowermost one, thereby forming low-reflectance regions. This method is advantageous in two respects. First, it can facilitates the positioning of the low-reflectance regions and the high-reflectance regions. Second, the low-reflectance regions and the high-reflectance can be formed simultaneously in a single step.

The optical film of the second type have low-reflectance regions and high-reflectance regions since the portions differ from one another in thickness and refractive index. The film may be formed by processing a multi-layered film consisting of layers made of at least two different materials. If only one layer has portions formed at far slower speed than any other portions and lying on the convex and concave portions or of the underlying layer which differ from any other portions in material or lying on the portions of the underlying layer which are near the convex and concave portions, these portions have a reflectance much less than that of the other portions. These portions of the layer, therefore, serve as low-reflectance regions. Conversely, if these portions of the layer have been formed at far higher speed at portions than any other portions, they have a reflectance much greater than that of the other portions and, thus, serve as high-reflectance regions.

Figure 20A:
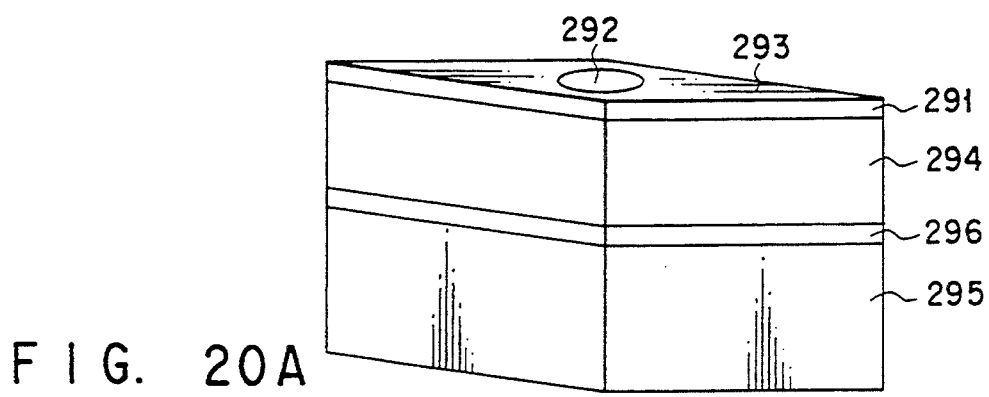
FIG. 20A is a perspective view illustrating a surface semiconductor laser according to a sixth embodiment of the invention.
Figure 20B:
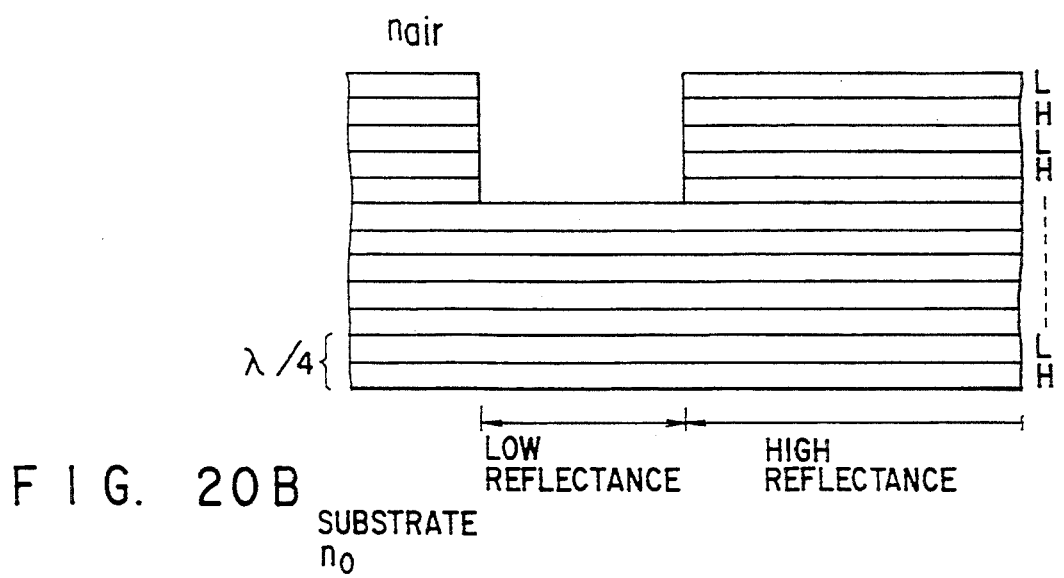
FIG. 20B is a sectional view showing the optical film used in the semiconductor laser of FIG. 20A.

FIG. 20A illustrates a surface semiconductor laser according to the sixth embodiment of the invention, and FIG. 20B shows the optical film incorporated in the semiconductor laser.

As shown in FIG. 20A, the surface emitting semiconductor laser comprises a p-side high-reflectance reflector layer 291 having a high-reflectance region 292 and a low-reflectance region 293, a p-type cladding/current-injecting layer 294 formed beneath the reflector layer 291, an n-type cladding layer 295 formed beneath the layer 294 and having a high reflectance, and an active layer 296 formed beneath the cladding layer 295.

As shown in FIG. 20B, the p-side high-reflectance reflector layer 291 consists of $SiO_2$ layers and Si layers which are alternately arranged. Each layer, either an $SiO_2$ layer or an Si layer, has a thickness and a refractive index the product of which is λ/4, where λ is the emission wavelength of 1.55 μm. More specifically, the low-reflectance region 293 comprises 3.5 pairs of layers, each pair consisting of one $SiO_2$ layer and one Si layer, and has a reflectance of about 98%. The high-reflectance region 292 has a diameter of 2 μm and comprises 6 pairs of layers, each pair consisting of one $SiO_2$ layer and one Si layer. It has a reflectance of about 99% or more. A laser beam is emitted almost exclusively from the high-reflectance region 292.

The p-side high-reflectance reflector layer 291 has been formed in the following method. Six pairs of $SiO_2$ and Si layers are formed, one upon another. Then, a circular resist is coated on the top layer. Using the resist as a mask, the upper 1.5 pairs of layers are etched away. Since resist patterning is performed only once in forming the reflector layer 291, the regions 292 and 293 have a positional relationship and sizes, which are much more precise than if they were formed independently in two steps. The high-reflectance region 292 may be elliptical, instead of circular. In this case, the semiconductor laser will emits a beam having an elliptical cross section. Since the resist patterning is performed with high precision, the laser beam has a desired size and shape.

Figure 21:
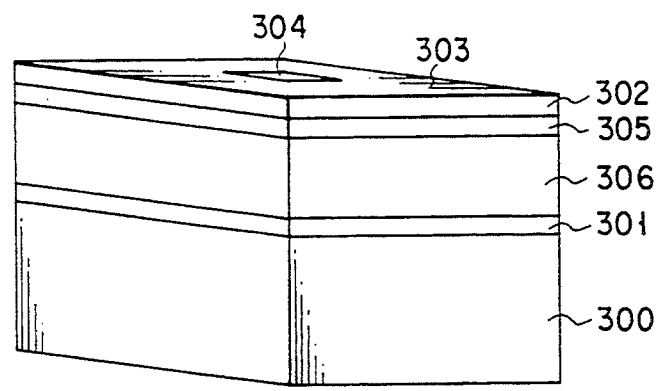
FIG. 21 is a perspective view showing a light-emitting diode according to the sixth embodiment of the invention, which comprises an optical film.

FIG. 21 schematically shows a light-emitting diode according to the sixth embodiment of the invention, which comprises an optical film. As shown in FIG. 21, the light-emitting diode comprises an AlGaAs substrate 300, a GaAs light-emitting layer 301 formed on the substrate 300, an AlGaAs cladding layer 306 formed on the active layer 301, a GaAs contact layer 305 formed on the cladding layer 306, and a mirror film 302 formed on the contact layer 305. The mirror film 302 has a high-reflectance region 303 and a low-reflectance region 304. The high-reflectance region 303 consists of seven $SiO_2$ layer and six Si layers, alternately arranged one upon another, with the lowermost $SiO_2$ layer formed on the GaAs contact layer 305 and with the uppermost $SiO_2$ exposed. Each Si layer has such a thickness and such a refractive index that the product of these is λ/4, where λ is approximately the emission wavelength of 840 nm. The uppermost $SiO_2$ layer, which is located farther from the contact layer 305 from any other layer of the film 302, has a thickness of about 10 nm. The high-reflectance region 303 has a reflectance of 99% or more. The thin uppermost layer is made of $SiO_2$ prevents the optical characteristic of the mirror film 302 from degrading even if the Si layers are oxidized.

The low-reflectance region 304 is formed in the following method. First, seven $SiO_2$ layers and six Si layers are alternately arranged, one upon another. Next, square portions of all these layers, but the lowermost $SiO_2$ formed on the contact layer 305, are removed. (Each of the square portions has sides 50 μm long.) Since $SiO_2$ has a refractive index less than those of the AlGaAs cladding layer 306 and the 0.03 μm-thick GaAs contact layer 305, the region 304 has a reflectance of as low as a few percent.

The upper surface of the contact layer 305, on which the mirror film 302 is formed, is flat. Thus, the thickness of the film 302 can be controlled well, and that of the low-reflectance region 304 can be controlled as well. The reflectances of both regions 303 and 304 can, therefore, be adjusted with accuracy. In addition, every layer of the mirror film 302 can be formed easily. Hence, the high-reflectance region 303 can have a reflectance of 99% or more, and the low-reflectance region 304 can have a reflectance of a few percent or less. Although the regions 303 and 304 are located close to each other, their reflectances differs more greatly than would differ if these regions were formed independently. Due to the great difference in reflectance between the regions 303 and 304, the light-emitting diode emits light from the low-reflectance region 304 only, without allowing for an optical energy leakage.

Figure 22A:
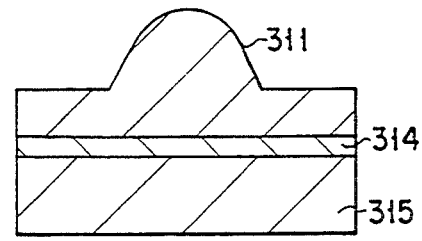
FIG. 22A is a sectional view of a light amplifier according to the sixth embodiment of the invention.
Figure 22B:
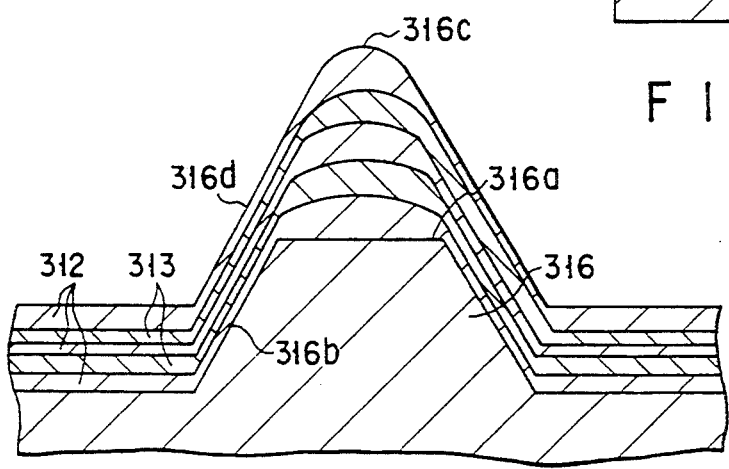
FIG. 22B is a sectional view of the optical film incorporated in the light amplifier of FIG. 22A.

FIG. 22A shows a light amplifier according to the sixth embodiment of the invention. As can be seen from this figure, the light amplifier comprises a light-receiving layer 315 having a low reflectance, a light-amplifying region 314 formed on the layer 315, and a light-emitting layer 311. FIG. 22B is an enlarged sectional view of the active layer 311. As shown in FIG. 22B, the layer 311 comprises an InP substrate having a projection 316. The projection 316 has a flat top 316a and two sides 316b inclining at about 60° to the vertical line. On the InP substrate, 15 InP layers 312 and 14 GainAsP layers 313 are formed by MOCVD method and arranged alternately arranged, with the lowermost InP layer contacting the InP substrate and the uppermost InP layer exposed. The layers 312 and 313 have been formed several times faster on the top 316a of the projection 316 than on the inclining sides 316b thereof. That portion of each layer which lies on either inclining side 316b has a refractive index and a thickness, the product of which is $\frac{1}{4}$ of the wavelength (about 1.5 μm) of the light applied to the light-absorbing layer 315. The light-emitting region 311 has, therefore, a reflectance as high as 95% at either inclined side 316d. The top 316c of the layer 311 has a reflectance of only about 60% since that portion of each layer which lies on the top 316c has a refractive index and a thickness the product of which is not an odd-number multiple of of the wavelength (about 1.5 μm) of the light applied to the light-absorbing layer 315.

Since the top 316c of the projection 316 has a reflectance lower than the sides 316d of the projection 316, the light amplified in the light-amplifying region 314 is emitted from the top 316c only. In addition, since the light-emitting region 311 converges light more efficiently than it would without projection 316, the light amplifier can emit light more intense than the light-emitting diode of FIG. 21 which has a low-reflectance region (304), i.e. a thin portion of the flat mirror film 302.

The constituent layers of the light-emitting region 311 (i.e., an optical film), which have different reflectances, can be formed in the same the process. Despite its complex structure and its complicated shape, the region 311 can be formed easily with high reproducibility.

FIG. 23 illustrates a laser diode according to the sixth embodiment of the present invention. The diode laser comprises a hollow cylinder $SiO_2$ selective etching mask 321 and a multi-layered film 325. The etching mask 321 stands on a flat layer. The film 325 consists of AlGaAs layers 322 and GaAs layers 323 formed on the flat layer, covering the etching mask 321. Since GaAs does not precipitate on the mask 321, it is deposited faster inside the hollow cylindrical mask 321 than outside the mask 321. On the other hand, AlGaAs precipitates on the mask 321, it is deposited more slowly inside the mask 321 than outside. More precisely, the AlAs component of AlGaAs forms a precipitate 326 on the mask 321, while the GaAs component of AlGaAs flows into the hollow of the mask 321. As a result, layers 324 of almost GaAs only are formed in the hollow of the mask 321.

Outside the hollow cylindrical etching mask 321, the AlGaAs layers 322 and GaAs layers 323 are formed such that product of the thickness and refractive index of each layer equals λ/4, where λ is the emission wavelength of the laser diode. Inside the etching mask 321, the thick layers 324, whose main component is GaAs, are formed. The multi-layered film 325 consisting of the layers 322 and 323 formed outside the mask 321 has a high reflectance, whereas the multi-layered film comprising the thick layers 324 formed inside the mask 321 has a reflectance as low as that of a single GaAs film.

The laser diode further comprises a thin Au electrode 327 and an active layer 328 formed beneath the flat layer. The electrode 327 has been formed by vapor-depositing Au on the uppermost GaAs layer 323, without being exposed to air. Assuming the hollow cylindrical mask 321 has an outer diameter 3 μm and an inner diameter of 2 μm, the mask 321 has a reflectance of about 0.9 at its outer periphery and a reflectance of about 0.3 at its inner periphery. Hence, the light emitted from the active layer 328 does not leak into the film 325 formed outside the etching mask 321, and is ultimately emitted through only the layers 324 formed inside the mask 321.

The optical film used in the laser diode (FIG. 23) has a specific reflectance distribution as it is formed by means of selective growth, and is covered with the Au electrode 327 the moment it is formed. The film is not oxidized as in the case where ordinary etching is applied to it, and therefore has very stable properties.

Each layer 322 and each layer 323 may be respectively made of $SiO_2$ and Si, GainAsP and InP, or GaAs and AlGaAs. Alternatively, they may be made of chemical semiconductors such as ZnSe, ZnS, GaInP and AlGaP, insulating materials such as $Al_2O_3$, hafnium oxide, titanium oxide, $BaF_2$ and BaSe, or any other materials which falls within the scope and spirit of the present invention.

The optical film according to the invention is not limited to those for use the semiconductor diode, the laser and the amplifier—all described above. It can be of any type which serves to control optical constants such as light transmittance and reflectance.

In the sixth embodiment, an optical film having different optical constants at various portions can be formed easily and precisely. The optical film maintain is properties in spite of its aging (e.g., oxidation), and can therefore remains reliable over a long use. Furthermore, since the optical constants can be minutely adjusted during while the film is being formed. If incorporated in a semiconductor integrated optical device which needs to have precise optical constants, the optical film can enhance the operating efficiency of the optical device.

Seventh Embodiment

The seventh embodiment of the invention relates to a surface optical semiconductor element which has a good frequency characteristic and generates little dark current or little surface leak current, without being used in combination with a light-converting element such as a lens. This optical semiconductor element can be manufactured at low cost and help to reduce the price of a system incorporating it. Further, it may be used in large numbers, forming a large-scale array having a relatively simple structure.

An optical semiconductor element designed for use in combination with a light-converting element such as a lens will have problems if not used in combination with a light-converting element. The problems will be explained in the following.

FIG. 24 is a sectional view showing a so-called "surface light-receiving element," which is a typical example of the conventional surface light-receiving element. As is shown in FIG. 24, this element comprises an n-type InP substrate 331, a light-absorbing layer 332 formed on the substrate 331, an n-type InP layer 333 formed on the light-absorbing layer 332 and having an opening, a silicon nitride (SiNx) film 334 formed on the InP layer 333 and having an opening, a p-type diffusion region 335 formed on that portion of the layer 332 which is exposed through the openings of the InP layer 333 and the SiNx film 334, a non-reflective coating 336a formed on the p-type diffusion region 335, a non-reflective coating 336b formed mainly on the SiNx film 334 and partly on the p-type diffusion region 335, an electrode 337 formed in contact with the p-type diffusion region 335, and an electrode 338 formed on the lower surface of the substrate 331. The light-absorbing layer 332 is made of low-concentration GaInAs. The SiNx film 334 is used as a diffusion mask and a passivation film. Both non-reflective coatings 336a and 336b are made of SiNx or the like.

The p-type diffusion region 335 is relatively small, forming a small pn junction. Being small, the pn junction has a small capacitance. Therefore, the electrical response of the light-receiving element does not decrease. The ends of the pn junction are formed in the n-type InP layer 333 which has a broad forbidden band, thereby prevented a localized tunnel current from flowing. Since the layer 333 is covered with the SiNx film 334 which functions as a passivation film, the layer 333 is stabilized and no current flows in the surface of the layer 333.

When a reverse bias is applied to this surface light-receiving element, an active light-receiving region 339 (i.e., a carrier-depleted region), to which an electric field is applied, is formed in the element. In this region 339, an electric field drift is applied on the generated carriers, and a light-absorbing current is quickly generated. In a region (i.e., a non-depletion region) outside the region 339, virtually no electric field is applied, and no electric field drift is applied on the generated carriers. As a result, the generated carriers behave relatively slowly; they diffuse, re-combined, or dissipate. When light is applied to the non-depletion region, a current (i.e., diffusion current) is generated rather slowly. Thus, the light-receiving element of FIG. 24 has a response characteristic when used in combination with a light-converting element such as a lens and another response characteristic when not used in combination therewith.

This fact will be explained, with reference to FIGS. 25A, 25B, and 25C.

As shown in FIG. 25A, a lens 342 collects the light emitted from a light-transmitting medium 341 and applies the light onto the active light-receiving region 339 of the light-receiving element. In this case, most of the light is incident on the region 339, and a current is generated from the light due to an electric field drift. The response characteristic of the element remains flat, as indicated by a curve 343 in FIG. 25C, until the frequency reaches a cut-off frequency determined by carrier speed or parasitic capacitance.

When the light from the light-transmitting medium 341 is directly applied to the element, it is applied mainly onto the active light-receiving region 339 as shown in FIG. 25B, and partly onto the non-depletion region. In this case, as indicated by a curve 344 in FIG. 25C, an AC-like output current is small at relatively low frequencies, though a DC-like output current remains flat until the frequency reaches the cut-off value as indicated by a curve 343 in FIG. 25C. Consequently, the high-frequency output current will have a value corresponding to the light incident on the region 339 only.

To prevent the application of light to the non-depletion region, the active light-receiving region 339 may be enlarged to have a diameter larger than that of the incident light beam. If the region 339 is enlarged so, however, the parasitic capacitance of the pn junction will increase, lowering the cut-off frequency and, hence, the response of the light-receiving element. Therefore, the light-receiving element shown in FIG. 24 must be used in combination with a lens for focusing the incident light onto the relatively small region 339, so that the region 339 need not be enlarged and the cut-off frequency may not decrease.

As indicated above, the conventional light-receiving element shown in FIG. 24 requires the assistance of a light-converting element even in the case where the light transmission distance between the element and the next light-receiving element is short and the light-receiving efficiency decreases but only a little. The necessary use of the light-converting element prevents a cost reduction of the optical interconnection device incorporating the conventional light-receiving element. Also does it makes it difficult to manufacture a large-scale array of identical light-receiving elements of this type.

Figure 26:
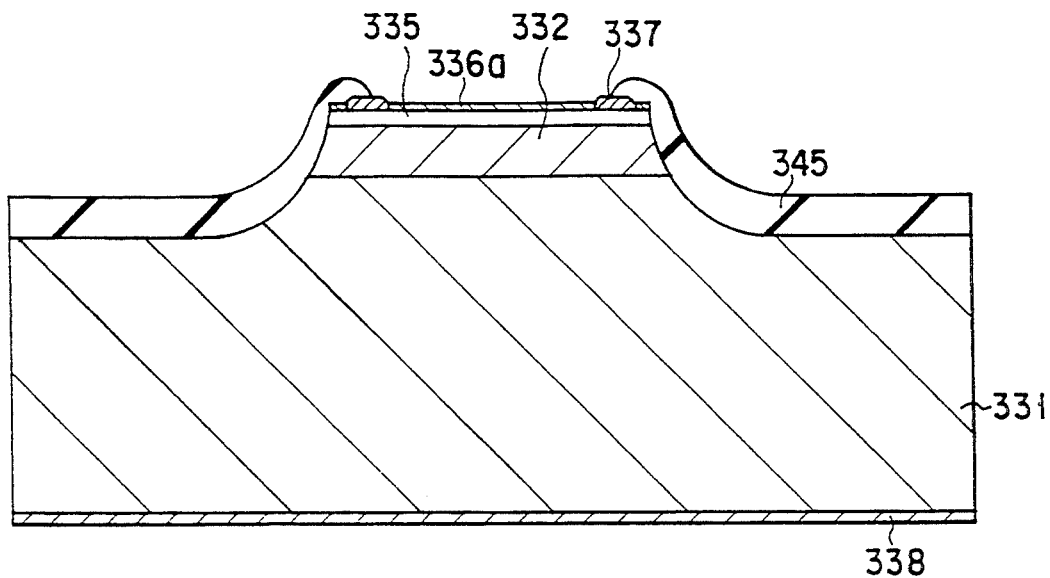
FIG. 26 is a sectional view illustrating another conventional light-receiving element.

In order to solve the problem with the light-receiving element shown in FIG. 24, a so-called mesa-structured light-receiving element illustrated in FIG. 26 has been proposed. As shown in FIG. 26, the mesa-structured light-receiving element is characterized in two respects. First, it has a mesa-shaped active light-receiving region 339 which is comprised of a light-absorbing layer 332 and a p-type diffusion region 335 formed on the entire surface of the layer 332 and which has been formed by, for example, chemical etching. Second, a passivation film 345 made of high-molecular compounded materials such as polyimide is formed, protecting the sides of the mesa-shaped region 339.

Since the light-absorbing layer 332 is depleted (or applied with an electric field) in its entirety, all generated carriers in it are subjected to an electric field drift. Hence, a so-called diffusion current is not generated in the light-absorbing layer 332. The mesa-structured light-receiving element therefore can easily acquire a flat frequency-response characteristic. Thanks to this frequency-response characteristic, the element can adopts the optical interconnecting scheme illustrated in FIG. 25B in which it need not be used in combination of a light-converting element, provided that the decrease in light-receiving efficiency is negligibly small.

In the conventional light-receiving element shown in FIG. 26, however, the dark current may greatly change, depending on the etched surface condition and/or the condition of the passivation film 345. This is because a magnetic field is applied directly to the sides of the mesa-shaped region 339. The mesa-structured light-receiving element inevitably has unstable characteristics, and its characteristics are hard to reproduce. Consequently, this light-receiving element cannot be manufactured at high yield, and cannot operate reliably over a long period of time. To be specific, the light-absorbing layer 332 made of GaInAs is oxidized in part after the mesa-etching of the layer 332 and diffusion region 335 if it has contacted water during the etching process of forming the mesa-shaped active light-receiving region 339. That part of the layer 332, thus oxidized, determines a surface level.

Further, if dust sticks to the sides of the mesa-shaped active light-receiving region 339, the electric field will concentrate on the sides of the region 339, possibly causing a local breakdown of the element. To prevent this local breakdown, the sides of the mesa-shaped region 339 must be kept very clean and dry until the process of forming the passivation film 345. It is difficult, however, to keep the sides of the region 339 clean and dry during the manufacture of the light-receiving element. Inevitably, the mesa-structured light-receiving element shown in FIG. 26 has a dark current level higher than that of the surface element shown in FIG. 24 by one or two orders of magnitude. Even if the passivation film 345 is formed in a relatively good condition on the sides of the mesa-shaped region 339, it may be broken, increasing the possibility of tunnel-current generation and surface-recombination excitation and lowering breakdown voltage to a value less than the breakdown voltage of a surface light-receiving element. A tunnel current, surface-recombination center excitation, and a low breakdown voltage not only narrow the range of operation voltage for the mesa-structured light-receiving element, but also deteriorates the light-receiving element. Furthermore, when the input light power is great, the mesa-shaped region 399 comes to have a high surface level, generating a surface current. The surface current, thus generated, will increase the dark current, which may likely increase noise.

The surface access type optical semiconductor element according to the seventh embodiment of the invention is characterized in two respects. First, the active region for emitting light and the non-active region surround the active region constitute an integral mesa. Second, a light-shielding mask is used for preventing light from illuminating the non-active region. More precisely, the non-active region has such a width that a depletion layer does not reach the sides of the mesa while the element is operating, and that the light absorbing layer is narrowed as much as possible.

In the element according to the seventh embodiment, an electric field is not directly applied to the side of the mesa since the non-active region surrounds the active region. In addition, the light-absorbing layer is smaller than if it were not one of the components of the mesa. Hence, the light-absorbing layer cooperates with the light-shielding mask to reduce the diffusion current. The surface access type optical semiconductor element can, therefore, achieve both the advantage of the conventional surface access type light-receiving element (FIG. 24) and the advantage of the conventional mesa-structured light-receiving element (FIG. 26). It need not be used in combination with a light-converting element and can have good frequency characteristic.

To manufacture the surface optical semiconductor element according to the seventh embodiment, it suffices to add only one step (i.e., the step of forming the light-shielding film) to the method of manufacturing the conventional elements. Despite the additional step, the assembling the element into an optical interconnection device is far simpler than in the case where it is incorporated into the interconnection device together with a light-converting element. Further, when two or more elements are arranged close to each other, each is not affected by the diffusion current generated by any adjacent element since its active region is mesa-shaped. For the same reason, the element is not adversely influenced by the light dispersed from any adjacent element or the heat radiated therefrom. The elements are little interfered, optically or thermally, with one another. The signal crosstalk between the elements is thereby reduced. Hence, the elements according the seventh embodiment can be arranged in a high integration density.

Figure 27:
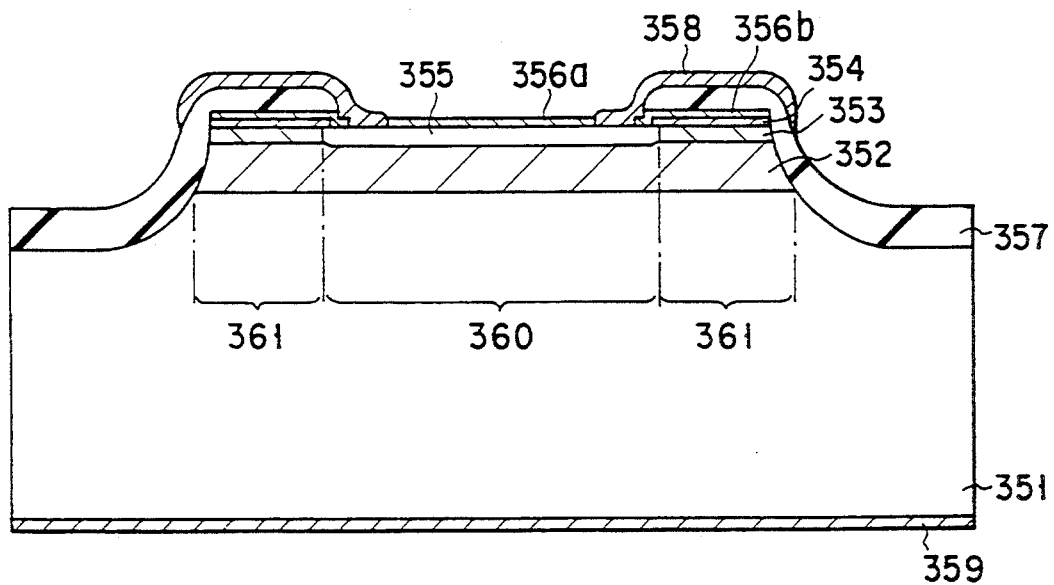
FIG. 27 is a sectional view of a surface light-receiving element according to a seventh embodiment of the present invention.

FIG. 27 illustrates a surface access type light-receiving element according to the seventh embodiment of the invention. As shown in FIG. 27, this light-receiving element comprises an n-type InP substrate 351, a GaInAs light-absorbing layer 352, formed on the upper surface of the substrate 351, an n-type InP window layer 353 formed on the layer 352 and having an opening, a silicon nitride film 354 formed on the window layer 353 and having an opening, a p-type InP diffusion region 355 formed on the layer 352, filling the opening of the window layer 353, a non-reflective coating 356a formed on the diffusion region 355, and a non-reflective coating 356b formed on the silicon nitride film 354. The element further comprises a dielectric (insulating) film 357 formed partly on the substrate 351, covering the substrate 351, the layers 352 and 353, the film 354 and the coating 356b, an electrode 358 formed partly on the coating 356b and partly on the diffusion region 355, and an electrode 359 formed on the lower surface of the substrate 351. The silicon nitride film 354 serves not only as an impurity-diffusing mask but also as a passivation film. The diffusion region 355 has been formed by thermally diffusing Zn, Cd, Mg or the like. The dielectric film 357 protects the upper surface of the element.

In this surface light-receiving element, the light-absorbing layer 352 and the p-type diffusion region 355 constitute an active region 360, and a non-active region 361 is formed, surrounding the active region 360. The active region 360 and the non-active region 361 form an integral mesa. The electrode 358 covers the top of the non-active region 361 and the upper parts of the sides thereof, thus functioning as a light-shielding mask for preventing light from reaching the non-active region 361.

If the non-active region 361 is broad, the parasitic capacitance between the electrode 358 and the n-type region is large. If the region 261 is narrow, the depletion layer extends to the sides of the mesa while the element is operating, and will be influenced by the surface recombination center or the like. The width of the non-active region 261 must therefore be determined by the operating speed and voltage of the surface access type light-receiving element. More specifically, the non-active region 361 should extend outwards longer than the depletion layer by a distance equal to or more than the thickness of the light-absorbing layer 352.

An n-type InP buffer layer may be interposed between the n-type InP substrate 351 and the light-absorbing layer 352. The dielectric film 357 is made of either high-molecular compounded material such as polyimide, or silicon nitride, in accordance with the designated use of the element. In the case where the dielectric film 357 is made thick to reduce the parasitic capacitance (to be described later), it is desirable that the film 357 be made of high-molecular compounded material such as polyimide. The electrode 358 can be a multi-layered Au/Pt/Ti electrode or a multi-layered Au/Cr electrode. The electrode 359 may be made of, for example, an AuGe alloy.

Having the structure specified above, the surface light-receiving element shown in FIG. 27 possesses the advantages of the conventional surface light-receiving element (FIG. 24) and the conventional mesa-structured light-receiving element (FIG. 26). It can have good frequency characteristic, not assisted by a light-converting element.

Surface light-receiving elements of the structure shown in FIG. 27 were made and tested or their electric and optical properties. These elements were designed to have an operating speed of 5 GHz. Hence, in view of the carrier motion time, the light-absorbing layer 352 must have a thickness of 3 μm or less. Thus, the thickness for the layer 352 was set at 3 μm so that the layer 352 might absorb a maximum amount of light. The density of the residual carrier in the layer 352 was $5 \times 10^{14}$ cm$^{-3}$. From this specific residual carrier density the bias voltage for causing the depletion layer to extend to the n-type InP substrate 351 was calculated to be about 3.5 V. The actual operating voltage must be relatively high in order to prevent influence of light-absorbing carriers on the internal magnetic field and to compensate the voltage drop across the electrodes. Therefore, the operating voltage was set at the value of 5 V. The maximum length the depletion layer can have at the operating voltage of 5 V is approximately 4 μm. It follows that no problems will arise if the distance between the p-type diffusion region 355 and the either side of the mesa (i.e., vertical inner surface of the dielectric film 357) was set at the value of 10 μm. Further, the electrode 358 was so formed as to define a light-receiving region having a diameter of 50 μm and the p-type diffusion region 355 was formed to have a diameter of 70 μm (hence, the pn Junction had a diameter of 70 μm, making a difference of 20 μm. The dielectric film 357 was a 1.5 μm-thick polyimide film.

The surface access type light-receiving elements thus made exhibited a parasitic capacitance of about 200 fF. The capacitance of the pn junction was about 160 fF, indicating a parasitic capacitance increase of about 25%. As a result of this, the cut-off frequency is calculated to be about 16 GHz for a load resistance of 50Ω. Even if the load resistance is set at 100Ω or more, the element can operate at a frequency of 5 GHz or more.

The surface access type light-receiving elements exhibited an emission efficiency of about 1A/W to light having a wavelength of 1.3 μm. When light was applied onto the light-receiving region only, the elements acquired sensitivity of at least 100 mv/mW at the load resistance of 100Ω. The output signal level obtained when light was applied from an optical fiber to the light-receiving region only differed from the output signal level recorded when light was applied from the same optical fiber to the light-receiving region and also to the neighboring region. Nevertheless, the surface access type light-receiving elements exhibited a flat frequency characteristic over low frequencies and high frequencies on the order of GHz. This teaches that the light did not irradiate the non-active region 361 (i.e., non-depletion region) at all and that almost all output current of the element was generated due to a drift of the electric field.

For comparison, surface light-receiving elements of the conventional type shown in FIG. 24 (pn-unction diameter: 70 μm), and mesa-structured light-receiving elements of the conventional type shown in FIG. 26 (mesa diameter: 70 μm) were made, using the same semiconductor wafer as used in manufacturing the test element identical to the surface light-receiving element shown in FIG. 27. The elements of these two types were tested for their properties. The surface element had but unstable frequency characteristic, and the mesa-structured element had a large dark current and a low breakdown voltage. In the surface elements, a dark current of 1 nA or less flowed at the reverse bias of 5 V. In the mesa-structured elements, a dark current of 2 to 20 nA flowed at the reverse bias of 5 V. The surface elements exhibited a breakdown voltage of 40 V or more, and the mesa-structured elements a breakdown of 15 to 20 V. The mesa-structured elements differ among themselves in terms of characteristics, though they were made on the same wafer. The unstable surface condition of the mesa seem to have affected the characteristic prominently.

By contrast, the element of the type in FIG. 27 had a dark current of about 1 nA at a reverse bias of 5 V and a breakdown voltage of about 50 V. In addition, it operated as reliably as the conventional surface element (FIG. 24).

The surface light-receiving element according to the seventh embodiment of the invention has characteristics similar to those of the conventional surface element. Further, it can have a flat frequency characteristic, without assistance of a light converting element such as a lens. In incorporated in an optical interconnection device, the surface element of the seventh embodiment serves to minimize the manufacturing cost of the interconnection device. Moreover, since the light-receiving elements of this type can easily coupled optically with one another, they can form a large-scale two-dimensional array. Still further, these elements do not interfere with one another since their active regions are mesa-shaped. This helps to increase the integration density of the two-dimensional array of the light-receiving elements.

Figure 28:
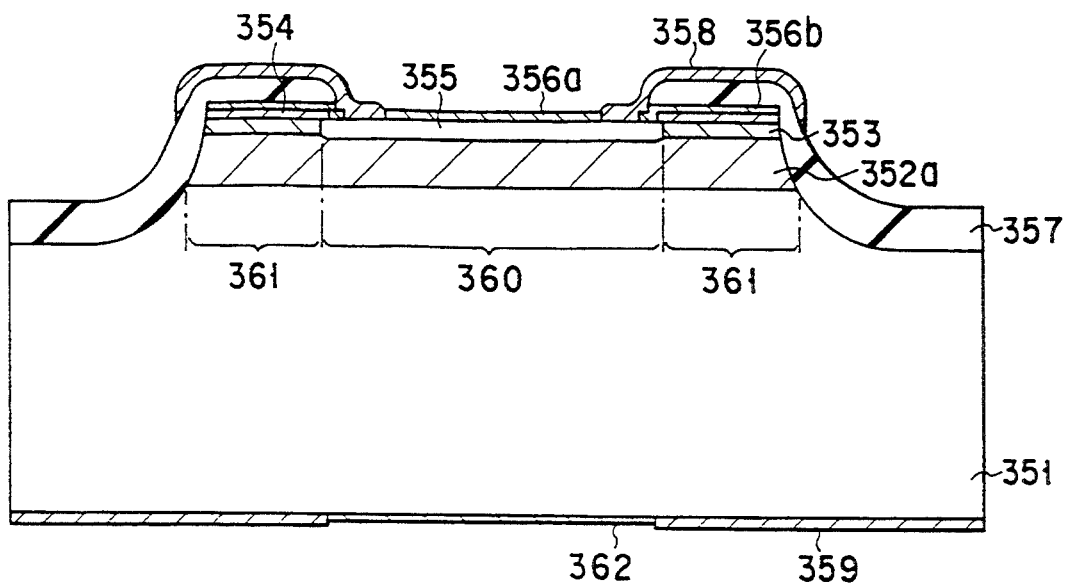
FIG. 28 is a sectional view of a surface gate element which is a modification of the element shown in FIG. 27.

FIG. 28 shows a modification of the surface access type optical semiconductor element shown in FIG. 27. The components of this element, which are identical to those shown in FIG. 27 are denoted at the identical reference numerals in FIG. 28 and will not described in detail.

The element shown in FIG. 28 is, more precisely, an optical gate element which can monitor optical signals. As shown in FIG. 28, the optical gate element comprises an n-type InP substrate 351 and a gate layer 352a formed on the substrate 351. The gate layer 352a is made of crystals with a band-gap wavelength slightly shorter than that of the input light. A light-transmitting window 362 is formed on the lower surface of the n-type InP substrate 351.

The optical gate element injects a current into the gate layer 352a, causing the layer 352a to transmit light, and deplete the gate layer 352a, causing the layer 352a to shut out light. Assuming that the element is designed for input light having a wavelength of 1.3 μm, the gate layer 352a is made of GaInAsP crystals having a band-gap wavelength of 1.35 μm and has a thickness of, for example, 2 μm.

To close the optical gate into a closed state, a reverse bias is applied to the element, thus operating the element in light-receiving mode. To open the optical gate, a forward bias is applied to the element, thereby injecting a current into the gate layer 352a, so that the element functions as a low-gain light amplifier. When no bias is applied to the element, the element remains in a closed state. In this condition, the element accumulates generated carriers as light is continuously supplied to the element. If the light is intense, the gain resulting from the recombination of the generated carriers increases to be equal to the light-absorption loss. The optical gate may no longer remain closed in some cases. To maintain the optical gate closed, a reverse bias is applied to the element, expelling the light-absorbing carriers out of the element. As the carriers are expelled from the element, the element can monitor the optical signals subsequently supplied to the element. In this state, however, the optical gate element acts exactly like a light-receiving element, inducing the problems described above.

In the optical gate element shown in FIG. 28, the active region 360 and the non-active region 316 constitute a mesa structure, and a part of the electrode 358 is extended outwards, thereby covering the upper surface and circumferential surface of the non-active region 361. Thus, the part of the electrode 358, thus extended, serves as a light-shielding mask for blocking the incident light. Therefore, the element of FIG. 28 can achieve the same advantage as does the element shown in FIG. 27 if it is operated in the light-receiving element.

A plurality of optical gate elements of the type shown in FIG. 28 can constitute a two-dimensional array. Such arrays may be mounted one upon another, thereby constituting an apparatus which can exchange optical signals and perform operations on signals. Since the element shown in FIG. 28 can monitor optical signals, it can be remote-controlled, either to receive signals in the light-blocking state or to transmit signals in the light-transmitting state.

Figure 29:
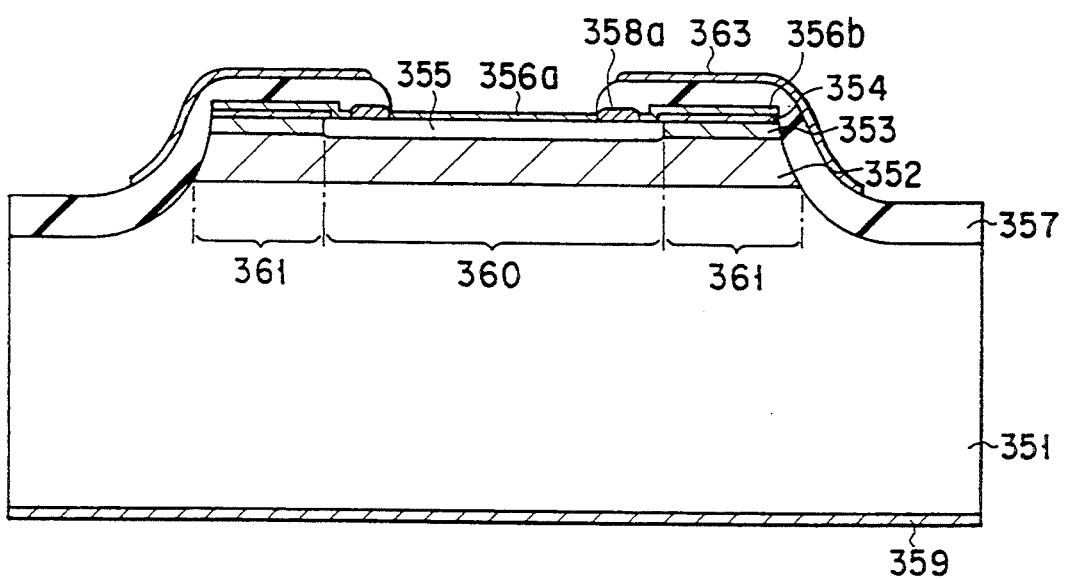
FIG. 29 is sectional view showing a surface light-receiving element which is another modification of the element shown in FIG. 27.

FIG. 29 shows another modification of the surface access type light-receiving element illustrated in FIG. 27. The components of this element, which are identical to those shown in FIG. 27 are designated at the identical reference numerals in FIG. 29 and will not described in detail.

In the element of FIG. 27, a part of the electrode 358 serves as a light-shielding mask. This modification has a light-shielding mask 363, which covers the top and sides of the non-active region 361 (i.e., the mesa). The light-shielding mask 363 may be made of metal such as Au/Cr. Alternatively, it may be made of light-absorbing material such as high-molecular compounded material and amorphous semiconductor.

The parasitic capacitance in the overlapping portions of the electrode 358a and the light-shielding mask 363 may increase, but not so much as in the element shown in FIG. 27 wherein the diffusion region 355 directly contacts the electrode 358. The light-shielding mask 363 may be made of insulating material, in which case the parasitic capacitance increases little. Hence, the cut-off frequency of the modified element shown in FIG. 29 decreases only a little though the light-shielding mask 363 covers almost all sides of the mesa. Covering almost all sides of the mesa, the mask 363 can help to reduce the crosstalk which results from the dispersion of light when the element forms an array, along with identical elements.

Figure 30:
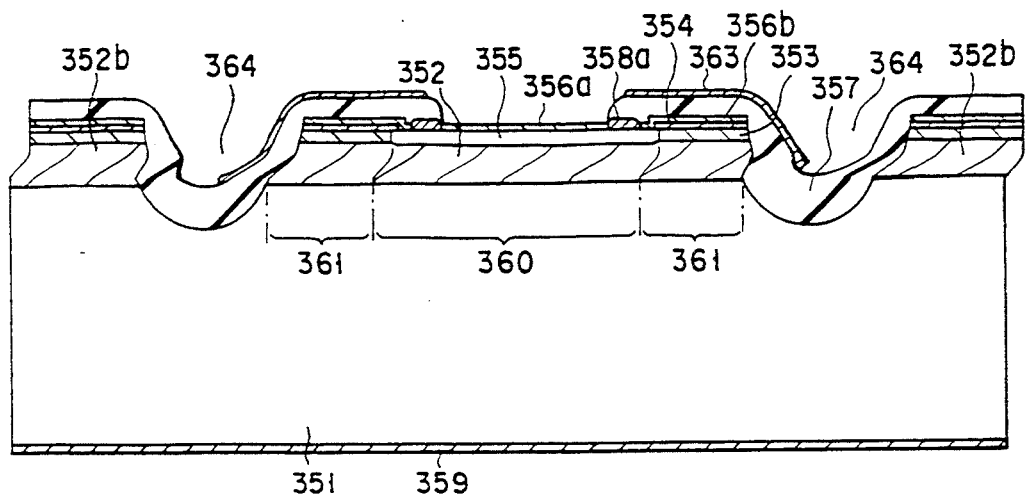
FIG. 30 is a sectional view of a surface light-receiving element which is still another modification of the element illustrated in FIG. 27.

FIG. 30 is a sectional view of a surface light-receiving element which is still another modification of the element illustrated in FIG. 27. This element is similar to the element shown in FIG. 29. Therefore, the components of this modified element are designated at the identical reference numerals in FIG. 30 and will not described in detail.

The modified element of FIG. 30 is characterized in that a groove 364 is formed, surrounding the non-active region 361. The element can attain the same advantages as does the element shown in FIG. 27. Furthermore, due to the groove 364, it has a light-absorbing layer 352b which traps (or absorb) the light dispersing in the n-type InP substrate 351, thereby to reduce the crosstalk of optical signals. The groove 364 also makes it easy to render the dielectric film 357 flat, whereby patterns can be formed with ease during the manufacture of the element.

Elements of the seventh embodiment can easily coupled optically with one another. They can therefore form a large-scale two-dimensional array having a high integration density. In this array, optical signals can be transmitted at a speed on the order of Gbps, though over a relatively short distance. The element according to the seventh embodiment of the invention can serve to provide an optical transmitting apparatus which can be mass-produced at low cost. It can also contribute to the manufacture of a high-density, large-scale optical transmitting apparatus or an optical interconnecting system which is suitable for use in a high-speed parallel data-processing system.

Eighth Embodiment

The eighth embodiment of the present invention relates to an optical interconnection device which is simple in structure and can yet operates at high speed.

It is desired that optical transmission be used to connect the boards incorporated in high-speed data-processing apparatus such as high-speed computers and telephone exchange systems of asynchronous signal transfer type. These data-processing apparatus have a great number of components which need to be connected. The components are arranged relatively close to one another, but signals be transferred among them at high speed on the order of Gbps. Many interconnection devices must be used to connect the components. The interconnection devices should not only have high operating efficiency but also be manufactured at low cost. The optical interconnection devices available at present are not both highly efficient and inexpensive.

A high-speed data-processing apparatus needs to have hundreds to thousands of interconnection devices. Some large-scale ones must be equipped with ten times or more of those numbers of interconnection devices. The mounting space for these interconnection devices is limited since it is demanded that the apparatus be as small as possible. In order to reduce the mounting space, as well to reduce the number of components for miniaturization of the apparatus while maintaining the high data transmission speed, integrated parts such as opto-electric ICs (OEICs) may be utilized. Essentially, however, it is desired that light-transmitting devices and light-receiving devices be simplified for this purpose.

No technology is available, however, for manufacturing a light-receiving device which has a simple structure and can operate at high speed. The light-receiving devices available are either high-speed operating but complicated, or simple but low-speed operating. In order to drive the light-receiving device at a speed in the order of Gbps, an amplifier having a large gain must be used, as will be explained in the following.

Figure 31:
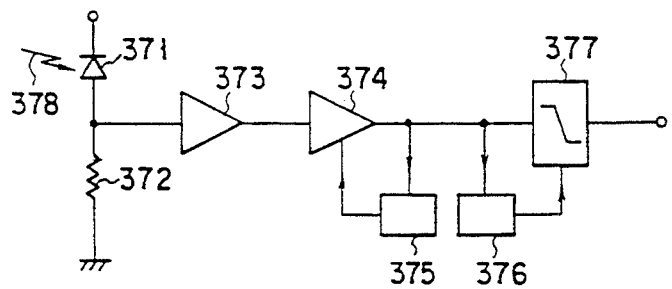
FIG. 31 is a circuit diagram of a conventional light-receiving device.

FIG. 31 is a circuit diagram of a conventional light-receiving device. As shown in FIG. 31, this device comprises a photodiode 371 functioning as a light-receiving element and a load resistor 372 connected to the output of the photodiode 371. The device further comprises a series circuit connected to the node of the photodiode 371 and the resistor 372. The series circuit comprises a a pre-amplifier (front-end amplifier) 373, a post-amplifier 374, a discriminator 377. A level detector 375 is connected at its input to the output of the post-amplifier 374, and at its output to the post-amplifier 374. A clock extracting circuit 376 is connected at its input to the output of the post-amplifier 374, and at its output to the discriminator 377. An output signal of the photodiode 371 depends on the electro/optical conversion efficiency, optical coupling efficiency, optical transmission efficiency of the light-transmitting device (not shown) which emits light 378 to the photodiode 371 and also on the opto/electric conversion efficiency of the light-receiving device.

The load resister 372 converts the output current of the photodiode 371 receiving the light 378, into a voltage signal. The resistance of the load resistor 372 is relatively low; otherwise, the parasitic capacitance of the photodiode 371 would reduce the response of the light-receiving device. Therefore, the voltage signal generates by the resistor 372 has a small amplitude in most cases. The small-amplitude voltage signal is amplified by the pre-amplifier 373 and further by the post-amplifier 374. If necessary, an equalizer-amplifier may be connected to the postamplifier 374, thereby to amplify the voltage signal more. The level detector 375 monitors the voltage signal thus amplified, and automatically controls the gain of the post-amplifier 374. The output signal of the post-amplifier 374 is input to the discriminator 377. The discriminator 377 samples the input signal in accordance with the clock signal generated by the clock extracting circuit 376, thereby converting the signal into a digital signal.

Thus operating, the light-receiving device compensates for changes in the transmission level which result from the switching of the transmission path or from the changes of the temperature. The device can therefore reliably reproduce a digital signal no matter whether the voltage signal generated by the load resistor 372 have a small amplitude or a large amplitude. The device can have an input dynamic range of 20 to 20 dB. The conventional light-receiving device shown in FIG. 31 exhibits good signal-receiving characteristic even at high operating speed. However, its signal-receiving characteristic greatly depends on gain control and S/N ratio since the device is a complicated circuit comprising the pre-amplifier 373, the post-amplifier 374, the level detector 375, the clock extracting circuit 376, and the discriminator 377. It is difficult to simplify the device without reducing the high operating speed. Hence, the device can hardly be manufacture at low cost or be made small. Consequently, identical light-receiving devices of the type shown in FIG. 31 cannot be arranged in high density to constitute an array capable of achieving parallel transmission of optical signals.

The gist of the eighth embodiment of the present invention is use a forward-biased diode as the load resistor for a light-receiving element. An optical interconnection device according to the eighth embodiment comprises a light-receiving element for converting an optical signal into an electric signal, a diode connected to the output of the light-receiving element to be forward-biased with respect to the electric signal, and an output terminal connected to the node of the light-receiving element and the diode.

Another optical interconnection device according to the eighth embodiment comprises a light-receiving element for converting an input light signal into an electric signal, a resistor element, a diode connected in parallel to the resistor element and connected to the output of the output of the light-receiving element to be forward-biased with respect to the electric signal, and an output terminal connected to the node of the light-receiving element and the diode.

Still another optical interconnection device according to the eighth embodiment comprises a light-receiving element for converting an input light signal into an electric signal, a diode connected to the output of the output of the light-receiving element to be forward-biased with respect to the electric signal, an output terminal connected to the node of the light-receiving element and the diode, and a comparator for comparing a voltage applied from the output terminal with a reference voltage and generating a high- or low-voltage electric signal representing the difference between the voltages compared.

The diode used in each of the optical interconnection devices according to the eighth embodiment is preferably a Schottky barrier diode.

In any optical interconnection device according to the eighth embodiment, the diode used as the load element is a forward-biased one. The voltage drop across the diode, i.e., the amplitude of the signal at the output terminal changes but very little and is, in addition, relatively large, even if the output current of the light-receiving element is changes greatly.

The smaller the changes in the amplitude of the output signal, the narrower the range of amplitude the next-state optical interconnection device needs to respond, and hence, the more simple the structure thereof can be. Further, since the amplitude of the output signal is large, the optical connect need not have an amplifying circuit, whereby the interconnection device is simple in structure and suffices to have a small analog processing section and can yet operate at high speed.

A further optical interconnection device according to the eighth embodiment of the present invention has a resistor element and a forward-biased diode connected in parallel to the resistor element. Thus, the optical interconnection device has a simple structure and can yet operate at high speed. In addition, it can perform self-bias control, and its level margin against noise is remarkably high.

Still another optical interconnection device according to the eighth embodiment of the present invention an output terminal and a comparator. The comparator compares the voltage at the output terminal with a reference voltage and generates a high- or low-voltage electric signal representing the difference between the voltages compared. This optical interconnection device can therefore be simple in structure and can yet operate at high speed. In addition, it can receive digital signals directly.

The high operating speed of any optical interconnection device according to the eighth embodiment of the invention does not decrease, despite the accumulation of minor carriers within the diode.

Figure 32:
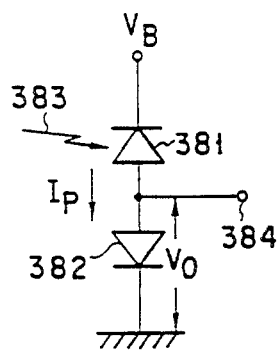
FIG. 32 is a circuit diagram of an optical interconnection device according to an eighth embodiment of the present invention.

FIG. 32 shows the light-receiving section of an optical interconnection device according to the eighth embodiment of the present invention. As can be seen from FIG. 32, the light-receiving section comprises a photodiode 381, a forward-biased diode 382, and an output terminal 384. The photodiode 381, which functions as a light-receiving element, receives input light 838 and convert the light into an electric signal. The cathode of the photodiode 381 is connected to a powersupply potential $v_B$. The diode 382 is connected to the node of the anode of the photodiode 381 and the ground, for converting the output current Ip of the photodiode 381 into a voltage. The diode 382 may be either a pn-junction diode or, more preferably, a Schottky barrier diode (hereinafter called "SBD") whose threshold voltage can be easily controlled and whose response characteristic is excellent. (The threshold voltage is easy to control, and the response characteristic is good, since the high operating speed of a Schottky diode does not decrease though minor carriers within the diode.) The output terminal 284 is connected to the node of the photodiode 381 and the diode 382.

The static characteristics of the light-receiving section shown in FIG. 32, wherein the diode 382 is an SBD, will be described in the following.

The current flowing through the forward-biased diode 382 is represented as follows:

$$I_F = SA^*T^2 EXP(-e\phi_B/KT)(EXP(eV_F/nkT)-1) \quad (11)$$

where
S: junction area
A*: Richardson's constant
T: temperature
e: electron charge
$\phi_B$: junction barrier height
k: the Boltzmann constant
$V_F$: potential difference at the junction
n: diode constant From Equation (11), the inverse function of $V_F$ can be obtained as follows:

$$V_F = (nkT/e) \cdot \ln\{(I_F/SA^*T^2)EXP(e\phi_B/kT)+1\} \quad (12)$$

Equation (12) teaches that the potential difference $V_F$ at the junction varies in logarithm with the current $I_F$. In other words, the output voltage $V_O$ at the terminal 384 varies in logarithm with the output current Ip of the photodiode 381. Assuming that the photodiode 381 is fully biased, the output current Ip is:

$$Ip = (e/h\nu)\{1-EXP(-\alpha W)\}P_{IN} \quad (13)$$

where
$P_{IN}$: power of the input light
$h\nu$: photon energy of the input light
$\alpha$: absorption coefficient of absorbing layer of the photodiode 381
W: thickness of the light-absorbing layer Assuming that the light-absorbing layer is made of GaInAs which lattice matched with InP, $\alpha$ is about 10000 cm$^{-2}$ when the input light has a wavelength of 1.3 $\mu$m. When the input light has a wavelength of 1.3 $\mu$m, the following approximate relation:

$$Ip \approx 0.996 P_{IN} \quad (14)$$

Hence, the output voltage $V_O$ has the following value in this case:

$$v_0 = (nkT/e) \cdot \ln\{0.996 P_{IN}/SA^*T^2)EXP(e\phi_B/kT)+1\} \quad (15)$$

Figure 33:
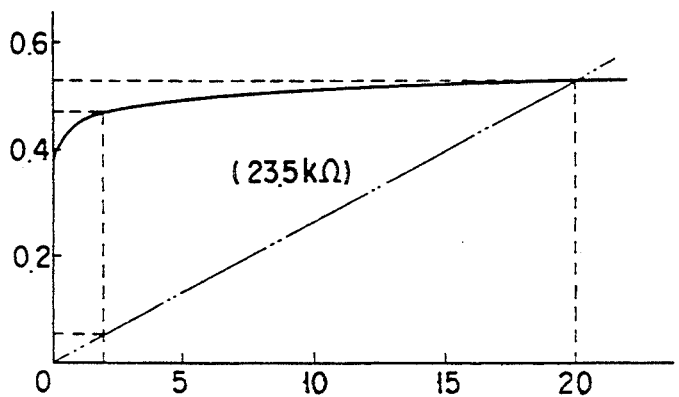
FIG. 33 is a diagram illustrating the relationship between the input light power and output voltage of the optical interconnection device of FIG. 32.

FIG. 33 is a diagram illustrating the relationship between the input light power PIN and output voltage $V_O$ of the light-receiving section (FIG. 32) in which the diode 382 is an SBD comprising an n-type InP layer and an Au layer formed on the InP layer and having a junction diameter of 10 $\mu$m. Indicated by two-dot, one-dash line in FIG. 33 is the relationship between the input light power and output voltage of a conventional light-receiving section comprising a resistor used as a load resistance and having a resistance of 23.5 k$\Omega$. As can be understood from FIG. 33, the output voltage $V_O$ of the light-receiving section shown in FIG. 32 changes to 0 V, 0.47 V, and 0.56 V as the input light power $P_{IN}$ changes to 0 $\mu$W, 2 $\mu$W, and 20 $\mu$W, respectively. When the power PIN changes ten times, the output voltage $v_O$ changes only 20% or less.

In contrast, the output voltage $v_O$ of the conventional light-receiving section changes to 0 V, 0.056 V, and 0.56 V as the input light power $P_{IN}$ changes to 0 $\mu$W, 2 $\mu$W, and 20 $\mu$W, respectively; when the power $P_{IN}$ changes ten times, the output voltage $V_O$ changes about ten times as well. Therefore, it is necessary to connect an analog amplifier which can amplify an input voltage over a broad range to a predetermined value, to the output of the conventional light-receiving section. The use of an amplifier of this type complicates the optical interconnection device incorporating the light-receiving section and decreases the operating speed of the optical interconnection device.

When the light-receiving section of FIG. 32 is utilized, it suffices to connect an amplifier which can amplify an input voltage but over a narrow range, to the output of the light-receiving section. This is because the output voltage of the light-receiving section is high. Such an amplifier has a simple structure, and its use does not complicate the optical interconnection device very much or reduce the operating speed of the interconnection device. In the case where an amplifier capable of amplifying an input voltage of 0.5$\pm$0.1 is used, it suffices to be one having a fixed gain to input light power ranging from 1 to 100 $\mu$W. This range of the input light power corresponds to an AGC dynamic range of 20 dB for the conventional light-receiving device illustrated in FIG. 31.

The optical interconnection device according to the eighth embodiment can operate at high speed. Although it is simple in structure, it can function in the same way as a complex AGC circuit. In addition, since the optical interconnection device has a simple basic structure, it can be used in great numbers, forming an array, and can be manufactured at low cost and in small size. Not requiring the assistance of an analog amplifier, the interconnection device consumes but a very little power. Furthermore, the circuit used in the optical interconnection device is of simple design and need not be adjusted in most cases before it is assembled into the optical interconnection device. The optical interconnection device according to the eighth embodiment is therefore suitable for use in a high-speed dataprocessing apparatus in which the components to be optically connected are arranged relatively close to one another. In practice, it suffices to use a buffer element such as an FET for applying an AC bias shift to the optical interconnection device, which is appropriate for the logic circuit connected to another by means of the optical interconnection device.

The foregoing description of the eighth embodiment is based on the assumption that the photodiode 381 outputs not current as long as no light is applied to it. In fact, however, the photodiode 381 generates a dark current $I_D$ when it receives no light. The influence of the dark current must be taken into account. The dark current is only about 1 nA if the GaInAs/InP junction of the photodiode 381 has a diameter of 50 $\mu$m, but greatly changes with temperature. The dark current has the following relationship with temperature:

$$I_D = I_{DO} EXP(-eEG/KT) \quad (16)$$

where $E_G$ is the energy gap of the photodiode.

Equation (16) teaches that the dark current $I_D$ exponentially changes with temperature. This non-linear dark current-temperature of the photodiode 381 is utilized in the present invention. Even if the dark current $I_D$ is very small, it does much contribute to the output voltage $V_O$. Hence, the output voltage at zero-level is expected to change exponentially. This change, known as "dark current drift" is automatically suppressed, without any design measures taken, for the following reason.

The zero-level output voltage $V_D$ can be obtained in an approximate value, by substituting Equation (16) for the output current Ip in Equation (12). Namely:

$$V_D = (nkT/e)\ln[(I_{DO}/SA^*T^2) \cdot \text{EXP}\{(\phi_B - E_G)/kT\} + 1] \quad (17)$$

Equation (17) explains that the zero-level output voltage $V_D$ change almost in proportion to the changes in temperature. When approximately analyzed, this output voltage $V_D$ is found to contain an offset voltage which corresponds to $n(\phi_B - E_G)$.

As shown in FIG. 34, the dark current $I_D$ of the photodiode 381 described above is 4 pA at $-20°$ C. and 70 nA at 80° C. In other words, the dark current $I_D$ changes about 20000 times as much as the temperature. As evident from FIG. 34, however, the zero-level output voltage $V_D$ changes only about 1.5 times, from 0.2 V to 0.3 V. Obviously, the zero-level output voltage $V_D$ is comparatively stable. Therefore, the above-mentioned dark current drift can be well suppressed only if a zero-level shift bias or a digital threshold value is set in accordance with the dark current $I_D$ of the photodiode 381 or the element parameters ($\phi$ B and $E_G$).

FIG. 35 is a sectional view showing the input section shown in FIG. 32. As shown in FIG. 35, the light-receiving section comprises an n-type InP semiconductor substrate 391, an n-type InP buffer layer 392 formed on the upper surface of the substrate 391, a GainAs light-absorbing layer 393 formed on the buffer layer 392, and an n-type InP window layer 394 formed on the light-absorbing layer 393. Zn has been diffused into the center part of the window layer 394, forming a Zn diffusion region 396 (i.e., an p-type InP layer) which lies on a portion of the GainAs light-absorbing layer 393.

Formed on the Zn diffusion region 396 are a Schottky electrode 397 and an output electrode 398 set in ohmic contact with the diffusion region 396, for delivering signals. The Schottky electrode 397 is a multi-layered one such as a Au/Pt/Ti layer whose Ti layer contacts the Zn diffusion region 396. The output electrode 398 is also a multi-layered one such as an Au/Pt/Ti/Zn layer whose Zn layer contacts the Zn diffusion region 396. Those portions of the n-type InP window layer 394 and the Zn diffusion region 396, on which neither the Schottky electrode 397 nor the output electrode 398 is mounted, are covered with passivation dielectric film 395 made of silicon nitride or the like.

The light-receiving section further comprises a low-reflectance coating 399 and an n-type ohmic electrode 400, both formed on the lower surface of the n-type InP substrate 391. The low-reflectance coating 399, used to capture an optical signal 383, is a silicon nitride film, for example. The n-type ohmic electrode 400 is, for example, an AuGe electrode.

The Schottky electrode 397 is connected to the ground potential, whereas the n-type ohmic electrode 400 is connected to the power-supply potential $v_B$ (i.e, positive bias). As a result, a photodiode is formed between the output electrode 398 and the ohmic electrode 400, and an SBD is formed between the Schottky electrode 397 and the output electrode 398. Hence, the output voltage $V_0$ can be applied from the output electrode 398.

The light-receiving section is simple in structure, and can easily made in the form of an integrated circuit, merely by forming an SBD within an ordinary photodiode. The p-type InP is used as the SBD semiconductor for simplifying the structure, whereas n-type InP is used as such in the light-receiving section illustrated in FIG. 32. Needless to say, n-type InP may be used instead. The conductivity type of the semiconductor, determines the polarities of the SBD. The junction barrier height $\phi_B$ in Equation (11) determines the output voltage of the SBD. Thus, it is possible to adjust the output voltage to the logic circuits connected by the optical interconnection device incorporating the light-receiving section, by selecting the output polarity, the impurity concentrations of the semiconductor elements, and the materials of the electrodes.

FIG. 36 shows the circuit configuration of the light-receiving section shown in FIG. 35, which can receive digital signals directly. Of the elements shown in FIG. 36, the photodiode 381 and the diode 382 used as the load resistor, both shown with the broken-line frame, form an integrated circuit. The output terminal 384 is connected to the node of the photodiode 381 and the diode 382. A comparator 386 is connected at the first input to the output terminal 384 and at the other input to a reference voltage source 385 which is connected to the ground. The comparator 386 compares the output voltage applied from the output terminal 384 with the reference voltage applied from the source 385, thereby to output a digital signal at logic level of "0" or "1," in accordance with the difference between the voltages compared. Assuming that the output voltage has the temperature-dependency of FIG. 34, the influence of the zero-level output voltage $V_D$ will be eliminated only if the reference voltage applied by the source 385 is set at the value of 0.35 V. In this case, the light-receiving section can receive a signal of 1 to 100 $\mu$w over the temperature range of $-20°$ C. to 80° C., and a minimum threshold margin of at least 50 mV is ensured. Thus, the light-receiving section can generate a digital signal which is reliable even if the input optical signal contains noise.

As has been described, the light-receiving section shown in FIG. 36 has only a few analog components. Since the optical signal 383 is basically a digital signal, however weak it is, the nonlinear current-voltage characteristic of the forward-biased diode 382 used as the load resistor of the photodiode 381 can be utilized so that the light-receiving section may receive digital signals directly.

The dynamic characteristic of the light-receiving section shown in FIG. 32 will be explained. To analyze the dynamic characteristic, it is necessary to consider not only the current-voltage characteristic of the diode 382 (i.e., the SBD in this embodiment) but also the junction capacitance and differential resistance of the diode 382 and the frequency- or time-axis response determined in part by the parasitic capacitance of the photodiode 381. In the case where the signal amplitude is relatively small, the DC-current level can be fixed, thereby to approximate the parameters to those of an equivalent linear element, and the limits to the response on the frequency axis can be obtained.

The junction capacitance $C_S$ and the differential resistance $R_S$ are represented as follows:

$$C_S(V_O) = S\{C_S(O)^{-\frac{1}{a}} aV_O\}^{-\frac{1}{a}} \tag{18}$$

$$R_S(I_{PO}) = nkT/e[I_p + SA^*T^2 EXP(-e\phi_B/kT)] \tag{19}$$

where
$I_{PO}$: DC component of the signal current
$V_O$: voltage generated from the signal current
a: coefficient indicating the voltage-dependency of $C_S$ The response-limit frequency $f_C$ which remains valid for an input signal of a small amplitude is given as follows:

$$f_C = 1/[2\pi\{C_p + C_S(V_O)\}R_S(I_{PO})] \tag{20}$$

Equation (20) teaches that fC is determined by $I_{PO}$ since $V_0$ depends on $I_{PO}$.

As evident from Equations (18) to (20), the greater the amplitude of the signal, the faster the light-receiving section (FIG. 36) responds to the signal; conversely, the smaller the amplitude of the signal, the more slowly the section responds to the signal. Thus, when the signal is a large-amplitude pulse, the output signal will rapidly increases at the leading edge and slowly decreases at the trailing edge, in terms of current.

FIG. 37 represents the time-response characteristic which the light-receiving section (FIG. 32) comprising a photodiode and an SBD exhibits to optical clock pulses transmitted at 10 Mbps. As can be understood from FIG. 37, each output pulse rapidly increases but slowly decreases in terms of voltage. To be precise, the lower the voltage of the output pulse, the longer the output pulse trails. Eventually, the trailing edge of each output pulse adjoins the leading edge of the next output pulse, inevitably causing self-bias effect at the zero-input level as the light-receiving section operates continuously.

The light-receiving section shown in FIG. 36 is free of the influence of self-bias effect. To eliminate the influence of self-bias effect, it suffices to set the reference voltage applied from the source 385 at a value greater than the self bias. For instance, when the reference voltage is set at 0.4 V, the light-receiving section can receive digital signals at the rate of 500 Mbps or more.

The light-receiving section shown in FIG. 36 has a simple structure, having no analog amplifier, no AGC circuit, or no clock-extracting circuit. Nonetheless, it can receive digital optical signals in the same way as the conventional high-impedance light-receiving section illustrated in FIG. 31. Furthermore, the light-receiving section of FIG. 36 can be manufactured in small size and at low cost since its components can be fabricated in the form of an integrated circuit. If made small, the light-receiving section is suitable for use in an optical interconnection device having an array of identical light-receiving sections. Many light-receiving sections of the type shown in FIG. 36 can constitute a large-scale two-dimensional array, which may be used as a high-speed signal bus suitable for connecting the components of a data-processing apparatus and which can transmit signals in greater amount and at higher speed than electric buses can.

FIG. 38 shows the circuit configuration of a modification of the light-receiving section shown in FIG. 36. The components of this modified light-receiving section are denoted at the identical reference numerals in FIG. 36 and will not described in detail. The modified section differs from the section of FIG. 36 in that a parallel circuit of a diode 382 and an operational amplifier 387 is used as the load of a photodiode 381. As shown in FIG. 38, a resistor 388 is connected to the output of the operational amplifier 387. Assuming that the operational amplifier 387 has a voltage amplification factor $-A_V$ (producing an inverted output), the voltage vOp applied to the resistor 388 is given as follows:

$$\begin{aligned} V_{OP} &= V_O/(1 + 1/A_V) \\ &= (nkT/e)\ln\{(I_F/SA^*T^2)EXP(e\phi_B/kT) + 1\}/ \\ &\quad (1 + 1/A_V) \end{aligned} \tag{21}$$

As clearly seen from Equation (21), the voltage VOp is equal to the potential difference $V_F$ at the junction, i.e., one of the terms of Equation (12), when $A_V$ is sufficiently large. This means that the gain of the amplifier 387 is automatically controlled due to its trans-impedance characteristic. To state it in another word, the operational amplifier 387 functions as an automatic gain-controlled, trans-impedance amplifier, and has its input impedance decreased very much. As a result, the amplifier 387 exhibits a load characteristic which is ideal to the photodiode 381. Hence, the modified light-receiving section shown in FIG. 38 achieves the same advantage as a conventional light-receiving section of trans-impedance type. In addition, it has a wide receiving dynamic range, though not equipped with an ACG circuit.

FIG. 39 illustrates the circuit configuration of a modification of the light-receiving section shown in FIG. 32. The components of this modified light-receiving section are denoted at the identical reference numerals in FIG. 32 and will not described in detail. As shown in FIG. 39, a pass resistor 389 is connected in parallel to a diode 382 (SBD). Provided with this resistor 389, the modified light-receiving section produces no output when a photodiode 381 receives a zero-level optical signal or stray-light. In other words, the resistor 389 suppresses self-bias effect at the leading edge of any input pulse.

The output current Ip flowing through the load of the light-receiving section shown in FIG. 39 is represented as follows:

$$\begin{aligned} I_p = SA^*T^2 EXP(-e\phi_B/kT) \\ \cdot(EXP(eV_O/nkT) - 1\} + V_O/R_p \end{aligned} \tag{22}$$

where Rp is the resistance of the pass resistor 389.

Figure 40:
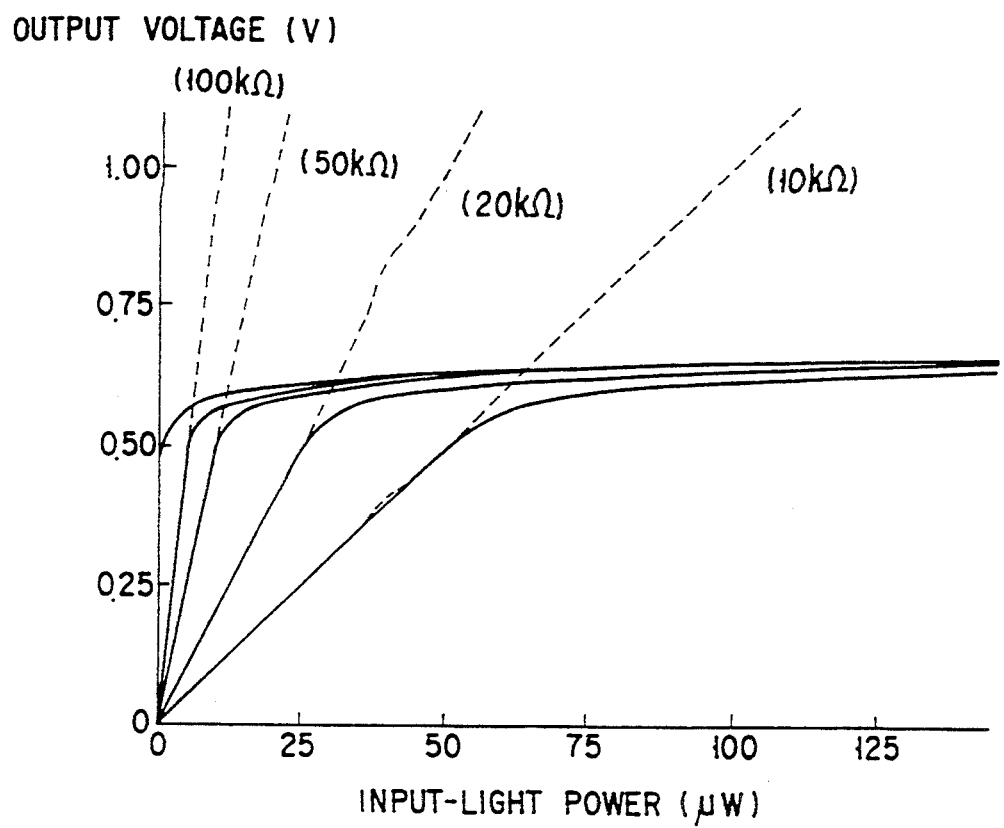
FIG. 40 is a diagram illustrating the relationship between the light power input and output voltage of the light-receiving section shown in FIG. 39.

Equation (22) is a transcendental one, and the output current Ip cannot be analyzed from this equation. Nonetheless, the output current Ip can be analyzed by examining the input-output characteristic of the light-receiving section, i.e., the relationship between the input light power and the output voltage. FIG. 40 shows this input-output characteristic. FIG. 40 teaches that the pass resistor 389 controls the input-output characteristic in the low-input power region, and that the SBD controls the characteristic in the high-input region. FIG. 40 also indicates that the value of input light power at which the input-output characteristic from linear to nonlinear (i.e., nonlinear threshold value) depends on the resistance Rp of the pass resistor 389. Thus, this value can be adjusted in accordance with the input light power.

Figure 41:
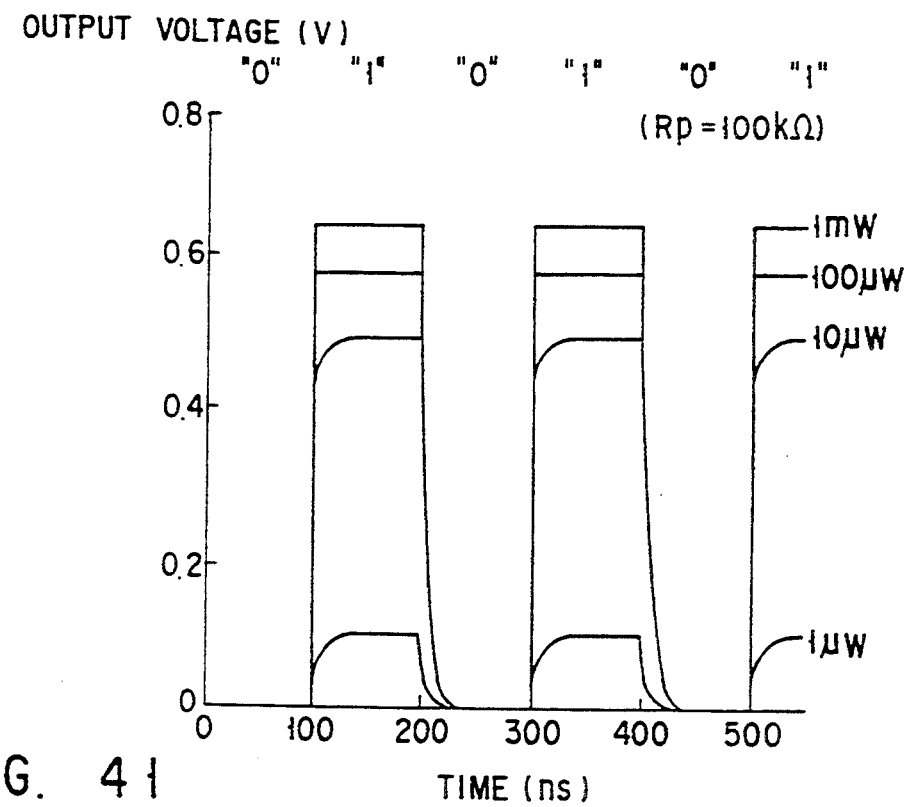
FIG. 41 is a diagram representing the relationship between the output voltage of the light-receiving section of FIG. 39 and the temperature.

FIG. 41 shows the time-response characteristic which the light-receiving section shown in FIG. 39 exhibits when Rp is 100 kΩ. FIG. 40 suggests that the nonlinear threshold value is in the neighborhood of 10 μW, whereas FIG. 41 clearly shows that the output voltage sharply varies at the input light power of 10 μW. Namely, the input-output characteristic remains linear before the input light power encores to 10 μW, whereby the output voltage is proportional to the input light power. Once the input light power increases above 10 μW, the output voltage changes in the same way as with the light-receiving section illustrated in FIG. 32. When the input light power changes from 1 μW to 10 μW, the signal for discriminating "1" from "0" is likely to take an indeterminate value. Nonetheless, no problem whatever will arise only if a signal whose value would not become indeterminate is transmitted to the light-receiving section, thereby setting a minimum input level without fail. This is because the optical transmission distance is relatively short, making it easy to set both the transmission level and the receipt level.

The light-receiving section shown in FIG. 39 can receive optical data at the rate of 500 Mbps or more, provided that the reference voltage and the input light power are set at 0.4 V and 10 μW or more, respectively. Since the reference voltage and the input light power are of these values, no self-bias effect is caused at the zero-input level. Hence, the light-receiving section has a very large level margin against noise. Furthermore, the section can operate at a speed much higher than 1 Gbps if the input light power and the resistance Rp of the pass resistor 389 are 50 μW or more and 20 kΩ, respectively, or if the junction diameter of the SBD is 5 μm or less.

Since the parallel circuit of the forward-biased diode 382 and the pass resistor 389 is used as the load of the photodiode 381 (i.e., the light-receiving element), the light-receiving section shown in FIG. 39 can prevent an increase of noise and the self-biasing of the operating point.

Figure 42:
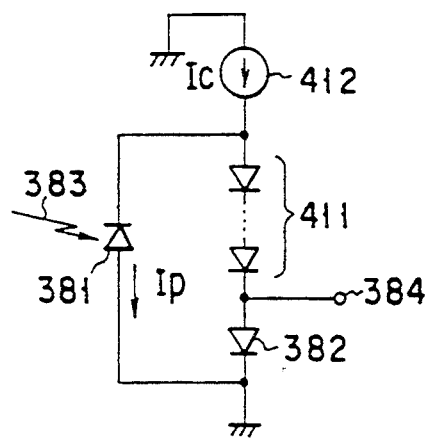
FIG. 42 is a circuit diagram showing the light-receiving section of another interconnection device according to the eighth embodiment of this invention.

FIG. 42 is a circuit diagram showing the light-receiving section of another interconnection device according to the eighth embodiment of this invention. As shown in FIG. 42, this modified light-receiving section comprises a photodiode 381, a diode 382, an output terminal 384, an array 411 of level-shifting diodes, and a constant current source 412. The diode array 411, which may be replaced by a SBD, is used to bias the photodiode 381. The current source 412 supplies the diode array 411 with a current $I_C$ which is nearly equal to the output current $I_C$ generated from the light power Ip applied to the photodiode 381.

The light-receiving section shown in FIG. 42 generates a voltage defined by an equation identical to Equation (12), except that $I_F$ is substituted by IC, when no optical signal 383 is supplied to the photodiode 381, and a voltage defined by an equation identical to Equation (12), except that $I_F$ is substituted by $I_C - I_P$, when an optical signal 383 is supplied to the photodiode 381. In other words, the light-receiving section produces an output, in inverse logic, in response to the input optical signal. The section is characterized in two respects. First, the dark-current of the photodiode 381 scarcely affects the output voltage since it is far smaller than the voltage $I_C$ applied from the source 412, whereby no zero-level input drift does not occur despite the changes in temperature. Second, the threshold value can be set at "H" level (i.e., a large current) since the output level is clamped at the "H" level, preventing a noise current or the like from influencing the voltage which the light-receiving section generates when an input light signal is at the zero-level. Thus, the light-receiving section of FIG. 42 is resistant to noise and can operate at high speed.

Figure 43:
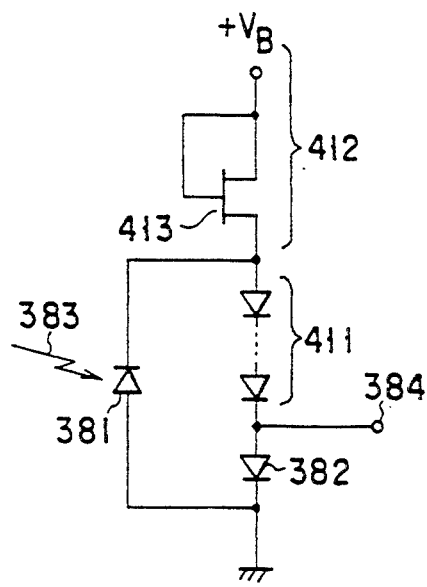
FIG. 43 is a circuit diagram of the constant current source of the light-receiving section shown in FIG. 42.

FIG. 43 shows the circuit configuration of the constant current source 412 incorporated in the light-receiving section shown in FIG. 42. As illustrated in FIG. 43, the current source 412 comprises a constant-bias FET 413 whose drain and gate are connected to each other and whose drain is connected to the power-supply potential $V_B$. The FET 413 is of normal-off type which has a small channel width and whose saturated current is as small as the output current $I_P$.

Figure 44:
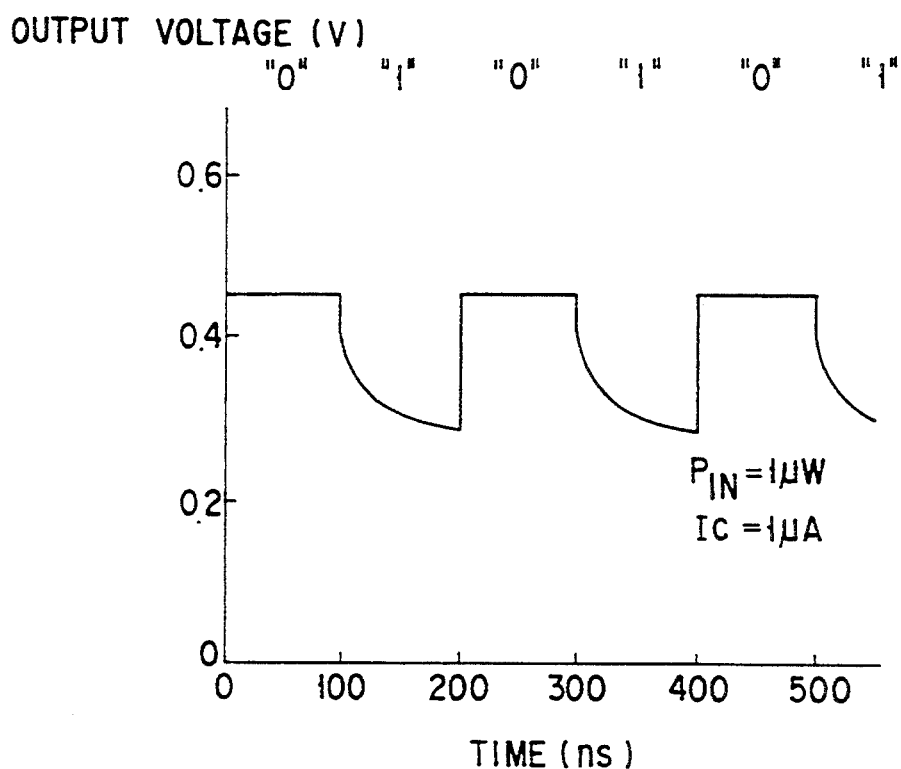
FIG. 44 is a graph showing how the output voltage of the light-receiving section of FIG. 43.

FIG. 44 illustrates how the output voltage of the light-receiving section of FIG. 43 varies with time when the input light power $P_{IN}$ is 1 μW and the output current $I_C$ is 1 μA. As is evident from FIG. 44, the output voltage can be increased by using a multi-stage SBD. The light-receiving section can be used in combination with any other type according to the eighth embodiment.

Figure 45A:
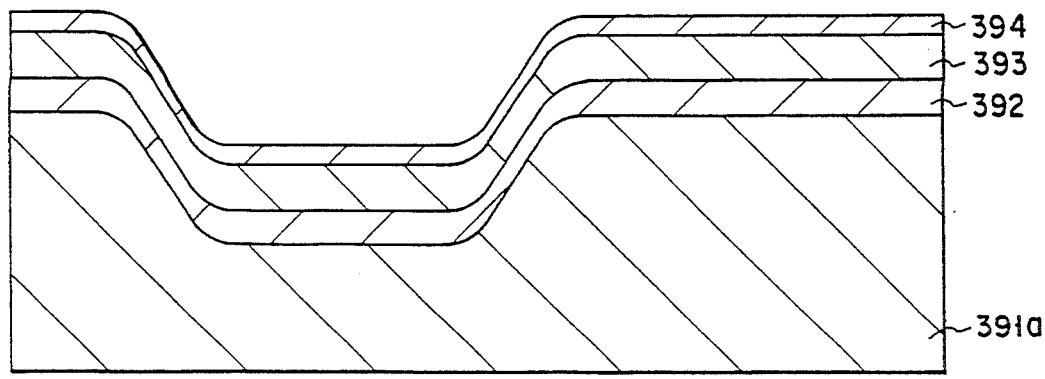
FIGS. 45A and 45B are diagram for explaining how the light-receiving section shown in FIG. 43 is manufactured in the form of an integrated circuit.
Figure 45B:
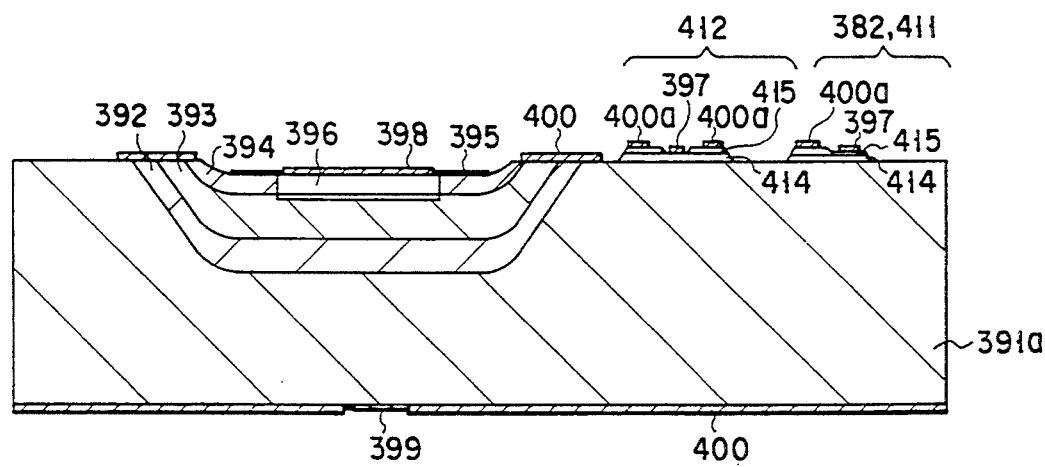

Like the other types according to the eighth embodiment, the light-receiving section of FIG. 43 can be manufactured in the form of an integrated circuit, as will be explained with reference to FIGS. 45A and 45B. First, as shown in FIG. 45A, an n-type InP buffer layer 392 is formed on the upper surface of a high-resistance or p-type semiconductor substrate 391a. Next, a GaInAs light-absorbing layer 393 is formed on the buffer layer 392, and an n-type InP window layer 394 is formed on the light-absorbing layer 393. Then, the upper surface region of the resultant structure is etched, and a photodiode is formed in the semiconductor substrate 391a. Thereafter, as shown in FIG. 45B, an FET (constant current source) 412, a SBD (diode) 382, and another SBD (level-shifting diode) 411 are formed in the exposed surface of the substrate 391a. If the FET 412 is of MES (Metal Semiconductor) type, a Schottky electrode 397 and a gate electrode can be formed at the same time. The FET 412 has an active layer 414 and and a buffer layer 415.

The light-receiving sections according to the eighth embodiment have a analog portion which is small as compared with the other portion since they comprise a forward-biased diode. They therefore serve to provide an optical interconnection device which is simple in structure and can yet operate at high speed. The eighth embodiment of the invention is not limited to the examples described above. Rather, their components may be made of different materials or their structures may be altered, to attain the same advantage as described above. Furthermore, various changes and modifications can be made, without departing the scope of the eighth embodiment.

As has been described above in detail, the optical interconnection device according to the present invention comprises a plurality of optical interconnecting elements which are arranged at regular intervals and each of which comprises a semiconductor element and a grating lens. The optical interconnection device can therefore transmit a great amount of data at high speed and manufactured at low cost. It is suitable for use in a data-processing apparatus or the like and can help to enhance the operating speed and performance of a data-processing apparatus or the like.

Additional advantages and modifications will readily occur to those skilled in the art. Therefore, the invention in its broader aspects is not limited to the specific details, and representative devices, shown and described herein. Accordingly, various modifications may be made without departing from the spirit or scope of the general inventive concept as defined by the appended claims and their equivalents.

What is claimed is:

1. An optical interconnection device comprising:
   a light source;
   a plurality of optical interconnecting elements which are located on an output side of said light source and each of which has first and second major surfaces and comprises an integral unit made of an optical semiconductor element and a grating lens having concentric annular grooves and concentric annular projections, and two electrodes formed on the first and second major surfaces, respectively, said optical semiconductor element and said grating lens formed on the first major surface for emitting or receiving light; and
   a light-receiving element located on an output side of said optical interconnecting elements,
   wherein said optical interconnecting elements are arranged at substantially regular intervals, each positioned such that said semiconductor element and said grating lens face to the same direction, and the grating lens of each of said optical interconnecting elements has optical characteristic which compensates for light-transmitting characteristic corresponding to the interval between the optical interconnecting element and the next optical interconnecting element.

2. The optical interconnection device according to claim 1, wherein a secondary grating is formed on each of the concentric annular projections of said grating lens.

3. The optical interconnection device according to claim 1, wherein said grating lens of each of said optical interconnecting elements has a focal distance which is half the interval between the optical interconnecting element and the next optical interconnecting element.

4. The optical interconnection device according to claim 1, wherein said grating lens of each of said optical interconnecting elements has a focal distance which is a quarter of the interval between the optical interconnecting element and the next optical interconnecting element.

5. The optical interconnection device according to claim 1, wherein each of said optical interconnecting elements comprises a semiconductor substrate of a first conductivity type having first and second major surfaces, a groove formed in the first major surface, separating the first major surface into an element-forming region and a lens-forming region, a light-receiving layer formed on said element-forming region, a first semiconductor layer of a second conductivity type formed on said light-receiving layer; a first electrode formed on said first semiconductor layer and having an opening, a light-amplifying layer formed on said lens-forming region, a second semiconductor layer of the second conductivity type formed on said light-amplifying layer and having concentric annular grooves and concentric annular projections, a second electrode formed on said second semiconductor layer, except said concentric annular grooves and said concentric annular projections; and a third electrode formed on said second major surface of said semiconductor substrate.

6. The optical interconnection device according to claim 1, wherein the optical semiconductor element is a surface emitting semiconductor laser comprising a second order grating layer of a first conductivity type, an active layer formed on said second order grating layer, a reflector layer of a second conductivity type having cylindrical structure formed on said active layer, and a contact layer of the second conductivity type formed on said reflector layer.

7. The optical interconnection device according to claim 1, wherein said electrode formed on the second major surface of each of optical interconnecting elements is formed in a specific pattern which is capable of diffracting light and which defines said grating lens.

8. The optical interconnection device according to claim 1, wherein the optical semiconductor element of each of said optical interconnecting elements has a light-receiving surface having a reflectance and a light-emitting surface having a reflectance lower than that of the light-receiving surface, is designed to select a light beam incident on the light-receiving surface and having a predetermined wavelength, amplify the light beam and emit the light beam from the light-emitting surface, and has an optical resonator interposed between said light-receiving surface and said light-emitting surface and having an optical thickness which is an integral multiple of half the wavelength of said light beam.

9. The optical interconnection device according to claim 1, wherein the optical semiconductor element of each of said optical interconnecting elements has a light-receiving surface having a reflectance and a light-emitting surface having a reflectance lower than that of the light-receiving surface, is designed to amplify light incident on the light-receiving surface, amplify the light and emit the light from the light-emitting surface, and has an optical resonator interposed between said light-receiving surface and said light-emitting surface and having an effective length which continuously changes in a plane.

10. The optical interconnection device according to claim 1, wherein the optical semiconductor element of each of said optical interconnecting elements has an optical film consisting of portions having different reflectances.

11. An optical interconnection device comprising:
    a light source;
    an odd number of optical interconnecting elements which are located on an output side of said light source and each of which has first and second major surfaces and comprises an integral unit made of an optical semiconductor element and a grating lens having concentric annular grooves and concentric annular projections, and two electrodes formed on the first and second major surfaces, respectively, said optical semiconductor element and said grating lens formed on the first major surface for emitting or receiving light; and a light-receiving element located on an output side of said optical interconnecting elements,
    wherein said optical interconnecting elements are arranged at substantially regular intervals, each positioned such that said semiconductor element and said grating lens face to the same direction; the grating lens of each of said optical interconnecting elements has an optical characteristic which compensates for a light-transmitting characteristic corresponding to the interval between the optical interconnecting element and the next optical interconnecting element; light emitted from said light source is applied to said light-receiving element through the grating lenses of said optical interconnecting elements; and light emitted from the optical semiconductor element of the first of said optical interconnecting elements is applied to said light-receiving element through the grating lenses of the remaining optical interconnecting elements.

12. The optical interconnection device according to claim 11, wherein the light source and the optical semiconductor element of the first optical interconnecting element are surface semiconductor laser comprising a first reflector layer of a first conductivity type, an active layer formed on said first reflector layer, a second reflector layer of a second conductivity type formed on said active layer, and a contact layer of the second conductivity type formed on said second reflector layer.

13. An optical semiconductor element comprising:
a semiconductor substrate;
a light-absorbing layer formed on said semiconductor substrate;
an active region formed in the surface of said light-absorbing layer, for receiving and emitting light;
a non-active region formed in the surface of said light-absorbing layer and surrounding said active region, for receiving and emitting light; and
a protective layer covering said non-active region,
wherein said active region and said non-active region constitute a mesa structure, and a light-shielding mask blocks light applied toward said nonactive region.

14. The element according to claim 13, wherein said non-active region has a top and a side, and said light-shielding mask covers the top of said non-active region and at least one part of the side of said non-active region.

15. The element according to claim 13, wherein said non-active region has a top and a side, said light-shielding mask covers the top of said non-active region and at least one part of the side of said non-active region, and an electrode connected to said active region.

16. The element according to claim 13, wherein said active region and said non-active region constitute a plurality of mesa structures which are arranged, forming a two-dimensional array.

17. An optical interconnection device comprising:
a light source;
a plurality of optical interconnecting elements which are located on an output side of said light source and each of which has first and second major surfaces and comprises an integral unit made of an optical semiconductor element and a grating lens having concentric annular grooves and concentric annular projections, and two electrodes formed on the first and second major surfaces, respectively, said optical semiconductor element and said grating lens formed on the first major surface for emitting or receiving light;
a light-receiving element located on an output side of said optical interconnecting elements, for converting an optical signal into an electric signal;
a diode connected to an output of said light-receiving element and forward-biased with respect to the electric signal supplied from said light-receiving element; and
an output terminal connected between said diode and said light-receiving element,
wherein said optical interconnecting elements are arranged at substantially regular intervals, each positioned such that said semiconductor element and said grating lens face to the same direction, and the grating lens of each of said optical interconnecting elements has optical characteristic which compensates for light-transmitting characteristic corresponding to the interval between the optical interconnecting element and the next optical interconnecting element.

18. The optical interconnection device according to claim 17, further comprising a resistor element to which said diode is connected in parallel.

19. The optical interconnection device according to claim 17, further comprising a comparator for generating an electric signal corresponding to a difference between a voltage at said output terminal and a reference voltage.

20. The optical interconnection device according to claim 19, wherein said diode is a Schottky barrier diode.

* * * * *